United States Patent
Lee et al.

(10) Patent No.: US 12,317,428 B2
(45) Date of Patent: May 27, 2025

(54) DISPLAY DEVICE, AND METHOD AND APPARATUS FOR MANUFACTURING THE SAME

(71) Applicant: SAMSUNG DISPLAY CO., LTD., Yongin (KR)

(72) Inventors: Kyung-Su Lee, Yongin (KR);
Kwan-Young Han, Yongin (KR);
Jong-Hwan Kim, Yongin (KR);
Yong-Youl Cho, Yongin (KR);
Young-Sik Kim, Yongin (KR);
Yang-Han Son, Yongin (KR);
Dae-Hyun Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 18/297,586

(22) Filed: Apr. 7, 2023

(65) Prior Publication Data

US 2023/0247777 A1    Aug. 3, 2023

Related U.S. Application Data

(60) Division of application No. 14/794,720, filed on Jul. 8, 2015, now Pat. No. 11,627,670, which is a
(Continued)

(30) Foreign Application Priority Data

| Jun. 29, 2012 | (KR) | .................. | 10-2012-0071375 |
| Feb. 8, 2013 | (KR) | .................. | 10-2013-0014650 |
| May 30, 2013 | (KR) | .................. | 10-2013-0062110 |

(51) Int. Cl.
*H05K 5/00* (2025.01)
*B32B 3/04* (2006.01)
(Continued)

(52) U.S. Cl.
CPC ............. *H05K 5/0017* (2013.01); *B32B 3/04* (2013.01); *B32B 3/28* (2013.01); *B32B 7/12* (2013.01);
(Continued)

(58) Field of Classification Search
CPC ... B32B 37/003; B32B 37/0046; B32B 37/18; B32B 38/1866; B32B 2457/20–208; Y10T 156/1028; H10K 2102/311
See application file for complete search history.

(56) References Cited

U.S. PATENT DOCUMENTS

| 5,131,968 A | 7/1992 | Well et al. |
| 5,250,146 A | 10/1993 | Horvath |

(Continued)

FOREIGN PATENT DOCUMENTS

| CN | 1195407 A | 10/1998 |
| CN | 1447175 A | 10/2003 |

(Continued)

OTHER PUBLICATIONS

Office Action for U.S. Appl. No. 18/062,014 dated Jan. 25, 2024, 9 pages.

(Continued)

*Primary Examiner* — Carson Gross
(74) *Attorney, Agent, or Firm* — Womble Bond Dickinson (US) LLP

(57) ABSTRACT

A display device includes a cover window including a curved portion, and a panel member laminated on the cover window. A method of manufacturing a display device includes mounting a cover window including a curved portion on a first jig including a curved portion, mounting a panel member on a second jig that conforms to a surface of the first jig, and laminating the cover window to the panel member by moving a first one of the first jig or the second
(Continued)

jig to a first other one of the first jig or the second jig. An apparatus for manufacturing a display device includes a first jig including a mount surface that is partially curved to conform to a surface of a cover window, a second jig including a surface conforming to the mount surface and configured to contact a panel member, and a driving unit.

15 Claims, 38 Drawing Sheets

Related U.S. Application Data continuation of application No. 13/931,795, filed on Jun. 28, 2013, now Pat. No. 11,523,522.

(51) Int. Cl.

| | | |
|---|---|---|
| B32B 3/28 | (2006.01) | |
| B32B 7/12 | (2006.01) | |
| B32B 37/00 | (2006.01) | |
| B32B 37/18 | (2006.01) | |
| B32B 37/30 | (2006.01) | |
| B32B 38/18 | (2006.01) | |
| H05K 5/02 | (2006.01) | |
| H10K 50/84 | (2023.01) | |

(52) U.S. Cl.
CPC .......... *B32B 37/0046* (2013.01); *B32B 37/18* (2013.01); *B32B 37/30* (2013.01); *B32B 38/1841* (2013.01); *B32B 38/1866* (2013.01); *H05K 5/0217* (2013.01); *H10K 50/841* (2023.02); *B32B 2307/412* (2013.01); *B32B 2457/20* (2013.01); *B32B 2457/206* (2013.01); *B32B 2457/208* (2013.01); *Y10T 156/10* (2015.01); *Y10T 156/1002* (2015.01); *Y10T 156/1744* (2015.01); *Y10T 428/24628* (2015.01); *Y10T 428/24653* (2015.01)

(56) References Cited

U.S. PATENT DOCUMENTS

| | | | |
|---|---|---|---|
| 5,622,667 | A | 4/1997 | Fujiyama et al. |
| 7,045,944 | B2 | 5/2006 | Ushifusa et al. |
| 7,300,084 | B2 | 11/2007 | Chae et al. |
| 7,554,254 | B2 | 6/2009 | Lee et al. |
| 8,094,442 | B2 | 1/2012 | Sugawara |
| 8,163,126 | B2 | 4/2012 | Harada et al. |
| 8,212,970 | B2 | 7/2012 | Nagata |
| 8,338,198 | B2 | 12/2012 | Takayama et al. |
| 8,421,708 | B2 | 4/2013 | Han |
| 8,773,848 | B2 | 7/2014 | Russell-Clarke et al. |
| 9,323,400 | B2 | 4/2016 | Kim et al. |
| 9,439,315 | B2 * | 9/2016 | Lee .............. H10K 59/871 |
| 10,194,538 | B2 * | 1/2019 | Lee .............. B32B 3/28 |
| 11,032,918 | B2 | 6/2021 | Lee et al. |
| 11,032,924 | B2 | 6/2021 | Lee et al. |
| 2002/0027636 | A1 | 3/2002 | Yamada |
| 2002/0180712 | A1 | 12/2002 | Sato et al. |
| 2003/0184217 | A1 | 10/2003 | Yamazaki et al. |
| 2004/0135160 | A1 | 7/2004 | Cok |
| 2005/0259423 | A1 | 11/2005 | Heuser et al. |
| 2006/0216909 | A1 | 9/2006 | Yamazaki et al. |
| 2006/0273304 | A1 | 12/2006 | Cok |
| 2007/0194304 | A1 | 8/2007 | Zu et al. |
| 2008/0074022 | A1 | 3/2008 | Wang et al. |
| 2008/0227507 | A1 | 9/2008 | Joo |
| 2009/0002930 | A1 | 1/2009 | Nakanishi et al. |
| 2009/0088041 | A1 | 4/2009 | Inoue et al. |
| 2009/0096965 | A1 | 4/2009 | Nagata |
| 2009/0277578 | A1 | 11/2009 | Sung et al. |
| 2010/0033661 | A1 | 2/2010 | Shinya et al. |
| 2010/0073593 | A1 | 3/2010 | Sasaki et al. |
| 2010/0090981 | A1 | 4/2010 | Park et al. |
| 2010/0103138 | A1 | 4/2010 | Huang et al. |
| 2010/0253902 | A1 | 10/2010 | Yamazaki et al. |
| 2010/0264817 | A1 | 10/2010 | Bouten et al. |
| 2010/0284132 | A1 | 11/2010 | Yi et al. |
| 2011/0019123 | A1 | 1/2011 | Prest et al. |
| 2011/0019129 | A1 | 1/2011 | Nishizawa et al. |
| 2011/0050657 | A1 | 3/2011 | Yamada |
| 2011/0068492 | A1 | 3/2011 | Chen et al. |
| 2011/0120619 | A1 | 5/2011 | Harada et al. |
| 2011/0146893 | A1 | 6/2011 | Marty et al. |
| 2011/0199348 | A1 | 8/2011 | Takatani et al. |
| 2011/0261002 | A1 | 10/2011 | Verthein |
| 2012/0051067 | A1 | 3/2012 | Murray |
| 2012/0055826 | A1 | 3/2012 | Nishimura |
| 2012/0081874 | A1 | 4/2012 | Wu et al. |
| 2012/0105340 | A1 | 5/2012 | Beom et al. |
| 2012/0111479 | A1 * | 5/2012 | Sung .............. B32B 17/10036 156/476 |
| 2012/0114901 | A1 | 5/2012 | Uraji et al. |
| 2012/0120023 | A1 | 5/2012 | Huang et al. |
| 2012/0218651 | A1 | 8/2012 | Onishi et al. |
| 2012/0236526 | A1 | 9/2012 | Weber |
| 2012/0242588 | A1 | 9/2012 | Myers et al. |
| 2012/0275024 | A1 | 11/2012 | Marzen et al. |
| 2012/0275097 | A1 | 11/2012 | Lee |
| 2013/0002133 | A1 | 1/2013 | Jin et al. |
| 2013/0002583 | A1 | 1/2013 | Jin et al. |
| 2013/0029075 | A1 | 1/2013 | Niiyama et al. |
| 2013/0034685 | A1 | 2/2013 | An et al. |
| 2013/0083496 | A1 | 4/2013 | Franklin et al. |
| 2013/0188366 | A1 | 7/2013 | Russell-Clarke et al. |
| 2013/0284351 | A1 | 10/2013 | Natarajan et al. |
| 2014/0002975 | A1 | 1/2014 | Lee et al. |
| 2014/0104762 | A1 | 4/2014 | Park |
| 2014/0140037 | A1 | 5/2014 | Cho |
| 2014/0233194 | A1 | 8/2014 | Hongo et al. |
| 2015/0293390 | A1 | 10/2015 | Tsunekawa |

FOREIGN PATENT DOCUMENTS

| | | |
|---|---|---|
| CN | 1704814 A | 12/2005 |
| CN | 101026182 A | 8/2007 |
| CN | 101086563 A | 12/2007 |
| CN | 101306620 A | 11/2008 |
| CN | 101308263 A | 11/2008 |
| CN | 101334547 A | 12/2008 |
| CN | 101399175 A | 4/2009 |
| CN | 101652804 A | 2/2010 |
| CN | 201811892 U | 4/2011 |
| CN | 102066110 A | 5/2011 |
| CN | 102119077 A | 7/2011 |
| CN | 102290429 A | 12/2011 |
| CN | 102402323 A | 4/2012 |
| CN | 203415180 U | 1/2014 |
| EP | 2457881 A1 | 5/2012 |
| JP | 6-238691 A | 8/1994 |
| JP | 07-114347 A | 5/1995 |
| JP | 11-291252 A | 10/1999 |
| JP | 2002-240742 A | 8/2002 |
| JP | 2005-161528 A | 6/2005 |
| JP | 2006-248651 A | 9/2006 |
| JP | 2007-246881 A | 9/2007 |
| JP | 2007-326259 A | 12/2007 |
| JP | 2008-060376 A | 3/2008 |
| JP | 4567941 B2 | 10/2010 |
| KR | 1999-0068730 A | 9/1999 |
| KR | 2003-0042823 A | 6/2003 |
| KR | 10-2006-0129848 A | 12/2006 |
| KR | 10-2008-0056823 A | 6/2008 |
| KR | 10-0864407 B1 | 10/2008 |
| KR | 10-2009-0057967 A | 6/2009 |
| KR | 10-2010-0026366 A | 3/2010 |
| KR | 10-2010-0041450 A | 4/2010 |
| KR | 10-2011-0096455 A | 8/2011 |
| KR | 10-2012-0029090 A | 3/2012 |
| KR | 10-2012-0040783 A | 4/2012 |
| KR | 10-2012-0050393 A | 5/2012 |
| KR | 10-2013-0057364 | 5/2013 |

(56) References Cited

FOREIGN PATENT DOCUMENTS

| | | |
|---|---|---|
| KR | 10-1849656 B1 | 4/2018 |
| TW | 201017499 A | 5/2010 |
| TW | 201112199 A1 | 4/2011 |
| WO | WO 2011/010873 A2 | 1/2011 |
| WO | WO 2011/055504 A1 | 5/2011 |
| WO | WO 2011/148990 A1 | 12/2011 |
| WO | WO 2012/036389 A2 | 3/2012 |

OTHER PUBLICATIONS

U.S. Office Action dated Jun. 2, 2023, issued in U.S. Appl. No. 18/062,014 (9 pages).
U.S. Final Office Action dated Oct. 13, 2023, issued in U.S. Appl. No. 18/062,014 (11 pages).
Tangent (www.nnathopenref.conn) accessed Nov. 1, 2019.
Huang, Jian-Ji, et al.; Lifetime Improvement of Organic Light Emitting Diodes using LiF Thin Film and UV Glue Encapsulation, Japanese Journal of Applied Physics, vol. 47, No. 7, 2008, pp. 5676-5680.
Xiang, Li Jian et al.; Progress of encapsulation technology of organic light emitting diodes, School of Optoelectronic Information, Papers of the Seventh China Academic Conference on Functional Materials and Application with English Abstract, dated Oct. 31, 2010, pp. 163-166.
www.merriam-webster.com/dictionary/flat accessed Jul. 24, 2018 (Year: 2018).
Abstract and partial English translation of relevant parts of JP 2007-326259 A dated Dec. 20, 2007, listed above (2 pages).
European Search Report dated Oct. 28, 2013 issued in European Patent Application 13173931.0, 5 pages.
SIPO Office action dated Jan. 19, 2016, for corresponding Chinese Patent application 201410386628.X, (9 pages).
SIPO Office action dated Oct. 9, 2016, for corresponding Chinese Patent application 201310269434.7 (6 pages).
SIPO Office Action, with English translation, dated Feb. 28, 2017, for corresponding Chinese Patent Application No. 201410386628.X (25 pages).
TIPO Office Action dated Oct. 21, 2016, with English Translation, for corresponding Taiwanese Patent Application No. 102122915 (34 pages).
U.S. Notice of Allowance dated May 6, 2016, for cross reference U.S. Appl. No. 13/871,970 (9 pages).
U.S. Final Office Action dated Mar. 23, 2022, issued in U.S. Appl. No. 13/931,795 (29 pages).
U.S. Final Office Action dated Nov. 6, 2019, issued in U.S. Appl. No. 13/931,795 (23 pages).
U.S. Office Action dated Jun. 2, 2020, issued in U.S. Appl. No. 13/931,795 (26 pages).
U.S. Final Office Action dated Dec. 8, 2017, issued in U.S. Appl. No. 13/931,795 (20 pages).
U.S. Office action dated Jan. 15, 2016, for cross reference U.S. Appl. No. 13/931,795, (20 pages).
U.S. Final Office Action dated Jan. 4, 2017, issued in cross-reference U.S. Appl. No. 13/931,795 (17 pages).
U.S. Office action dated Jul. 6, 2015, for cross reference U.S. Appl. No. 13/931,795 (21 pages).
U.S. Office action dated Jul. 8, 2016, for cross reference U.S. Appl. No. 13/931,795 (25 pages).
U.S. Notice of Allowance dated Aug. 4, 2022, issued in U.S. Appl. No. 13/931,795 (8 pages).
U.S. Advisory Action dated May 27, 2022, issued in U.S. Appl. No. 13/931,795 (3 pages).
U.S. Office Action: Non-Final Rejection issued Feb. 8, 2018, in U.S. Appl. No. 14/794,720 (17 pages).
U.S. Office Action: Final Rejection issued Aug. 1, 2018, in U.S. Appl. No. 14/794,720 (18 pages).
U.S. Office Action: Advisory Action issued Oct. 12, 2018, in U.S. Appl. No. 14/794,720 (3 pages).
U.S. Office Action: Non-Final Rejection issued Feb. 21, 2019, in U.S. Appl. No. 14/794,720 (19 pages).
U.S. Office Action: Final Rejection issued Jun. 27, 2019, in U.S. Appl. No. 14/794,720 (24 pages).
U.S. Office Action: Non-Final Rejection issued Dec. 20, 2019, in U.S. Appl. No. 14/794,720 (31 pages).
U.S. Office Action: Final Rejection issued Apr. 24, 2020, in U.S. Appl. No. 14/794,720 (35 pages).
U.S. Office Action: Advisory Action issued Jun. 29, 2020, in U.S. Appl. No. 14/794,720 (8 pages).
U.S. Notice of Allowance dated Aug. 18, 2022, issued in U.S. Appl. No. 14/794,720 (8 pages).
U.S. Notice of Allowance dated Nov. 30, 2022, issued in U.S. Appl. No. 14/794,720 (6 pages).
U.S. Office Action dated Aug. 29, 2017, issued in cross-reference U.S. Appl. No. 15/235,023 (7 pages).
U.S. Office Action dated Oct. 16, 2020, issued in U.S. Appl. No. 16/828,898 (8 pages).
U.S. Office Action dated Jun. 3, 2022, issued in U.S. Appl. No. 17/341,303 (9 pages).
U.S. Notice of Allowance dated Sep. 12, 2022, issued in U.S. Appl. No. 17/341,303 (10 pages).
U.S. Office Action: Advisory Action issued Sep. 14, 2021, in U.S. Appl. No. 13/931,795 (3 pages).
U.S. Office Action: Advisory Action issued Feb. 7, 2020, in U.S. Appl. No. 13/931,795 (3 pages).
U.S. Office Action: Advisory Action issued Mar. 22, 2019, in U.S. Appl. No. 13/931,795 (3 pages).
U.S. Office Action: Advisory Action issued Mar. 8, 2018, in U.S. Appl. No. 13/931,795 (6 pages).
U.S. Office Action: Advisory Action issued Mar. 23, 2017, in U.S. Appl. No. 13/931,795 (7 pages).
U.S. Office Action: Final Rejection issued Jul. 7, 2021, in U.S. Appl. No. 13/931,795 (30 pages).
U.S. Office Action: Final Rejection issued Nov. 6, 2020, in U.S. Appl. No. 13/931,795 (26 pages).
U.S. Office Action: Final Rejection issued Jan. 18, 2019, in U.S. Appl. No. 13/931,795 (20 pages).
U.S. Office Action: Non-Final Rejection issued Nov. 2, 2021, in U.S. Appl. No. 13/931,795 (28 pages).
U.S. Office Action: Non-Final Rejection issued Mar. 11, 2021, in U.S. Appl. No. 13/931,795 (26 pages).
U.S. Office Action: Non-Final Rejection issued Jun. 25, 2019, in U.S. Appl. No. 13/931,795 (21 pages).
U.S. Office Action: Non-Final Rejection issued Aug. 10, 2018, in U.S. Appl. No. 13/931,795 (19 pages).
U.S. Office Action: Non-Final Rejection issued Jul. 3, 2017, in U.S. Appl. No. 13/931,795 (23 pages).
U.S. Non-Final Office Action issued Jan. 22, 2015, in U.S. Appl. No. 13/871,970, 7 pages.
U.S. Non-Final Office Action issued Jul. 1, 2015, in U.S. Appl. No. 13/871,970, 5 pages.
U.S. Non-Final Office Action issued Jan. 30, 2018, in U.S. Appl. No. 14/803,025, 9 pages.
U.S. Notice of Allowance issued Jun. 1, 2018, in U.S. Appl. No. 14/803,025, 8 pages.
U.S. Notice of Allowance issued Sep. 25, 2018, in U.S. Appl. No. 14/803,025, 8 pages.
U.S. Final Office Action issued Mar. 5, 2018, in U.S. Appl. No. 15/235,023, 9 pages.
U.S. Advisory Action issued Jun. 11, 2018, in U.S. Appl. No. 15/235,023, 3 pages.
U.S. Non-Final Office Action issued Sep. 20, 2018, in U.S. Appl. No. 15/235,023, 7 pages.
U.S. Notice of Allowance issued Jan. 9, 2019, in U.S. Appl. No. 15/235,023, 8 pages.
U.S. Notice of Allowance issued Apr. 16, 2019, in U.S. Appl. No. 15/235,023, 8 pages.
U.S. Notice of Allowance issued Jul. 25, 2019, in U.S. Appl. No. 15/235,023, 9 pages.
U.S. Notice of Allowance issued Dec. 18, 2019, in U.S. Appl. No. 15/235,023, 9 pages.

(56) References Cited

OTHER PUBLICATIONS

U.S. Notice of Allowance issued May 11, 2020, in U.S. Appl. No. 15/235,023, 9 pages.
U.S. Notice of Allowance issued Oct. 22, 2020, in U.S. Appl. No. 15/235,023, 9 pages.
U.S. Notice of Allowance issued Feb. 3, 2021, in U.S. Appl. No. 15/235,023, 9 pages.
U.S. Notice of Allowance issued Feb. 9, 2021, in U.S. Appl. No. 16/828,898, 9 pages.

* cited by examiner

DISPLAY DEVICE, AND METHOD AND APPARATUS FOR MANUFACTURING THE SAME

CROSS-REFERENCE TO RELATED PATENT APPLICATIONS

This application is a divisional of, and claims priority to and the benefit of U.S. application Ser. No. 14/794,720, filed on Jul. 8, 2015, which is a continuation of U.S. patent application Ser. No. 13/931,795, filed on Jun. 28, 2013, now U.S. Pat. No. 11,523,522 B2, issued on Dec. 6, 2022, which claims priority to and the benefit of Korean Patent Application Nos. 10-2012-0071375, filed on Jun. 29, 2012, 10-2013-0014650, filed on Feb. 8, 2013, and 10-2013-0062110, filed on May 30, 2013 in the Korean Intellectual Property Office, the entire contents of all of which are incorporated herein by reference.

BACKGROUND

1. Field

Aspects of embodiments of the present invention relate to a display device, and a method and apparatus for manufacturing the display device.

2. Description of the Related Art

Electronic devices based on portability are widely used. Portable electronic devices that have recently been widely used include small electronic devices such as mobile phones as well as tablet personal computers (PCs). In order to support various functions, portable electronic devices include a display device for providing visual information such as an image to a user. Recently, as sizes of components for driving display devices have decreased, the importance of display devices in electronic devices has increased. Accordingly, display devices (such as flexible display devices) that bend at a set angle (for example, a predetermined angle) have been developed.

In general, flexible display devices that may bend at a set angle may be manufactured using a flexible process, such as being flexibly manufactured. Since a flexible display device may be formed of a flexible material, the flexible display device may have any of various shapes. A flexible display device may be manufactured by forming a light-emitting unit on a substrate to form a display unit, and sealing the display unit by using an encapsulation unit, which may increase a lifetime of the display unit. The substrate may be formed of a flexible material, and the encapsulation unit may be formed, for example, as a substrate or a thin film. As designs of electronic devices have recently been diversified, demands for flexible display devices have increased.

SUMMARY

Embodiments of the present invention provide for a display device having a curved shape (for example, having an arc shape or a degree of curvature) that may enable efficient mass production, high reliability, and high quality. Further embodiments provide for a method and apparatus for manufacturing the display device.

According to an embodiment of the present invention, a display device is provided. The display device includes a cover window including a curved portion, and a panel member laminated on the cover window.

The panel member may be smaller in at least one of a length or a width than the cover window.

The display device may further include an adhesive layer between the panel member and the cover window.

The cover window may further include a flat portion extending from the curved portion.

The panel member may be laminated entirely on the flat portion.

The curved portion may include a plurality of curved portions.

The panel member may include a first panel portion laminated on the flat portion, and a second panel portion extending in a curved shape from the first panel portion and laminated on the curved portion.

The cover window may have a curved surface having a curvature radius.

A curvature radius of a portion of the cover window may be different from a curvature radius of another portion of the cover window.

The panel member may be formed on a recessed outer surface of the cover window or a protruding outer surface of the cover window.

The panel member may include at least one of a display panel or a touch screen panel (TSP).

The panel member may be flexible.

According to another embodiment of the present invention, a method of manufacturing a display device is provided. The method includes mounting a cover window including a curved portion on a first jig including a curved portion, mounting a panel member on a second jig that conforms to a surface of the first jig, and laminating the cover window to the panel member by moving a first one of the first jig or the second jig to a first other one of the first jig or the second jig.

At least a portion of the panel member may contact a surface of the second jig.

The panel member may be bent along an outer surface of the second jig during the mounting of the panel member on the second jig.

The panel member may be smaller in at least one of a length or a width than the cover window.

The panel member may be flat during the mounting of the panel member on the second jig. The laminating of the cover window to the panel member may include partially curving the panel member by the moving of the first one of the first jig or the second jig.

The first one of the first jig or the second jig may be above the first other one of the first jig or the second jig, or the first other one of the first jig or the second jig may be above the first one of the first jig or the second jig.

A second one of the first jig or the second jig may be formed by protruding toward or recessing away from a second other one of the first jig or the second jig.

The second other one of the first jig or the second jig may be formed by recessing away from or protruding toward the second one of the first jig or the second jig.

The mounting of the panel member may include fixing the panel member to the second jig.

The panel member may be flexible.

Outer surfaces of the cover window and the first jig may be curved surfaces each having a curvature radius.

A curvature radius of a portion of the cover window may be different from a curvature radius of another portion of the cover window. A curvature radius of a portion of an outer surface of the first jig may be different from a curvature radius of another portion of the outer surface of the first jig.

The panel member may be attached to a recessed outer surface of the cover window or a protruding outer surface of the cover window.

The panel member may include at least one of a display panel or a touch screen panel (TSP).

According to yet another embodiment of the present invention, an apparatus for manufacturing a display device is provided. The apparatus includes a first jig including a mount surface that is partially curved to conform to a surface of a cover window, a second jig including a surface conforming to the mount surface and configured to contact a panel member, and a driving unit connected to a first one of the first jig or the second jig and configured to move the first one of the first jig or the second jig.

The first jig may further include a first fixing unit for fixing the cover window to the mount surface. The second jig may further include a second fixing unit for fixing the panel member to the surface conforming to the mount surface.

The first fixing unit or the second fixing unit may include an absorption unit, and an absorption pump for evacuating air from the absorption unit.

The apparatus may further include a cushion unit at an outer surface of at least one of the first jig or the second jig.

The cushion unit may include a plurality of cushion units at respective ends of the at least one of the first jig or the second jig. A distance between the cushion units may be less than at least one of a length or a width of the panel member.

A second one of the first jig or the second jig may be formed by protruding toward or recessing away from another one of the first jig or the second jig.

The other one of the first jig or the second jig may be formed by recessing away from or protruding toward the second one of the first jig or the second jig.

An outer surface of the cover window and an outer surface of the first jig on which the cover window is configured to be seated may be curved surfaces each having a curvature radius.

A curvature radius of a portion of the cover window may be different from a curvature radius of another portion of the cover window. A curvature radius of a portion of an outer surface of the first jig on which the cover window is configured to be seated may be different from a curvature radius of another portion of the outer surface of the first jig.

The panel member may be configured to be attached to a recessed outer surface of the cover window or a protruding outer surface of the cover window.

The panel member may include at least one of a display panel or a touch screen panel (TSP).

The apparatus may further include a clamping unit spaced from the second jig and configured to support the panel member.

The clamping unit may include a plurality of clamping units. A distance between the clamping units may be less than at least one of a length or a width of the panel member when the clamping units support the panel member.

The apparatus may further include a linear driving unit coupled to the clamping unit and configured to linearly move the clamping unit.

The linear driving unit may be further configured to linearly move the clamping unit in a same direction as a moving direction of the second jig.

The linear driving unit may be further configured to linearly move the clamping unit in a diagonal direction of a moving direction of the second jig.

At least one of the first jig or the second jig may further include a cushion unit at an outer surface of the at least one of the first jig or the second jig.

A second one of the first jig or the second jig may be formed by protruding toward or recessing away from another one of the first jig or the second jig.

The other one of the first jig or the second jig may be formed by protruding toward or recessing away from the second one of the first jig or the second jig.

An outer surface of the cover window and an outer surface of the first jig on which the cover window is configured to be seated may be curved surfaces each having a curvature radius.

A curvature radius of a portion of the cover window may be different from a curvature radius of another portion of the cover window. A curvature radius of a portion of an outer surface of the jig on which the cover window is configured to be seated may be different from a curvature radius of another portion of the outer surface of the first jig.

The panel member may be configured to be attached to a recessed outer surface of the cover window or a protruding outer surface of the cover window.

The panel member may include least one of a display panel or a touch screen panel (TSP).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments are shown. The present invention may, however, be embodied in many different forms and should not be construed as being limited to the embodiments set forth herein. These embodiments are provided to make this disclosure more thorough, and to help convey concepts of the invention to one of ordinary skill in the art. The terminology used herein is for describing particular embodiments only and is not intended to be limiting of the present invention.

As used herein, the term "and/or" includes any and all combinations of one or more of the associated listed items. Expressions such as "at least one of," when preceding a list of elements, modify the entire list of elements and do not modify the individual elements of the list. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, these elements should not be limited by these terms. These terms are only used to distinguish one element from another element.

In the embodiments of the present invention, examples of display devices include various display devices. For example, examples of display devices include liquid crystal display devices and organic light-emitting display devices. However, for convenience of description, it will be assumed that the display devices are organic light-emitting display devices. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 1:
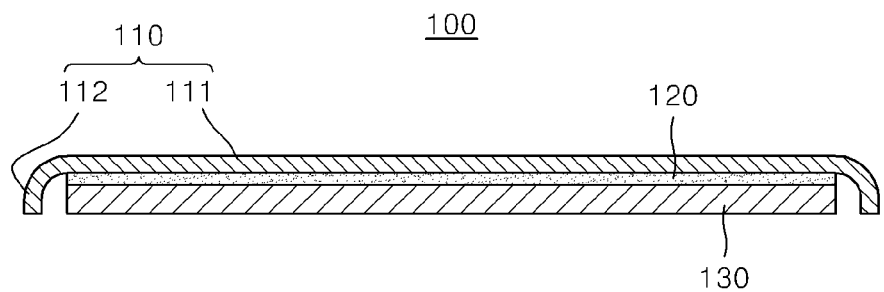
FIG. 1 is a cross-sectional view illustrating a display device according to an embodiment of the present invention.
Figure 2:
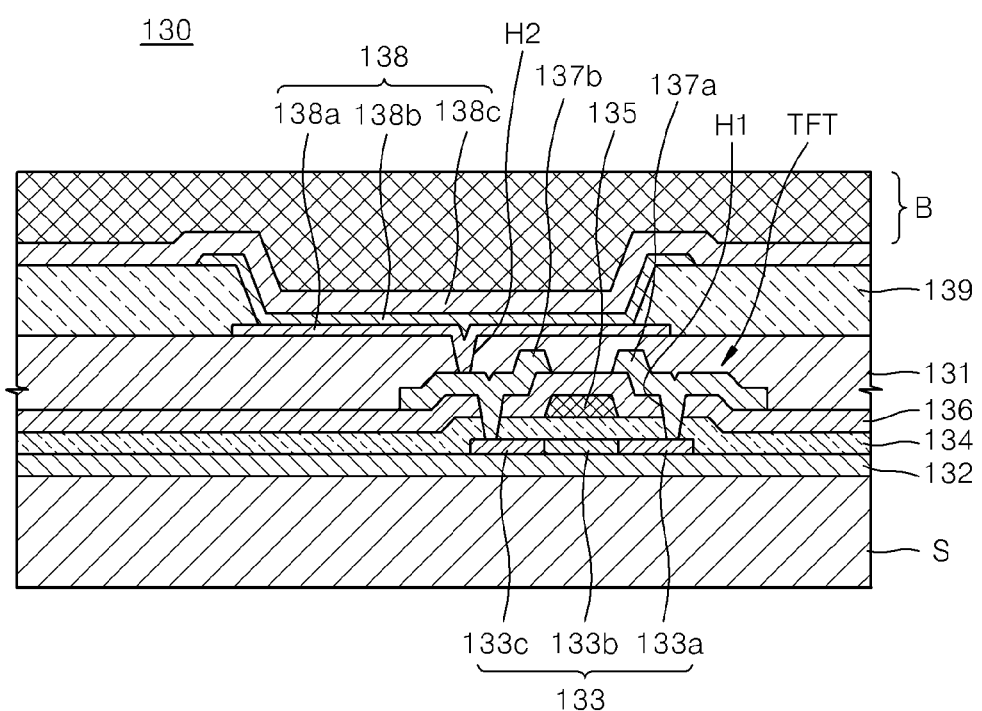
FIG. 2 is a cross-sectional view illustrating a display panel of the display device of FIG. 1.

FIG. 1 is a cross-sectional view illustrating a display device 100 according to an embodiment of the present invention. FIG. 2 is a cross-sectional view illustrating a display panel 130 of the display device 100 of FIG. 1.

Referring to FIGS. 1 and 2, the display device 100 includes a cover window 110, a panel member (for example, display panel 130), and an adhesive layer 120. In FIG. 1, the cover window 110 is partially curved. That is, the cover window 110 has a flat portion 111 (on which the display panel 130 is laminated, with the adhesive layer 120 therebetween) and at least one end of the flat portion 111 is curved (e.g., a curved portion 112). As shown in FIG. 1, both ends of the flat portion 111 are curved (e.g., two curved portions 112). As depicted, the cover window 110 includes the flat portion 111 and curved portions 112 that extend from the flat portion 111. The curved portions 112 are formed on both ends of the flat portion 111.

The panel member may include at least one of the display panel 130 or a touch screen panel (TSP). In one embodiment, the panel member may include only the display panel 130 and may be attached to the cover window 110. In another embodiment, the panel member may include only the TSP and may be attached to the cover window 110. In yet another embodiment, the panel member may include the display panel 130 and the TSP, and may be attached to the cover window 110. However, for convenience of description, it will be assumed that the panel member includes only the display panel 130.

The display panel 130 may be flexible. The display panel 130 may be formed such that a size of the display panel 130 is different from a size of the cover window 110. As shown, the display panel 130 is smaller than the cover window 110. For example, the display panel 130 is shorter in the at least one of a length or a width than the cover window 110 (due to the inward curvature of the cover window 110). For convenience of description, it will be assumed that the display panel 130 is shorter in width than the cover window 110 as described below in further detail. For example, the display panel 130 may be laminated entirely on the flat portion 111 (and not on any of the curved portions 112). The display panel 130 includes a first substrate S and a light-emitting unit.

The display panel 130 may include an encapsulation unit B formed on the light-emitting unit. The encapsulation unit B may be formed as a thin film. In another embodiment, the encapsulation unit B may include a second substrate instead of or in addition to a thin film. For convenience of description, however, it will be assumed that the encapsulation unit B is formed as a thin film.

In FIG. 2, the light-emitting unit is formed on the first substrate S. The light-emitting unit includes a thin film transistor (TFT, in this case a driving TFT), a passivation film 131 formed to cover the TFT, and an organic light-emitting device, such as an organic light emitting diode (OLED) 138 formed on the passivation film 131. The first substrate S may be formed of a glass material, but the present invention is not limited thereto and, in other embodiments, the first substrate S may be formed of a plastic material or a metal material such as steel use stainless (SUS, or stainless steel) or titanium (Ti). In another embodiment, the first substrate S may include polyimide (PI). For convenience of description, it will be assumed that the first substrate S is formed of PI.

A buffer layer 132 formed of an organic compound and/or an inorganic compound such as $SiO_x$ ($x \geq 1$) or $SiN_x$ ($x \geq 1$) is formed on a top surface of the first substrate S. An active layer 133 having a set pattern (for example, a predetermined pattern) is formed on the buffer layer 132, and then is covered by a gate insulating layer 134. The active layer 133 includes a source region 133a and a drain region 133c, and a channel region 133b located between the source region 133a and the drain region 133c. The active layer 133 may be formed by forming an amorphous silicon film on the buffer layer 132, crystallizing the amorphous silicon film to form a polycrystalline silicon film, and patterning the polycrystalline silicon film. The source and drain regions 133a and 133c of the active layer 133 are doped with impurities according to a type of the TFT such as a driving TFT (for example, driving TFT in FIG. 2) or a switching TFT.

A gate electrode 135 corresponding to the channel region 113b of the active layer 133 and an interlayer insulating layer 136 covering the gate electrode 135 are formed on a top surface of the gate insulating layer 134. After contact holes (for example, via-hole H1) are formed in the interlayer insulating layer 136 and the gate insulating layer 134, a source electrode 137a and a drain electrode 137b are formed on the interlayer insulating layer 136 to respectively contact the source region 133a and the drain region 133c.

In some embodiments, a reflective film is formed at the same time (for example, in the same layer) as the source/drain electrodes 137a and 137b are formed as described above. Accordingly, each of the source/drain electrodes 137a and 137b may be formed of a material having high electrical conductivity and having a thickness great enough to reflect light. Each of the source/drain electrodes 137a and 137b may be formed of a metal material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound or alloy thereof.

The passivation film 131 is formed on the TFT. Then a pixel electrode 138a of the OLED 138 is formed on the passivation film 131. The pixel electrode 138a contacts the drain electrode 137b of the TFT through a via-hole H2 formed in the passivation film 131. The passivation film 131 may be formed of an inorganic material and/or an organic material and have a single-layer structure or a multi-layer structure. As shown in FIG. 2, the passivation film 131 is formed as a planarization film having a flat top surface regardless of any roughness or irregularities of a bottom surface. The passivation film 131 may be formed of a transparent insulating material to achieve a resonance effect.

After the pixel electrode 138a is formed on the passivation film 131, a pixel-defining film 139 is formed of an organic material and/or an inorganic material to cover the pixel electrode 138a and the passivation film 131, and is opened to expose the pixel electrode 138a. An organic light-emitting layer 138b and a counter electrode 138c are formed on at least the pixel electrode 138a. The pixel electrode 138a functions as an anode and the counter electrode 138c functions as a cathode, or vice versa.

The pixel electrode 138a may be formed of a material having a high work function, such as indium tin oxide (ITO), indium zinc oxide (IZO), $In_2O_3$, or ZnO. The counter electrode 138c may be formed of a metal material having a low work function such as Ag, Mg, Al, Pt, Pd, Au, Ni, Nd, Ir, Cr, Li, Ca, or a compound or alloy thereof. For example, the counter electrode 138c may be formed of Mg, Ag, or Al to have a small thickness to function as a semi-transmissive reflective film. Accordingly, the counter electrode 138c may optically resonate to transmit light.

The pixel electrode 138a and the counter electrode 138c are insulated from each other by the organic light-emitting layer 138b, and apply voltages of different polarities to the organic light-emitting layer 138b for the organic light-emitting layer 138b to emit light. The organic light-emitting layer 138b may be formed of a low molecular weight organic material or a high molecular weight organic material.

If the organic light-emitting layer 138b is formed of a low molecular weight organic material, the light-emitting layer 138b may have a single-layer or multi-layer structure formed by stacking a hole injection layer (HIL), a hole transport layer (HTL), an emission layer (EML), an electron transport layer (ETL), and an electron injection layer (EIL). Examples of the low molecular weight organic material include copper phthalocyanine (CuPc), N,N'-Di(naphthalene-1-yl)-N,N'-diphenyl-benzidine (NPB), and tris-8-hydroxyquinoline aluminum (Alq3). The low molecular weight organic material is formed by using vacuum deposition. The HIL, the HTL, the ETL, and the EIL may be commonly applied to red, green, and blue pixels. Accordingly, in some embodiments, the common layers may cover all pixels, like the counter electrode 138*c*.

If the organic light-emitting layer 138*b* is formed of a high molecular weight organic material, the organic light-emitting layer 138*b* may have a structure including an HTL and an EML. The HTL may be formed of poly(3,4-ethylenedioxythiophene) (PEDOT) and the EML may be formed of a high molecular weight organic material based on polyphenylene vinylene (PPV) or polyfluorene. The high molecular weight organic material may be formed by using screen printing or inkjet printing. The organic light-emitting layer 138*b* is not limited thereto, and various examples may be formed, applied, deposited, etc., as would be apparent to one of ordinary skill in the art.

The encapsulation unit B may be formed as a thin film as described above. In further detail, the encapsulation unit B may be formed by alternately stacking at least one organic layer and at least one inorganic layer. In some embodiments, a plurality of inorganic layers or a plurality of organic layers may be provided.

The organic layer may be formed of a polymer, and may have a single-layer structure or a multi-layer structure formed of one or more selected from the group including polyethylene terephthalate, polyimide, polycarbonate, epoxy, polyethylene, and polyacrylate. In one embodiment, the organic layer may be formed of polyacrylate. In further detail, the organic layer may be formed by polymerizing a monomer composition including a diacrylate-based monomer and a triacrylate-based monomer. A monoacrylate-based monomer may be further included in the monomer composition. In one embodiment, a well-known photoinitiator such as TPO may be further included in the monomer composition, but other embodiments of the present embodiment are not necessarily limited thereto.

The inorganic layer may have a single-layer structure or a multi-layer structure including a metal oxide or a metal nitride. In further detail, the inorganic layer may include one or more selected from the group including SiNx, $Al_2O_3$, $SiO_2$, and $TiO_2$. In one embodiment, an uppermost layer of the encapsulation unit B that is exposed to the outside may be an inorganic layer to reduce or prevent moisture from penetrating into the organic light-emitting device.

The encapsulation unit B may have at least one sandwich structure in which at least one organic layer is inserted between at least two inorganic layers. In another embodiment, the encapsulation unit B may have at least one sandwich structure in which at least one inorganic layer is inserted between at least two organic layers.

The encapsulation unit B may include a first inorganic layer, a first organic layer, and a second inorganic layer that are sequentially stacked on the display unit. In another embodiment, the encapsulation unit B may include a first inorganic layer, a first organic layer, a second inorganic layer, a second organic layer, and a third inorganic layer that are sequentially stacked on the light-emitting unit. In another embodiment, the encapsulation unit B may include a first inorganic layer, a first organic layer, a second inorganic layer, a second organic layer, a third inorganic layer, a third organic layer, and a fourth inorganic layer that are sequentially stacked on the light-emitting unit.

A halogenated metal layer including LiF may be further disposed between the light-emitting unit and the first inorganic layer. The halogenated metal layer may reduce or prevent the light-emitting unit from being damaged when the first inorganic layer is formed by using sputtering or plasma deposition.

The first organic layer may have an area smaller than that of the second inorganic layer, and the second organic layer may have an area smaller than that of the third inorganic layer. In one embodiment, the first organic layer may be completely covered by the second inorganic layer, and the second organic layer may be completely covered by the third inorganic layer.

The encapsulation unit B may include a second substrate as described above. The second substrate may be formed similarly to the first substrate S. For example, the second substrate may be formed of a glass material, but like the first substrate S, the present invention is not limited thereto and, in other embodiments, the second substrate may be formed of a different material, such as a plastic material.

The display device 100 may include a touch panel formed on the display panel 130 as described above. The touch panel may be located between the display panel 130 and the adhesive layer 120. In other embodiments, the touch panel may be a panel positioned on the display panel 130. For example, the touch panel may be formed on the encapsulation unit B. In another embodiment, the touch panel may be formed on the cover window 110 to have a panel shape or to have a pattern. As a method of forming a touch panel is well known to one of ordinary skill in the art, a detailed description thereof will not be given. In addition, for convenience of description, it will be assumed that a touch panel is not formed on the display panel 130.

The display device 100 includes the adhesive layer 120 that is located between the display panel 130 and the cover window 110. The adhesive layer 120 may be variously formed. For example, the adhesive layer 120 may include an adhesive film such as an optical clear adhesive (OCA) film or an adhesive material.

The adhesive layer 120 may have the same size as the display panel 130. In other embodiments, the adhesive layer 120 may be smaller than the display panel 130. The adhesive layer 120 is attached to one surface of the display panel 130 to laminate the display panel 130 to the cover window 110. For example, the adhesive layer 120 may be applied to the encapsulation unit B.

Accordingly, the display device 100 that is partially curved may be attached to various electronic devices, and may easily display images having various shapes. A method of manufacturing the display device 100 will now be described with reference to FIGS. 3 through 4C.

Figure 3:
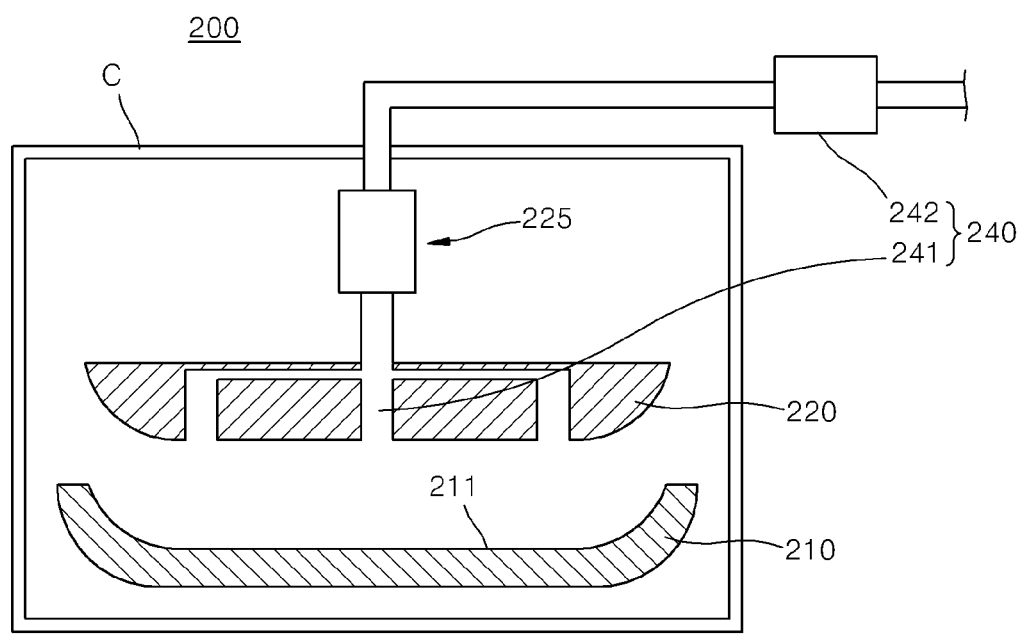
FIG. 3 is a cross-sectional view illustrating an apparatus for manufacturing the display device of FIG. 1 according to an embodiment of the present invention.
Figure 4A:
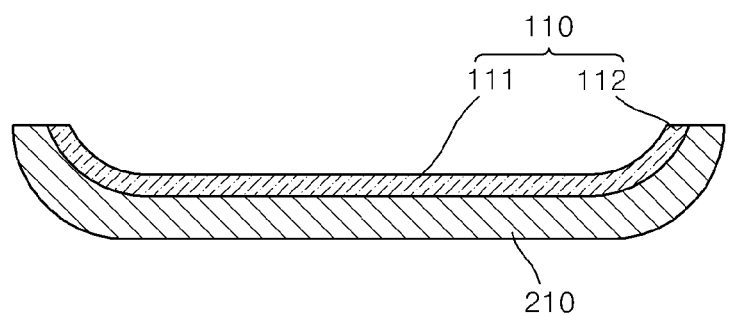
FIGS. 4A through 4C are cross-sectional views illustrating a method of manufacturing the display device of FIG. 1 according to an embodiment of the present invention.
Figure 4B:
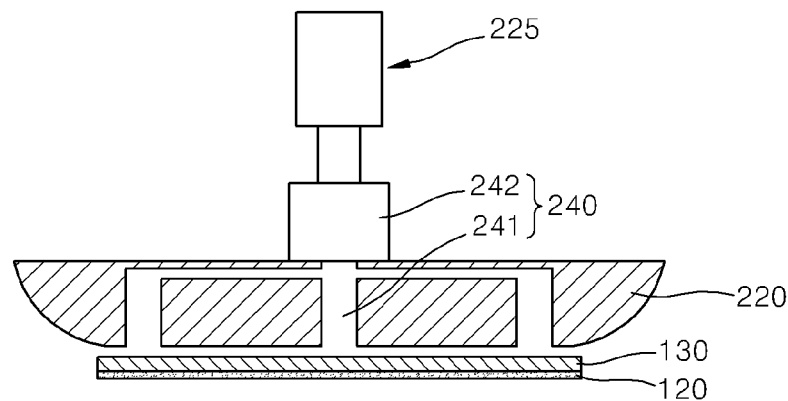
Figure 4C:
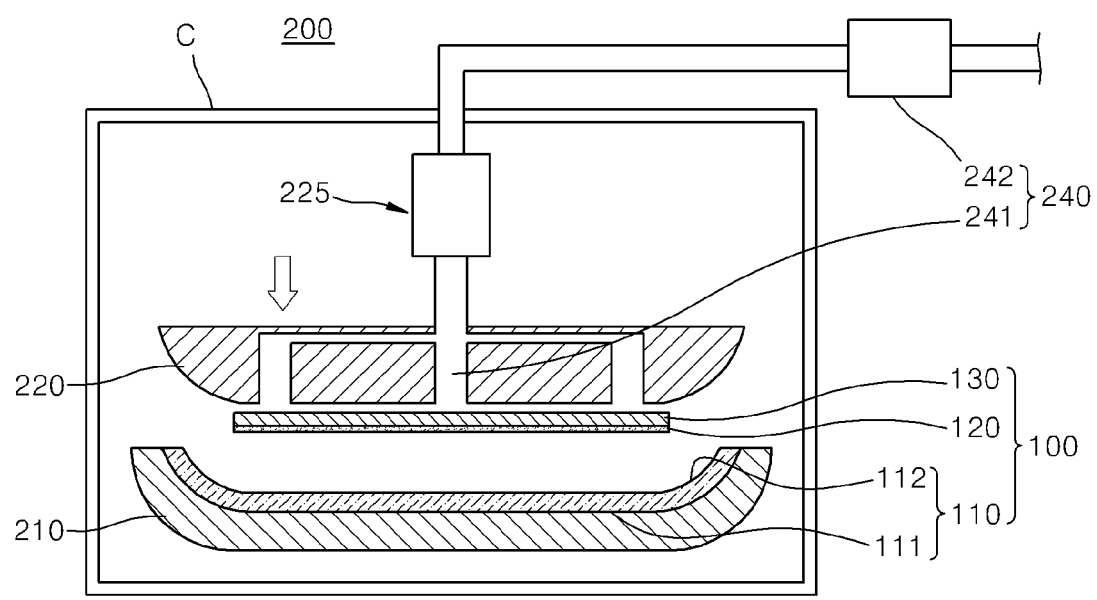

FIG. 3 is a cross-sectional view illustrating an apparatus 200 for manufacturing the display device 100 of FIG. 1 according to an embodiment of the present invention. FIGS. 4A through 4C are cross-sectional views illustrating a method of manufacturing the display device 100 of FIG. 1 according to an embodiment of the present invention. The same elements as those in FIG. 1 are denoted by the same reference numerals.

Referring to FIGS. 3 through 4C, the apparatus 200 includes a first jig 210 that is partially curved and has a mount surface 211 that conforms to one surface of the cover window 110. In FIGS. 3 through 4C, the first jig 210 has a shape similar to that of the cover window 110. That is, the mount surface 211 of the first jig 210 is curved. In addition, the mount surface 211 has a flat portion on which the flat portion 111 of the cover window is mounted and the mount surface 211 has curved portions on which the curved portions 112 of the cover window are mounted. For example, the mount surface 211 may be formed by being recessed in the first jig 210.

The apparatus 200 includes a second jig 220 that detachably couples to the first jig 210. One surface of the second jig 220 conforms to the mount surface 211. In FIGS. 3 through 4C, one surface of the second jig 220 is curved in places to conform to the portions of the mount surface 211 that are curved, and is flat in places to conform to the portion of the mount surface 211 that is flat. That is, the second jig 220 is curved such that the second jig 220 protrudes toward the first jig 210. The display panel 130 is mounted on the flat surface of the second jig 220.

At least one of the first jig 210 or the second jig 220 may be formed of an elastic material. In addition, at least one of the first jig 210 or the second jig 220 may be formed of a hard material.

In particular, the elastic material may be a soft material having an elastic force such as silicon, rubber, or a soft synthetic resin. The hard material may be a material having a high hardness such as reinforced plastic or a metal.

Materials of the first jig 210 and the second jig 220 may be selected in various ways. For example, the first jig 210 may be formed of a metal and the second jig 220 may be formed of silicon. In another embodiment, the first jig 210 may be formed of rubber and the second jig 220 may be formed of plastic. However, for convenience of description, it will be assumed that both the first jig 210 and the second jig 220 are formed of hard materials.

The apparatus 200 may include a driving unit (such as second driving unit 225) that is connected to at least one of the first jig 210 or the second jig 220, and that moves the corresponding at least one of the first jig 210 or the second jig 220. The driving unit may include a first driving unit that moves the first jig 210 and the second driving unit 225 that moves the second jig 220. The first driving unit and the second driving unit 225 may be formed similarly. For convenience of description, it will be assumed that the second driving unit 225 is provided.

The second driving unit 225 may include any of various devices. For example, the second driving unit 225 may include a cylinder that operates by air pressure or oil pressure to move the second jig 220. In other embodiments, the second driving unit 225 may include a motor that operates by electricity to move the second jig 220. For convenience of description, it will be assumed that the second driving unit 225 includes a cylinder.

The apparatus 200 includes a fixing unit (for example, second fixing unit 240) that prevents or helps prevent the cover window 110 mounted on the first jig 210 from moving, or that prevents or helps prevent the display panel 130 and the adhesive layer 120 mounted on the second jig 220 from separating from the second jig 220. The fixing unit includes an absorption unit (for example, second absorption unit 241) that is formed on at least one of the first jig 210 or the second jig 220. In addition, the fixing unit includes an absorption pump (for example, second absorption pump 242) that absorbs (for example, vacuums or evacuates) air from the absorption unit. In particular, the absorption pump may be provided outside a chamber C as described below. The fixing unit is not limited thereto and, in other embodiments, may be formed in other various ways as would be apparent to one of ordinary skill in the art. For example, the fixing unit may be a separate frame that is formed on the first jig 210 or the second jig 220. As another example, the fixing unit may be an adhesive member having an adhesive force.

The fixing unit may include a first fixing unit that is provided on the first jig 210, and includes a second fixing unit 240 that is provided on the second jig 220. The first fixing unit and the second fixing unit 240 may be formed similarly. For example, the first fixing unit and the second fixing unit 240 may fix the cover window 110 and the display panel 130, respectively, by using air. In other embodiments, the first fixing unit and the second fixing unit 240 may fix the cover window 110 and the display panel 130, respectively, by using a separate frame. However, for convenience of description, it will be assumed that only the second fixing unit 240 is used and the display panel 130 is fixed by using air.

Accordingly, the apparatus 200 may rapidly and easily manufacture the display device 100 having a curved shape and a simple structure. In addition, since the apparatus 200 may accurately laminate the cover window 110 having a curved shape to the display panel 130, a defect rate may be reduced or minimized. A method of manufacturing the display device 100 by using the apparatus 200 will now be described with reference to FIGS. 4A through 4C.

In order to manufacture the display device 100, the cover window 110 is first fabricated. The cover window 110 may include any of various materials. For example, the cover window 110 may be formed of a glass material or a plastic material. The cover window 110 is not limited thereto and, in other embodiments, may include any material as long as the cover window 110 is partially curved or capable of being partially curved.

After the cover window 110 is fabricated, it may be flat, in which case the curved portions 112 may be formed by bending both ends of the cover window 110. For example, the curved portions 112 may be bent from the flat portion 111. In FIGS. 4A and 4C, the curved portions 112 extend from the flat portion 111 as described above, and each has an arc shape having a set radius (for example, a predetermined radius) or degree of curvature. In other embodiments, each of the curved portions 112 may have, for example, an oval shape instead of the arc shape.

The display panel 130 may be manufactured before, during, or after the cover window 110 is manufactured. A method of manufacturing the display panel 130 may be substantially the same as a method of manufacturing a general display panel (as would be apparent to one of ordinary skill in the art) and thus, a further detailed description thereof will not be given.

Once the display panel 130 is prepared, the adhesive layer 120 is attached to one surface of the display panel 130. For example, the adhesive layer 120 may be attached to the encapsulation unit B (or other second substrate) as described above with reference to FIG. 2. The adhesive layer 120 may, for example, be attached as a film to the encapsulation unit B, or be applied as a material to the encapsulation unit B. However, for convenience of description, it will be assumed that the adhesive layer 120 is formed as a film.

After the adhesive layer 120 is attached to the display panel 130, the cover window 110 and the display panel 130 are respectively mounted on the first jig 210 and the second jig 220. That is, the cover window 110 is mounted on the first jig 210, and the display panel 130 is mounted on the second jig 220. The first jig 210 may be below the second jig 220 (for example, in a gravity direction).

Next, the distance between the first jig 210 and the second jig 220 is decreased. For example, the first jig 210 may move toward the second jig 220, or the second jig 220 may move toward the first jig 210. In other embodiments, both the first jig 210 and the second jig 220 may move closer to each other. However, for convenience of description, it will be assumed that the second jig 220 moves.

One surface of the first jig 210 is curved to conform (for example, closely attach) to one surface of the cover window 110. In FIGS. 4A and 4C, the surface of the first jig 210 is curved by being recessed. In addition, the display panel 130 is mounted on one surface of the second jig 220. The second fixing unit 240 fixes the display panel 130 to the surface of the second jig 220.

In FIGS. 4B and 4C, when the display panel 130 is mounted on the second jig 220, a second absorption unit 241 contacts, adheres, or is otherwise attached or fixed to one surface of the display panel 130. The second absorption unit 241 is partially exposed through an outer surface of the second jig 220. When the display panel 130 is positioned in this manner, the second absorption pump 242 absorbs air from the second absorption unit 241 (for example, by creating a partial vacuum or a pressure difference). Since the display panel 130 closes (for example, occludes) all or a portion of the second absorption unit 241, and air in the second absorption unit 241 is continuously absorbed (for example, vacuumed or evacuated), the second absorption unit 241 is in an almost vacuum state. When the second absorption pump 242 operates as described above, the display panel 130 attached to the second jig 220 is not separated from the second jig 220 due to the pressure difference.

In FIGS. 3 through 4C, a plurality of second absorption units 241 is provided. The second absorption units 241 are exposed or partially exposed through an outer surface of the second jig 220 as described above and are spaced apart from one another by a set interval (for example, a predetermined interval, such as evenly spaced).

When the cover window 110, the adhesive layer 120, and the display panel 130 are prepared as described above, the second jig 220 is moved toward the first jig 210 by driving the second driving unit 225. For example, the second driving unit 225 may be programmed to operate for a set period of time (for example, a predetermined period of time). When the second driving unit 225 operates in this manner, the second jig 220 approaches the first jig 210. When the second jig 220 is continuously moved toward the first jig 210, the adhesive layer 120 contacts the cover window 110.

In FIG. 4C, sizes of the adhesive layer 120 and the display panel 130 may be the same as or less than a size of the flat portion 111 as described above. That is, the display panel 130 may be formed such that a width of the display panel 130 is less than a width of the cover window 110, and the adhesive layer 120 may be formed such that a width of the adhesive layer 120 is less than the width of the display panel 130. Accordingly, when the second jig 220 is moved toward the first jig 210, the adhesive layer 120 contacts one surface of the flat portion 111. When the second driving unit 225 continuously operates, the adhesive layer 120 contacting the flat portion 111 is compressed against the flat portion 111. Thus, the display panel 130 and the cover window 110 may be attached to each other through lamination.

In particular, when the cover window 110 and the display panel 130 contact each other, a load range applied when the first jig 210 and the second jig 220 compress the cover window 110 and the display panel 130 may be greater than or equal to 0.3 MPa and less than or equal to 0.5 MPa. When the load range is less than 0.3 MPa, an adhesive force between the cover window 110 and the display panel 130 may be reduced, and the cover window 110 and the display panel 130 may be delaminated and separated from each other. In addition, when the load range exceeds 0.5 MPa and the cover window 110 and the display panel 130 are attached to each other, the cover window 110 and the display panel 130 may be damaged, thereby reducing quality and reliability.

The operation may be performed, for example in an atmospheric state or a vacuum state (such as a near vacuum state). The apparatus 200 may include the first jig 210, and the chamber C in which the second jig 220 is disposed. In addition, the apparatus 200 may include a pressure adjustment unit that adjusts a pressure of the chamber C. When a pressure in the chamber C is maintained in a vacuum state, vapor formation between the cover window 110 and the display panel 130 when the cover window 110 and the display panel 130 are laminated may be effectively prevented.

Accordingly, the method may rapidly and accurately manufacture the display device 100 having a curved shape. Since the method accurately laminates the cover window 110 having a curved shape to the display panel 130, a defect rate may be reduced or minimized, and product quality may be improved.

Figure 5:
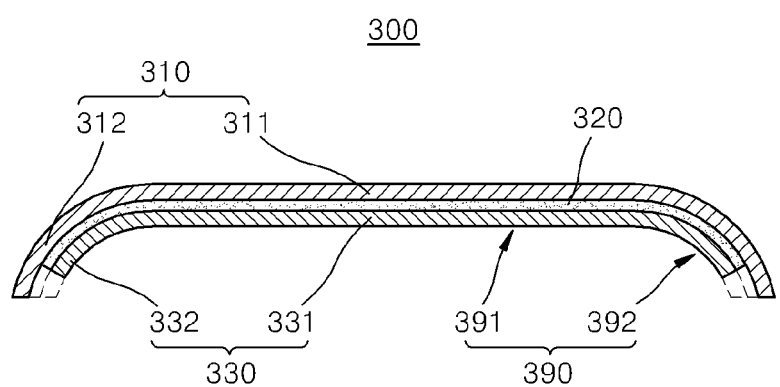
FIG. 5 is a cross-sectional view illustrating a display device according to another embodiment of the present invention.

FIG. 5 is a cross-sectional view illustrating a display device 300 according to another embodiment of the present invention.

Referring to FIG. 5, the display device 300 includes a cover window 310, a panel member 390, and an adhesive layer 320. The cover window 310 includes a flat portion 311 and curved portions 312. The cover window 310 and the adhesive layer 320 are substantially the same as the cover window 110 and adhesive layer 120 of FIG. 1 and thus, a detailed description thereof will not be repeated.

The panel member 390 may include a first panel member 391 that is seated on the flat portion 311. In addition, the panel member 390 may include a second panel member 392 at least a portion of which is seated on the curved portions 312. The panel member 390 may include at least one of the display panel 330 or the TSP as described above. For convenience of description, it will be assumed that the panel member 390 includes the display panel 330.

In further detail, the display panel 330 includes a first display panel portion 331 that is laminated on the flat portion 311. In addition, the display panel 330 includes second display panel portions 332 that extend from the first display panel portion 331 and are laminated or partially laminated on the curved portions 312. The second display panel portions 332 extend in a curved shape from the first display panel portion 331. Accordingly, since the display device 300 includes the cover window 310 that is curved and the display device 300 displays through a flat portion 311 and a curved portion 312, a larger or maximum active area may be obtained. Further, due to the inward curvature of the cover window 310, the display panel 330 may be smaller in the at least one of a length or a width than the cover window 310. In addition, the display device 300 that is partially curved may be attached to various electronic devices, and may easily display images having various shapes. For convenience of description, however, it will be assumed that the display panel 330 is shorter in width than the cover window 310 as described below in further detail.

A method of manufacturing the display device 300 will now be described with reference to FIGS. 6 through 7C.

Figure 6:
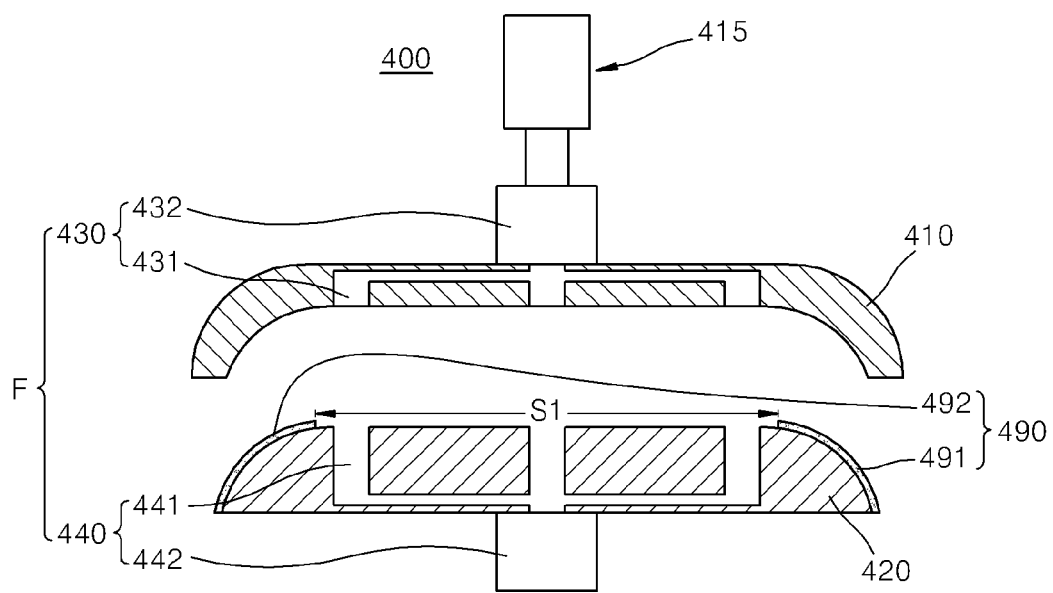
FIG. 6 is a cross-sectional view illustrating an apparatus for manufacturing the display device of FIG. 5 according to an embodiment of the present invention.
Figure 7A:
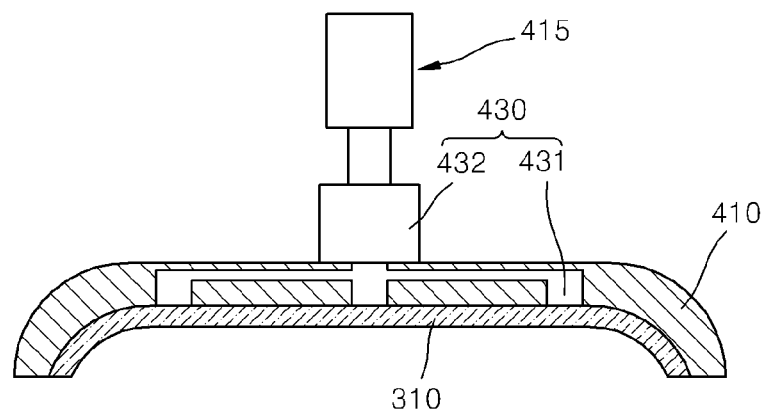
FIGS. 7A through 7C are cross-sectional views illustrating a method of manufacturing the display device of FIG. 5 according to an embodiment of the present invention.
Figure 7B:
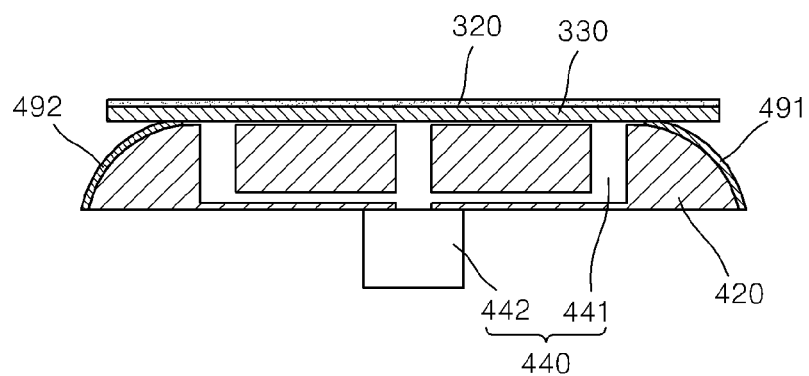

FIG. 6 is a cross-sectional view illustrating an apparatus 400 for manufacturing the display device 300 of FIG. 5 according to an embodiment of the present invention. FIGS. 7A through 7C are cross-sectional views illustrating a method of manufacturing the display device 300 of FIG. 5 according to an embodiment of the present invention. The same members as those of FIG. 5 are denoted by the same reference numerals.

Figure 7C:
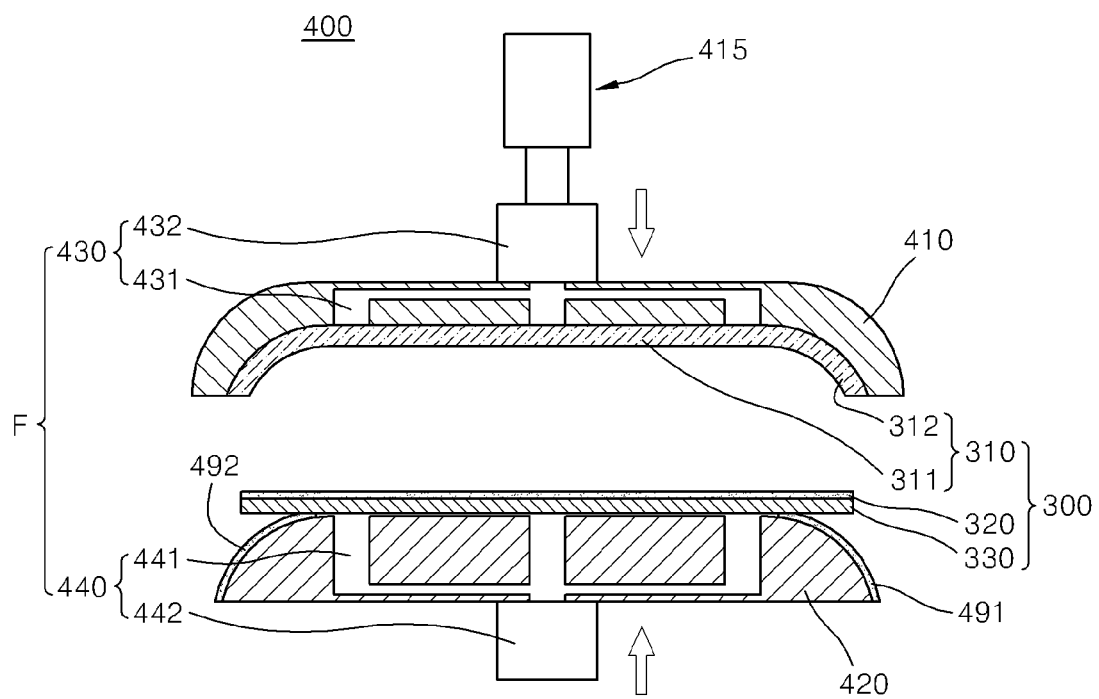

Referring to FIGS. 6 through 7C, the apparatus 400 includes a first jig 410, a second jig 420, a driving unit (such as first driving unit 415), and a fixing unit F (for example, first fixing unit 430 and second fixing unit 440). The first jig 410, the second jig 420, the driving unit, and the fixing unit F are similar to the first jig 210, the second jig 220, the driving unit (for example, the second driving unit 225), and the fixing unit (for example, second fixing unit 240), respectively, as described above and thus, a detailed description thereof will not be repeated.

The driving unit may include the first driving unit 415 and a second driving unit, and the fixing unit F includes the first fixing unit 430 and the second fixing unit 440. The first driving unit 415, the second driving unit, the first fixing unit 430, and the second fixing unit 440 are substantially the same as the first driving unit, the second driving unit 225, the first fixing unit, and the second fixing unit 240, respectively, as described above and thus, a detailed description thereof will not be repeated. However, it will be assumed that the driving unit including only the first driving unit 415 operates.

The apparatus 400 may include a cushion unit 490 provided on or a part of at least one of the first jig 410 or the second jig 420. In this embodiment, a thickness of the cushion unit 490 may be greater than or equal to 0.5 mm and less than or equal to 3 mm. For convenience of description, however, it will be assumed that the cushion unit 490 is part of a surface of the second jig 420.

In FIGS. 6 through 7C, a plurality of cushion units 490 are part of respective end portions of the second jig 420 to face the first jig 410. The cushion units 490 include a first cushion unit 491 and a second cushion unit 492 that are part of a surface of the second jig 420 and spaced apart by a set interval (for example, a predetermined interval) from each other. The distance S1 between the first cushion unit 491 and the second cushion unit 492 is less than the at least one of a length or a width of the display panel 330. For convenience of description, however, it will be assumed that the distance S1 between the first cushion unit 491 and the second cushion unit 492 is less than the width of the display panel 330.

The cushion units 490 support the display panel 330 and help prevent air bubbles from being formed between the display panel 330 and the curved portions 312 when the second jig 420 and the first jig 410 are moved toward each other with the display panel 330 and the cover window 310, respectively, therebetween.

Accordingly, the apparatus 400 may rapidly and easily manufacture the display device 300 having a curved shape and a simple structure. In addition, since the apparatus 400 may accurately laminate the cover window 310 having a curved shape to the display panel 330, a defect rate may be reduced or minimized. Further, since the apparatus 400 (such as the second jig 420) includes the cushion unit 490, a defect rate that may increase during lamination of the display panel 330 to the cover window 310 on the curved portions 312 may be reduced.

A method of manufacturing the display device 300 will now be described with reference to FIGS. 6 through 7C.

A method of manufacturing the display device 300 by using the apparatus 400 is similar to that described above. For example, the cover window 310 and the display panel 330 may be manufactured as described above and may be mounted on the first jig 410 and the second jig 420, respectively (see FIG. 7A). Next, the first fixing unit 430 and the second fixing unit 440 respectively fix the cover window 310 and the display panel 330 to the first jig 410 and the second jig 420. When a first absorption pump 432 operates, a first absorption unit 431 is maintained in a vacuum (or near vacuum) state. Likewise, when a second absorption pump 442 operates, a second absorption unit 441 is maintained in a vacuum (or near vacuum) state. Accordingly, the cover window 310 and the display panel 330 are fixed to the first jig 410 and the second jig 420, respectively.

In FIGS. 6 through 7C, the first jig 410 is higher than the second jig 420 (for example, in a gravity direction). At least one of the first jig 410 or the second jig 420 then moves towards the other. For example, the first jig 410 may move toward the second jig 420, or the second jig 420 may move toward the first jig 410. In other embodiments, both the first jig 410 and the second jig 420 move closer to each other. However, for convenience of description, it will be assumed that the first jig 410 moves toward the second jig 420. When the first jig 410 moves toward the second jig 420, the first driving unit 415 operates. When the first driving unit 415 continuously operates, a curved surface of the cover window 310 contacts the adhesive layer 320.

At first, the display panel 330 and the adhesive layer 320 may be flat against the second jig 420. Then, when the adhesive layer 320 and the cover window 310 contact each other, both ends of the display panel 330 and the adhesive layer 320 may be curved (for example, through contact with the cover window 310 that is curved). Next, a first display panel portion 331 (that is flat) and second display panel portions 332 (that are curved) of the display panel 330 are formed. Accordingly, the first display panel portion 331 and the second display panel portions 332 are formed when the display panel 330 is adhered to the flat portion 311 and the curved portions 312. The cover window 310 may be attached to the display panel 330 through lamination as the first driving unit 415 operates as described above (see FIGS. 5 and 7C). In other embodiments, the display panel 330 and the adhesive layer 320 may be bent along an outer surface of the second jig 420 when the display panel 330 and the adhesive layer 320 are mounted on the second jig 420.

In particular, when the cover window 310 and the display panel 330 contact each other, a load range applied when the first jig 410 and the second jig 420 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and thus the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. Since the method accurately laminates the cover window 310 having a curved shape to the display panel 330, a defect rate may be reduced or minimized. In addition, since the method removes air bubbles that may be formed (or prevents air bubbles from being formed) after the display panel 330 and the curved portions 312 are compressed, product quality may be improved.

Figure 8:
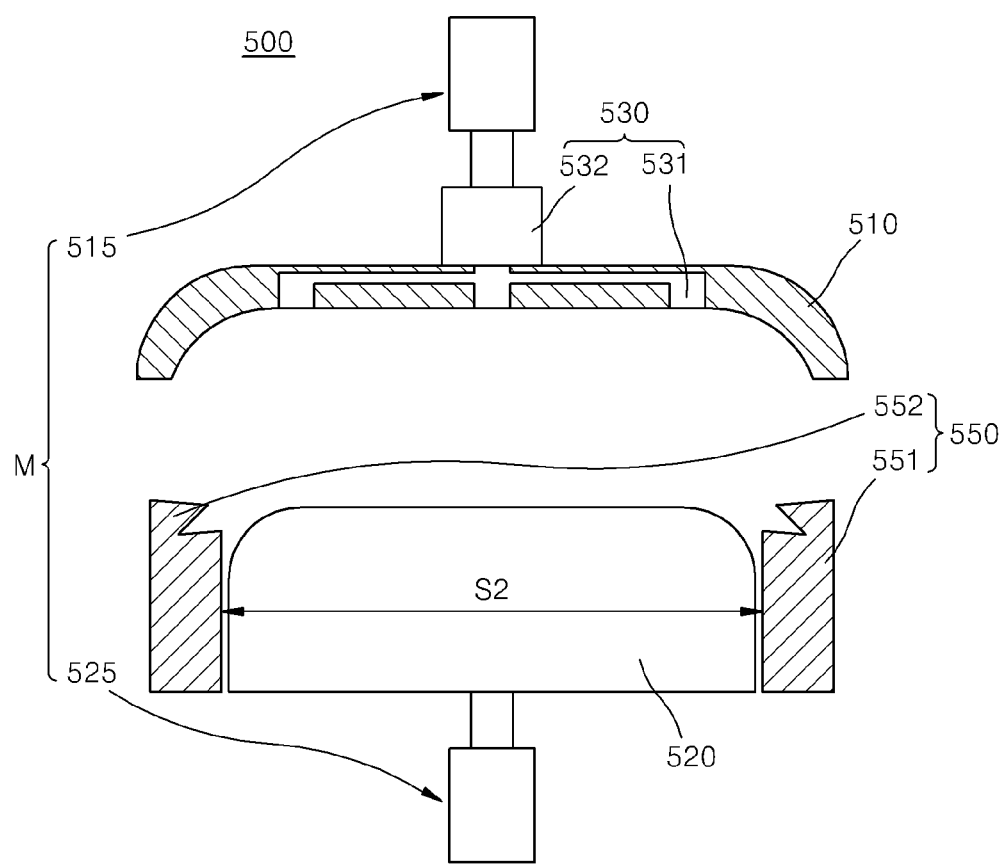
FIG. 8 is a cross-sectional view illustrating an apparatus for manufacturing the display device of FIG. 5 according to another embodiment of the present invention.

FIG. 8 is a cross-sectional view illustrating an apparatus 500 for manufacturing the display device 300 of FIG. 5 according to another embodiment of the present invention.

Figure 9A:
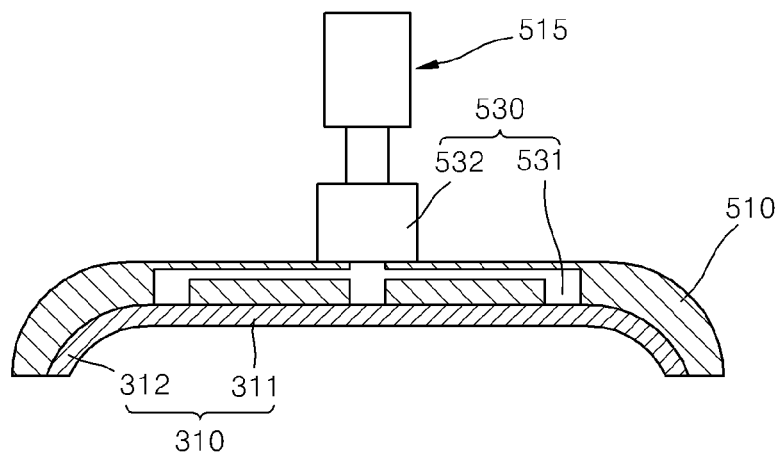
FIGS. 9A through 9C are cross-sectional views illustrating a method of manufacturing the display device of FIG. 5 according to another embodiment of the present invention.
Figure 9B:
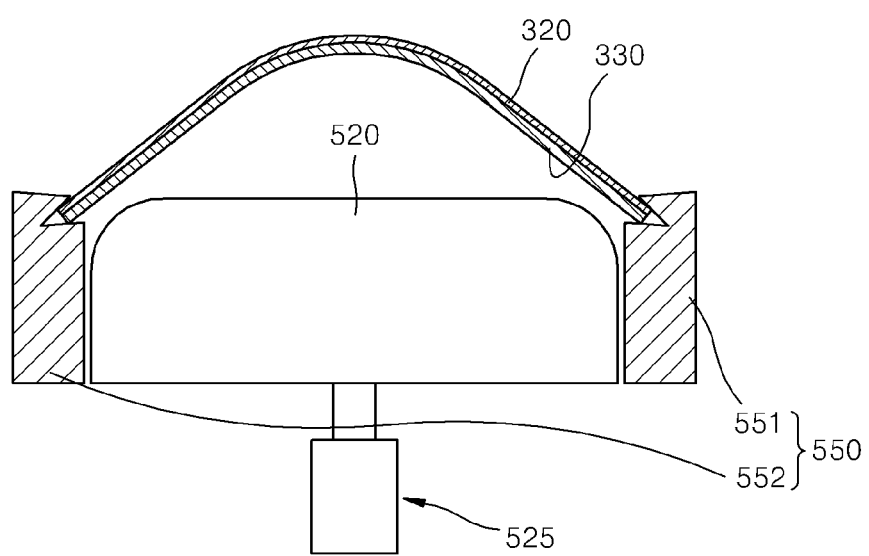
Figure 9C:
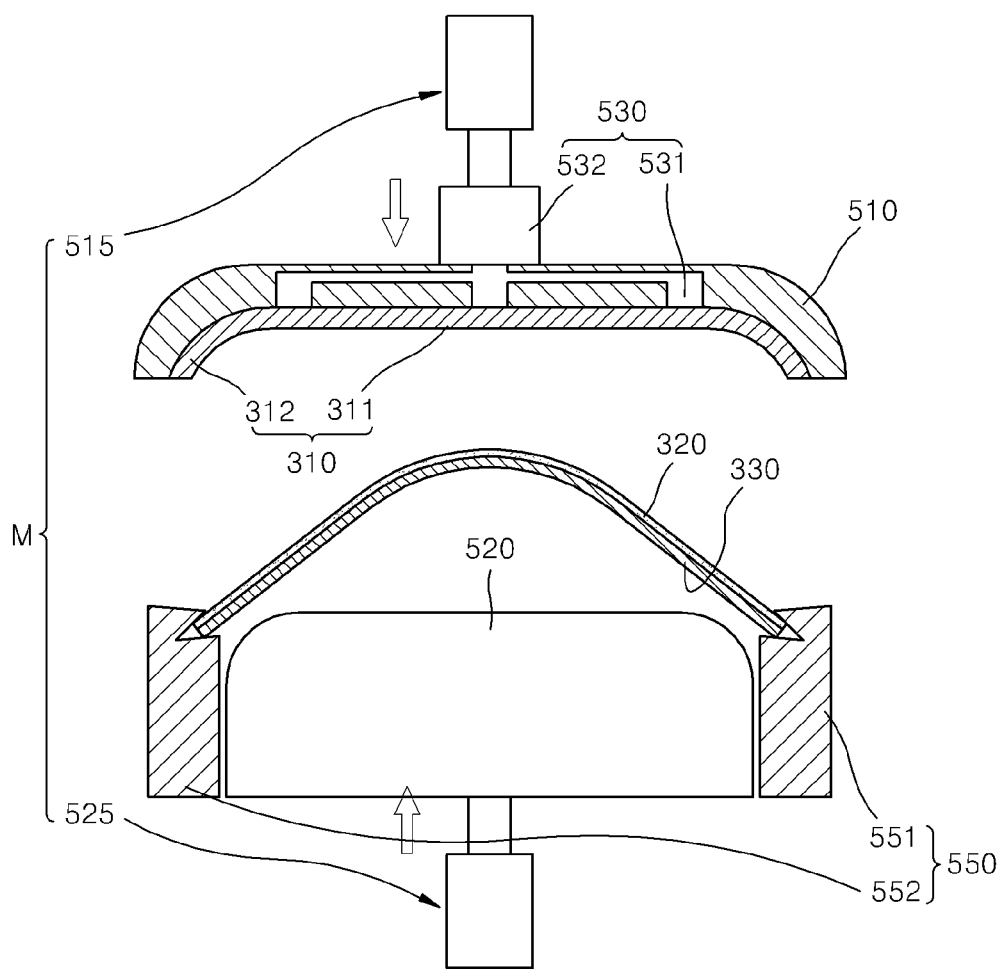

FIGS. 9A through 9C are cross-sectional views illustrating a method of manufacturing the display device 300 of FIG. 5 according to another embodiment of the present invention.

Referring to FIGS. 8 through 9C, the apparatus 500 includes a first jig 510, a second jig 520, a driving unit M (such as first driving unit 515 and second driving unit 525), and a fixing unit (for example, first fixing unit 530). The first jig 510, the second jig 520, the driving unit M, and the fixing unit are substantially the same as those described above and thus, a detailed description thereof will not be repeated. The driving unit M may include the first driving unit 515 and the second driving unit 525, and the fixing unit includes the first fixing unit 530 (including first absorption unit 531 and first absorption pump 532). The first driving unit 515, the second driving unit 525, and the first fixing unit 530 are substantially the same as those described above and thus, a detailed description thereof will not be repeated.

The apparatus 500 includes a clamping unit 550 that is spaced apart by a set interval (for example, a predetermined interval) from the second jig 520, and supports the display panel 330 to which the adhesive layer 320 is applied. In other embodiments, the clamping unit 550 may be spaced apart by a set interval (for example, a predetermined interval) from the first jig 510, and supports the cover window 310. For convenience of description, however, it will be assumed that the clamping unit 550 is disposed adjacent to the second jig 520.

The clamping unit 550 supports one or more ends of the display panel 330 and the adhesive layer 320 when they are inserted into the clamping unit 550. In FIGS. 8 through 9C, a plurality of clamping units 550 are provided, where a distance between the clamping units 550 is less than the at least one of a length or a width of the panel member (for example, display panel 330) when the clamping units 550 are fixing the display panel 330. The panel member may include at least one of the display panel 330 or the TSP as described above. Particularly, each of the clamping units 550 is placed at both ends of the cover window 310 in the direction of the at least one of a width or a length of the cover window 310. For convenience of description, however, it will be assumed that a distance between the plurality of clamping units 550 is less than a width of the display panel 330 and the panel member includes the display panel 330.

In FIGS. 8 through 9C, the clamping units 550 face respective side surfaces of the second jig 520, and fix respective ends of the display panel 330 and the adhesive layer 320. The clamping units 550 include a first clamping unit 551 and a second clamping unit 552 that are spaced apart by a set interval (for example, a predetermined interval) from each other.

Accordingly, the apparatus 500 may rapidly and easily manufacture the display device 300 having a curved shape and a simple structure. In addition, since the apparatus 500 may accurately laminate the cover window 310 having a curved shape to the display panel 330, a defect rate may be reduced or minimized. Further, since the apparatus 500 includes the clamping unit 550 to accurately align the display panel 330 and the cover window 310, working efficiency may be improved.

A method of manufacturing the display device 300 by using the apparatus 500 will now be described with reference to FIGS. 9A through 9C.

First, the cover window 310 is formed, the display panel 330 is formed, and then the adhesive layer 320 is attached to the display panel 330. The cover window 310 may be mounted on the first jig 510 as described above (see FIG. 9A). Next, respective ends of the display panel 330 on which the adhesive layer 320 is attached are fixed to the first clamping unit 551 and the second clamping unit 552. For example, the respective ends of the display panel 330 may be fixed by being inserted into insertion grooves formed in the first clamping unit 551 and the second clamping unit 552.

Once the display panel 330 and the adhesive layer 320 are fixed in this manner, middle portions of the display panel 330 and the adhesive layer 320 are curved upward (for example, with respect to a gravity direction). As shown in FIGS. 9B and 9C, since a distance S2 between the first clamping unit 551 and the second clamping unit 552 is less than at least one of a width or a length of the display panel 330, the middle portions of the display panel 330 protrude toward the first jig 510. When the display panel 330 and the adhesive layer 320 are fixed, the display panel 330, the adhesive layer 320, and the cover window 310 may be compressed by moving at least one of the first jig 510 or the second jig 520. For convenience of description, it will be assumed that the display panel 330, the adhesive layer 320, and the cover window 310 are compressed by moving both the first jig 510 and the second jig 520.

When the first jig 510 and the second jig 520 move, the first driving unit 515 and the second driving unit 525 may operate to move the first jig 510 and the second jig 520 closer to each other. The middle portions of the display panel 330 and the adhesive layer 320 (which are curved downward) then contact the cover window 310. For example, the middle portions of the display panel 330 and the adhesive layer 320 may first contact a portion of the flat portion 311. When the first jig 510 and the second jig 520 continuously move, the display panel 330 and the adhesive layer 320 are adhered to the cover window 310 from the flat portion 311 as the first contacting portion to the curved portions 312. That is, the display panel 330, the adhesive layer 320, and the cover window 310 contact in an order from the flat portion 311 to the curved portions 312.

At some point (for example, after the adhesive layer 320 contacts the flat portion 311), the second jig 520 may contact the display panel 330, the display panel 330 may detach from the clamping unit 550, and the first jig 510 and the second jig 520 may move closer to each other to further laminate the display panel 330 to the cover window 310.

In particular, when the cover window 310 and the display panel 330 contact each other as described above, a load range applied when the first jig 510 and the second jig 520 compress the cover window 310 and the display panel 330 may be greater than or equal to 0.3 MPa and equal or less than 0.5 MPa. When the load range is less than 0.3 MPa, an adhesive force between the cover window 310 and the display panel 330 may be reduced, and thus the cover window 310 and the display panel 330 may be delaminated and separated from each other. In addition, when the load range exceeds 0.5 MPa, when the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. In addition, since the method may accurately laminate the cover window 310 having a curved shape to the display panel 330, a defect rate may be reduced or minimized. Further, since the method removes air bubbles that may be formed (or prevents air bubbles from being formed) after the display panel 330 and the curved portions 312 are compressed, product quality may be improved.

According to embodiments of the present invention, since a cover window that is partially curved and a display panel are rapidly and accurately laminated to each other, mass production, high reliability, and high quality may be achieved. In addition, since a display device may be manufactured rapidly, manufacturing time and costs may be reduced.

Figure 10:
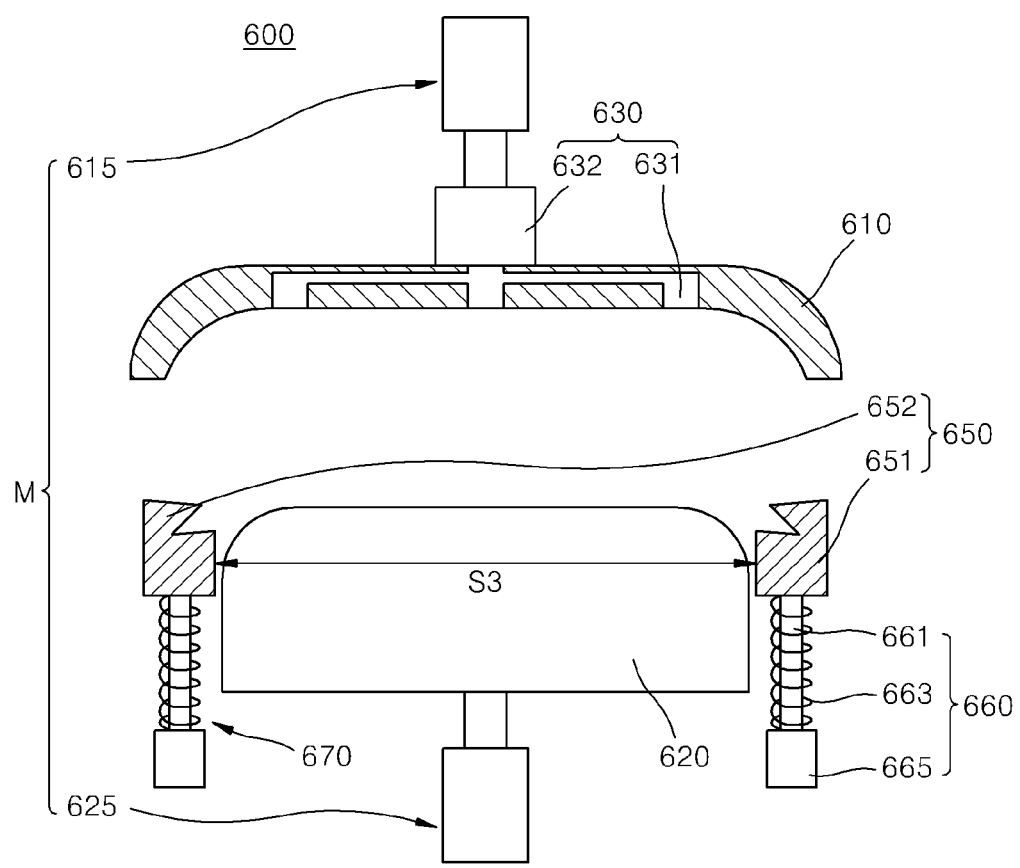
FIG. 10 is a cross-sectional view illustrating an apparatus for manufacturing the display device of FIG. 5 according to yet another embodiment of the present invention.
Figure 11:
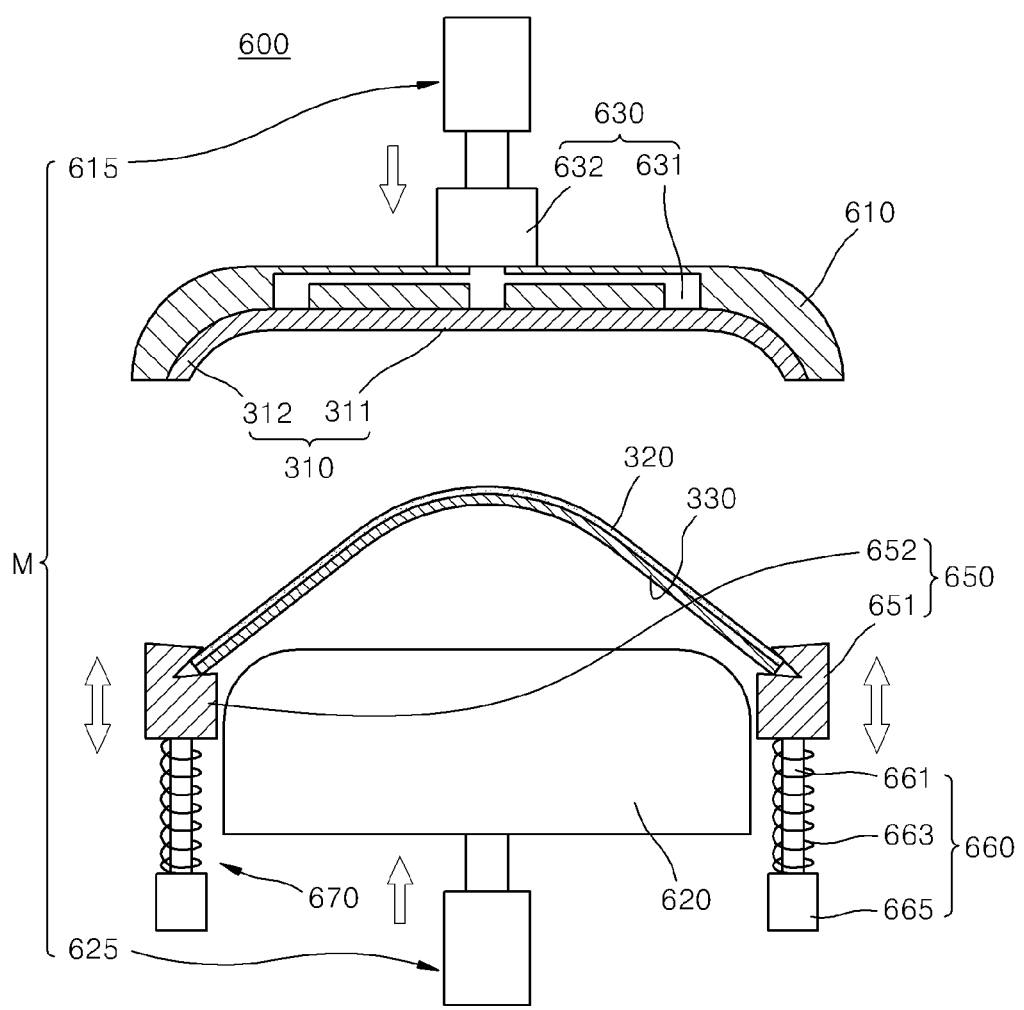
FIG. 11 is a cross-sectional view illustrating a method of manufacturing the display device of FIG. 5 according to yet another embodiment of the present invention.

FIG. 10 is a cross-sectional view illustrating an apparatus 600 for manufacturing the display device 300 of FIG. 5 according to yet another embodiment of the present invention. FIG. 11 is a cross-sectional view illustrating a method of manufacturing the display device 300 of FIG. 5 according to yet another embodiment of the present invention.

Referring to FIGS. 10 and 11, the apparatus 600 includes a first jig 610, a second jig 620, a driving unit M (including first driving unit 615 and second driving unit 625), a clamping unit 650, and a fixing unit (for example, first fixing unit 630). The first jig 610 and the second jig 620 may be substantially the same as those described above and thus, a detailed description thereof will not be repeated.

The driving unit M may include the first driving unit 615 and the second driving unit 625, and the fixing unit may include the first fixing unit 630. The first driving unit 615, the second driving unit 625, and the first fixing unit 630 may be substantially the same as those described above and thus, a detailed description thereof will not be repeated. The first fixing unit 630 may include a first absorption unit 631 and a first absorption pump 632.

The clamping unit 650 may include a first clamping unit 651 and a second clamping unit 652. The first clamping unit 651 and the second clamping unit 652 may be substantially the same as those described above and thus, a detailed description thereof will not be repeated.

The apparatus 600 may include a first linear driving unit 660 and a second linear driving unit 670 which respectively vertically move the first clamping unit 651 and the second clamping unit 652 (for example, in a vertical direction with respect to gravity). The first linear driving unit 660 and the second linear driving unit 670 may be formed similarly and thus, the following description will focus on the first linear driving unit 660.

The first linear driving unit 660 may include a first shaft 661 that is connected to the first clamping unit 651 and linearly moves. In one embodiment, the first linear driving unit 660 may include a first driving module 665 that drives the first shaft 661. The first driving module 665 may include, for example, a cylinder or a motor. For convenience of description, however, it will be assumed that the first driving module 665 includes a motor. It will be further assumed that the first shaft 661 includes a ball screw that is lowered or raised as the first driving module 665 rotates.

The first linear driving unit 660 may include a first elastic unit 663 that surrounds the first shaft 661. The first elastic unit 663 may include a compression spring, and may be formed of an elastic material such as rubber. For convenience of description, however, it will be assumed that the first elastic unit 663 includes a compression spring. The first elastic unit 663 may surround an outer surface of the first shaft 661 as described above and thus may provide a restoring force to the first clamping unit 651 when the first clamping unit 651 moves.

A method of manufacturing the display device 300 by using the apparatus 600 will be described. The cover window 310 and a panel member (for example, display panel 330) may be formed, and then the adhesive layer 320 may be formed on the panel member. The panel member may include at least one of the display panel 330 or the TSP as described above. However, for convenience of description, it will be assumed that the panel member includes the display panel 330. Respective ends of the display panel 330 on which the adhesive layer 320 is formed may be fixed to the first clamping unit 651 and the second clamping unit 652. Once the display panel 330 is fixed to the first clamping unit 651 and the second clamping unit 652, middle portions of the display panel 330 and the adhesive layer 320 may be curved upward (for example, with respect to a gravity direction). In further detail, since a distance S3 between the first clamping unit 651 and the second clamping unit 652 is less than at least one of a width or a length of the display panel 330, the middle portions may protrude toward the first jig 610. In this case, it will be assumed that the distance S3 between the first clamping unit 651 and the second clamping unit 652 is less than a width of the display panel 330.

After the display panel 330 and the adhesive layer 320 are disposed in this manner, the display panel 330, the adhesive layer 320, and the cover window 310 may be compressed against one another by moving at least one of the first jig 610 or the second jig 620. For convenience of description, however, it will be assumed that the display panel 330, the adhesive layer 320, and the cover window 310 are compressed by moving both the first jig 610 and the second jig 620.

While the first jig 610 and the second jig 620 move in this manner, the first linear driving unit 660 and the second linear driving unit 670 may operate to vertically move the first clamping unit 651 and the second clamping unit 652. The first clamping unit 651 and the second clamping unit 652 may move at a speed similar to a speed at which the second jig 620 moves.

When the second jig 620, the first clamping unit 651, and the second clamping unit 652 are raised in this manner, the display panel 330 and the adhesive layer 320 may be raised while maintaining their curved states. When a distance between the first jig 610 and the second jig 620 reaches a set distance (for example, a predetermined distance), the first clamping unit 651 and the second clamping unit 652 may release from (for example, reduce their clamping force from) the display panel 330 and the adhesive layer 320. During or after this releasing of the first clamping unit 651 and the second clamping unit 652, the first linear driving unit 660 and the second linear driving unit 670 may lower the first clamping unit 651 and the second clamping unit 652.

Next, the first driving unit 615 and the second driving unit 625 may continuously operate to bring the first jig 610 and the second jig 620 closer (for example, adjacent) to each other (for example, the second jig 520 may contact the display panel 330). As the first jig 610 and the second jig 620 move closer, the display panel 330, the adhesive layer 320, and the cover window 310 may be compressed against one another (e.g., starting with the flat portion 311). A method of compressing the display panel 330, the adhesive layer 320, and the cover window 310 may be performed in the same manner as that described above and thus, a detailed description thereof will not be repeated.

In particular, when the cover window 310 and the display panel 330 contact each other, a load range applied when the first jig 610 and the second jig 620 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300 having a curved shape. Further, the method may reduce or minimize a defect rate by accurately laminating the cover window 310 having a curved shape to the display panel 330. In addition, the method may improve product quality by removing air bubbles that may be generated (or preventing air bubbles from being generated) after the display panel 330 and the curved portions 312 are compressed.

Figure 12:
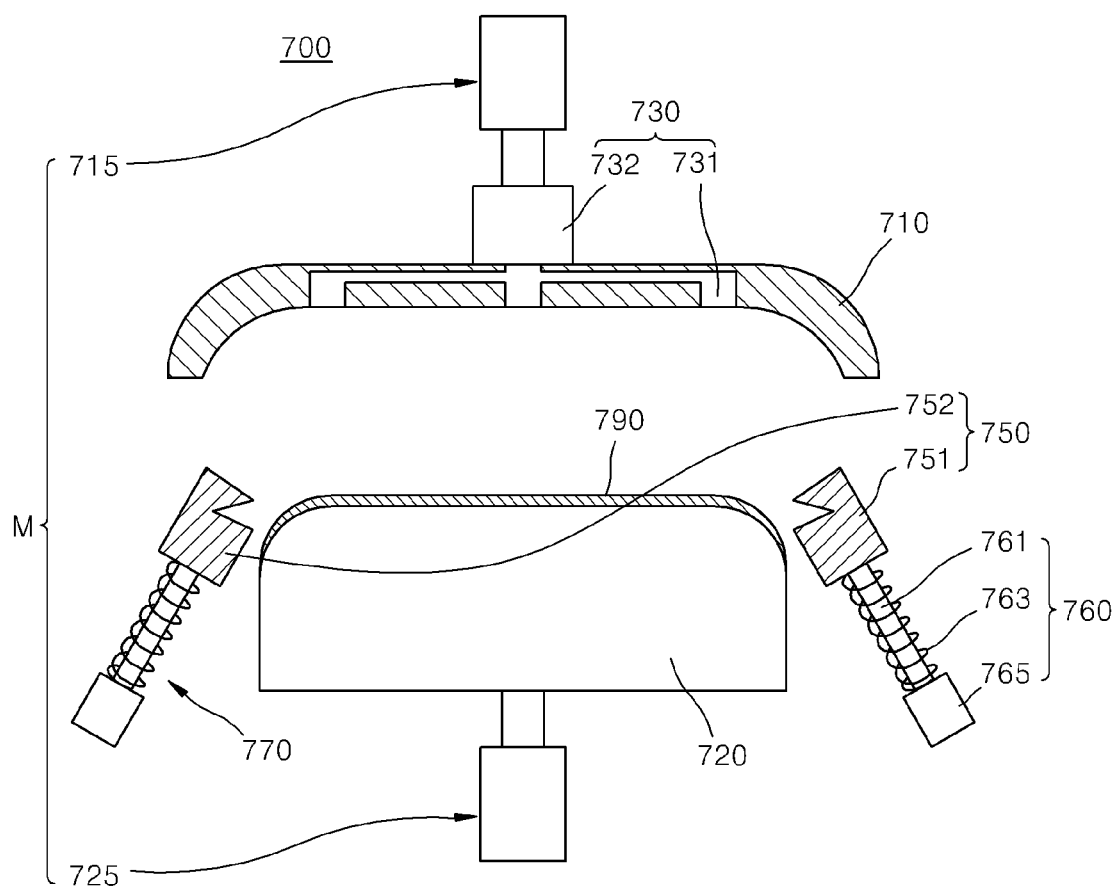
FIG. 12 is a cross-sectional view illustrating an apparatus for manufacturing the display device of FIG. 5 according to still yet another embodiment of the present invention.
Figure 13:
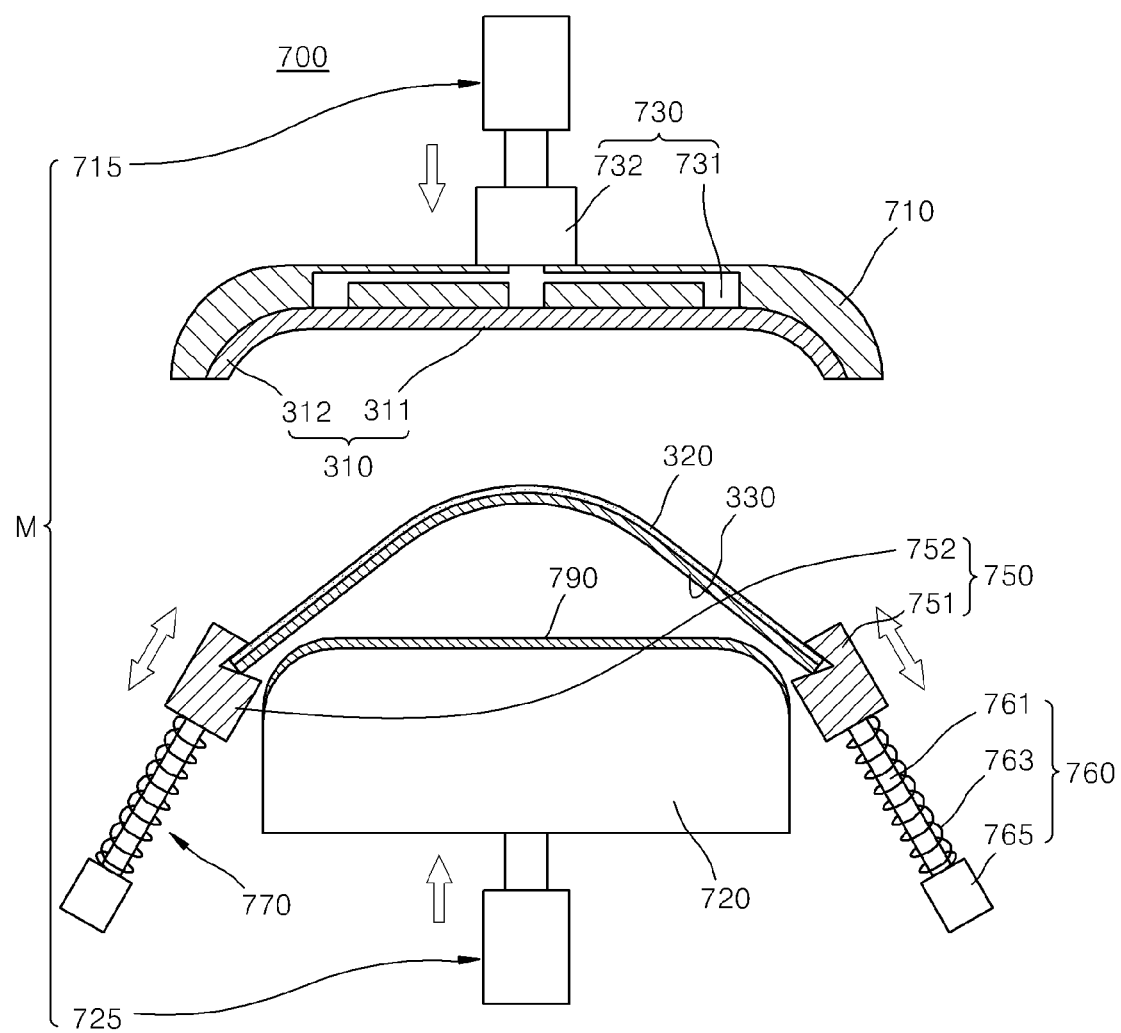
FIG. 13 is a cross-sectional view illustrating a method of manufacturing the display device of FIG. 5 according to still yet another embodiment of the present invention.

FIG. 12 is a cross-sectional view illustrating an apparatus 700 for manufacturing the display device 300 of FIG. 5 according to still yet another embodiment of the present invention. FIG. 13 is a cross-sectional view illustrating a method of manufacturing the display device 300 of FIG. 5 according to still yet another embodiment of the present invention.

Referring to FIGS. 12 and 13, the apparatus 700 may include a first jig 710, a second jig 720 (including a cushion unit 790), a driving unit M (including first driving unit 715 and second driving unit 725), a clamping unit 750 (including a first clamping unit 751 and a second clamping unit 752), a fixing unit (for example, first fixing unit 730), a first linear driving unit 760, and a second linear driving unit 770. The first jig 710 and the second jig 720 may be substantially the same as those described above and thus, a detailed description thereof will not be repeated.

The driving unit M may include the first driving unit 715 and the second driving unit 725, and the fixing unit may include the first fixing unit 730. The first driving unit 715, the second driving unit 725, and the first fixing unit 730 (which includes first absorption unit 731 and first absorption pump 732) may be substantially the same as those described above and thus, a detailed description thereof will not be repeated.

The first linear driving unit 760 and the second linear driving unit 770 may linearly move the first clamping unit 751 and the second clamping unit 752, respectively. The first linear driving unit 760 and the second linear driving unit 770 may linearly move the first clamping unit 751 and the second clamping unit 752 in a diagonal direction, respectively, with respect to the second jig 720 (and, for example, with respect to a gravity direction). Since the second linear driving unit 770 may be formed similarly to the first linear driving unit 760, the following description will focus on the first linear driving unit 760.

In further detail, the first linear driving unit 760 may include a first shaft 761, a first driving module 765, and a first elastic unit 763. The first shaft 761, the first driving module 765, and the first elastic unit 763 may be formed in a similar manner to those described above (such as the first linear driving unit 660 in FIGS. 10-11) except that the first shaft 761 is disposed in a diagonal direction to diagonally move the first clamping unit 751 with respect to the second jig 720.

When the first linear driving unit 760 operates, the first driving module 765 may vary a length of the first shaft 761. Since the first driving module 765 and the first shaft 761 are diagonally disposed with respect to the second jig 720 as described above, the first clamping unit 751 may be diagonally moved by varying the movement of the first shaft 761.

For example, when the first driving module 765 operates to diagonally move the first shaft 761 downward with respect to the second jig 720, the first clamping unit 751 may diagonally move downward with respect to the second jig 720 as the first shaft 761 moves. Likewise, when the first driving module 765 operates in an opposite direction to diagonally move the first shaft 761 upward with respect to the second jig 720, the first clamping unit 751 may diagonally move upward with respect to the second jig 720 as the first shaft 761 moves. The first shaft 761 may include a ball screw as described above and thus may rotate as the first driving module 765 operates. The first shaft 761 may diagonally move downward or upward with respect to the second jig 720 as the first driving module 765 rotates.

The cushion unit 790 may be formed in various ways. For example, the cushion unit 790 may be part of an outer surface (e.g., a contacting surface, such as a surface that contacts the cover window 310 or the display panel 330) of at least one of the first jig 710 or the second jig 720. In another embodiment, the cushion unit 790 may be part of a portion of such an outer surface of at least one of the first jig 710 or the second jig 720. In another embodiment, the cushion unit 790 is part of the apparatus 700 and covers such an outer surface of at least one of the first jig 710 or the second jig 720. For ease of description, it will be assumed that the cushion unit 790 is part of an entire such outer surface of the second jig 720.

A method of manufacturing the display device 300 may be similar to that described above. In further detail, a panel member (for example, display panel 330) and the cover window 310 may be prepared, and then the adhesive layer 320 may be applied to the panel member. The panel member may include the display panel 330 and the TSP as described above. However, for convenience of description, it will be assumed that the panel member includes the display panel 330. The display panel 330 to which the adhesive layer 320 is applied may be fixed by the first clamping unit 751 and the second clamping unit 752. When the fixing is completed, the display panel 330, the adhesive layer 320, and the cover window 310 may be compressed against one another by moving at least one of the first jig 710 or the second jig 720. A method of compressing the display panel 330, the adhesive layer 320, and the cover window 310 may be similar to that described above and thus, a detailed description thereof will not be repeated.

When the first jig 710 and the second jig 720 move in this manner, the first clamping unit 751 and the second clamping unit 752 may also move. The first clamping unit 751 and the second clamping unit 752 may be diagonally moved by the first linear driving unit 760 and the second linear driving unit 770, respectively. The first clamping unit 751 and the second clamping unit 752 may be raised diagonally with respect to the second jig 720.

When the first clamping unit 751 and the second clamping unit 752 are raised and then an interval between the first jig 710 and the second jig 720 reaches a preset interval, both ends of the display panel 330 may be released from the clamping unit 750. The display panel 330 may be laminated to the cover window 310 by the adhesive layer 320 beginning from a middle portion of the display panel 330 (corresponding to the flat portion 311 of the cover window 310).

During or after the releasing of the first clamping unit 751 and the second clamping unit 752 from the display panel 330, the first linear driving unit 760 and the second linear driving unit 770 may operate to lower the first clamping unit 751 and the second clamping unit 752. The first clamping unit 751 and the second clamping unit 752 may be lowered diagonally with respect to the second jig 720. While the first clamping unit 751 and the second clamping unit 752 are lowered, the first jig 710 and the second jig 720 may get closer to each other to compress the display panel 330, the adhesive layer 320, and the cover window 310 against one another. For example, the second jig 720 may contact the display panel 330. A method of adhering the display panel 330 and the cover window 310 through compression may be similar to that described above.

When the display panel 330 and the cover window 310 are compressed by moving the first jig 710 and the second jig 720, the cushion unit 790 may spread a force applied to the display panel 330 and the cover window 310. In addition, the cushion unit 790 may help prevent the display panel 330 or the cover window 310 from being damaged by partially absorbing a force applied to the display panel 330 and the cover window 310.

In particular, when the cover window 310 and the display panel 330 contact each other, a load range applied when the first jig 710 and the second jig 720 compress the cover window 310 and the display panel 330 may be greater than or equal to 0.3 MPa and less than or equal to 0.5 MPa. When the load range is less than 0.3 MPa, an adhesive force between the cover window 310 and the display panel 330 may be reduced, and the cover window 310 and the display panel 330 may be delaminated and separated from each other. In addition, when the load range exceeds 0.5 MPa and the cover window 310 and the display panel 330 are attached to each other, the cover window 310 and the display panel 330 may be damaged, thereby reducing quality and reliability.

Accordingly, the method may rapidly and accurately manufacture the display device 300. Further, the method may reduce or minimize a defect rate by accurately laminating the cover window 310 having a curved surface to the display panel 330. In addition, the method may improve product quality by removing air bubbles that may be generated (or preventing air bubbles from being generated) after the display panel 330 and the curved portions 312 are compressed.

Figure 14:
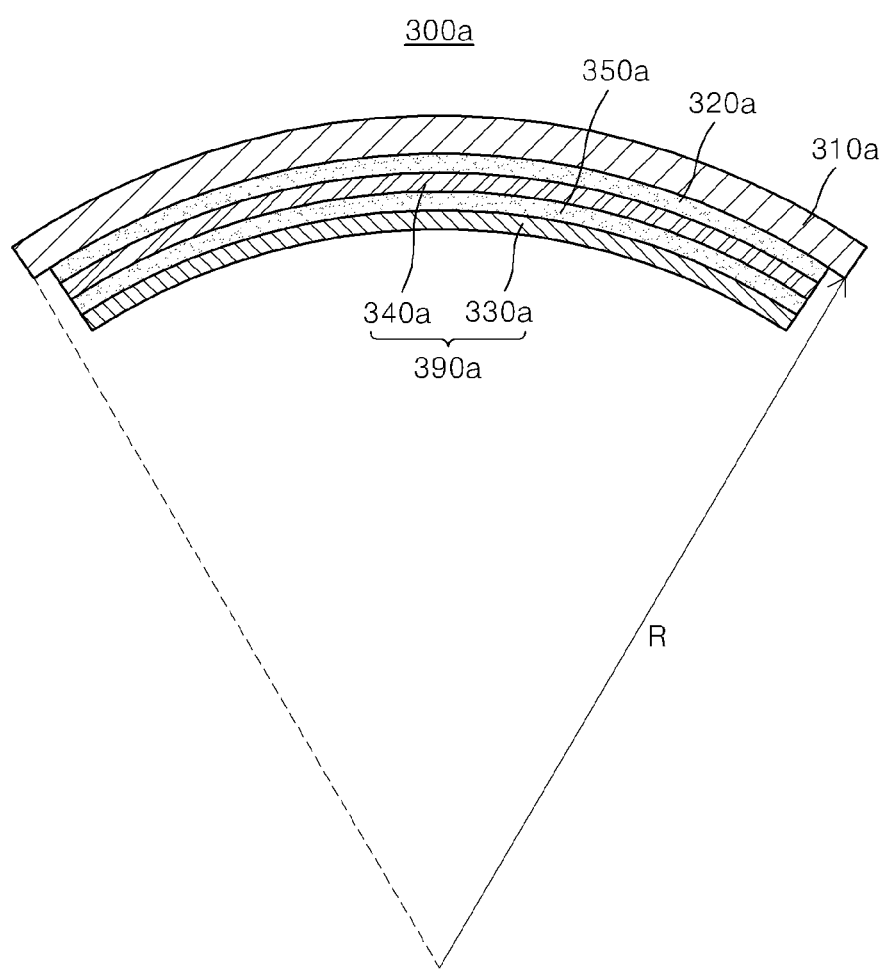
FIG. 14 is a cross-sectional view illustrating a display device according to yet another embodiment of the present invention.

FIG. 14 is a cross-sectional view illustrating a display device 300a according to yet another embodiment of the present invention.

Referring to FIG. 14, the display device 300a may include a cover window 310a and a panel member 390a as described above. In addition, the display device 300a may include a first adhesive layer 320a that is disposed between a panel member 390a and the cover window 310a. The panel member 390a may include a display panel 330a and a TSP 340a as described above. In particular, a second adhesive layer 350a may be provided between the display panel 330a and the TSP 340a to attach the display panel 330a and the TSP 340a.

The cover window 310a may be formed such that at least a portion of the cover window 310a is curved. In particular, the cover window 310 may be formed to have a curved surface having a curvature radius of R. The cover window 310a may be formed to have a curved surface having a set or predetermined curvature radius in at least one of a longitudinal direction or a width direction. In addition, the cover window 310a may be formed such that a surface on which an image or text is displayed after the panel member 390a is attached is convex. However, for convenience of description, it will be assumed that the cover window 310 is formed to have a curved surface having a set or predetermined curvature radius and the curved surface is formed in a width direction of the cover window 310a.

The first adhesive layer 320a and the second adhesive layer 350a may be formed of the same material. In further detail, the first adhesive layer 320a and the second adhesive layer 350a may be formed of a transparent material having an adhesive force. For example, the first adhesive layer 320a and the second adhesive layer 350a may include an optical clear adhesive (OCA) film or an adhesive material.

Accordingly, since the display device 300a is formed to have a set or predetermined curvature radius, the display device 300a may be provided on various members.

Figure 15:
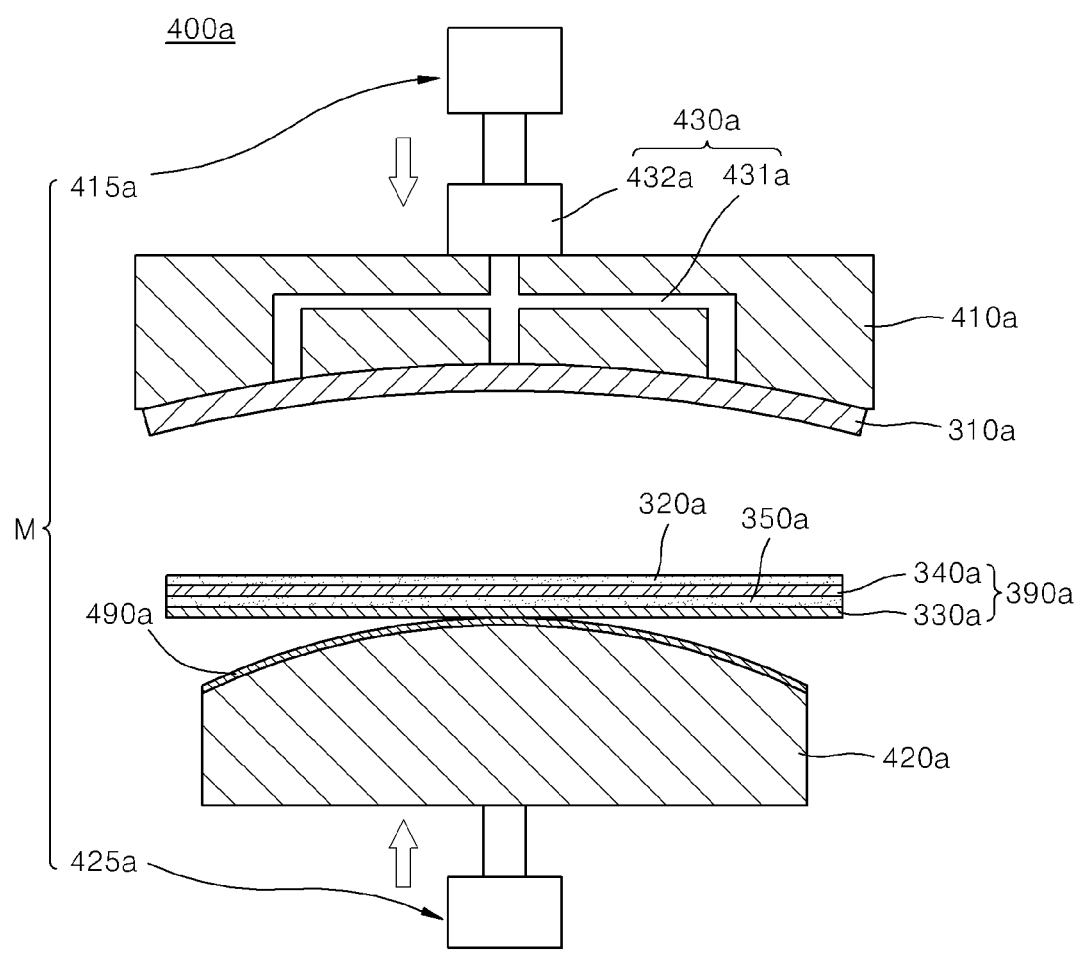
FIG. 15 is a cross-sectional view illustrating an apparatus for manufacturing the display device of FIG. 14, according to an embodiment of the present invention.

FIG. 15 is a cross-sectional view illustrating an apparatus 400a for manufacturing the display device 300a of FIG. 14, according to an embodiment of the present invention.

Referring to FIG. 15, the apparatus 400a may include a first jig 410a, a second jig 420a, a driving unit M, a fixing unit (for example, first fixing unit 430a), and a cushion unit 490a. At least a portion of the first jig 410a may be formed equally or similarly to an outer surface of the cover window 310a. In further detail, the first jig 410a may have a curved surface on which the cover window 310a having a curved surface with a set or predetermined curvature radius is seated. In particular, the first jig 410a may be recessed away from the second jig 420a.

An outer surface of the second jig 420a may protrude toward the first jig 410a to correspond to or engage with a recessed portion of the first jig 410a. The outer surface of the second jig 420a may be a curved surface having a set or predetermined curvature radius.

The driving unit M may include a first driving unit 415a and a second driving unit 425a. The first driving unit 415a may linearly move the first jig 410a toward the second jig 420a, and the second driving unit 425a may linearly move the second jig 420a toward the first jig 410a. The first driving unit 415a and the second driving unit 425a may be formed in the same manner as or a similar manner to those described above.

In addition, the fixing unit may include a first fixing unit 430a provided on the first jig 410a and a second fixing unit provided on the second jig 420a. For convenience of description, it will be assumed that the fixing unit includes the first fixing unit 430a. In addition, the first fixing unit 430a and the second fixing unit may be formed in the same manner or a similar manner, and thus a detailed description of the second fixing unit will not be given.

The first fixing unit 430a may be formed in various ways. For example, the first fixing unit 430a may include an adhesive member, an adhesive chuck, or an electrostatic chuck. In addition, the first fixing unit 430a may include a first absorption unit 431a and a first absorption pump 432a that is connected to the first absorption unit 431a. In particular, the first fixing unit 430a is not limited thereto, and may include a clamp, or a protrusion that is provided on the first jig 410a and mechanically restricts the cover window 310a. However, for convenience of description, it will be assumed that the first fixing unit 430a includes the first absorption unit 431a and the first absorption pump 432a.

The cushion unit 490a may be provided on at least one of the first jig 410a or the second jig 420a. In this case, the cushion unit 490a is the same as or similar to that described above, and thus a detailed explanation thereof will not be repeated. In addition, for convenience of description, it will be assumed that the cushion unit 490a is provided only on the second jig 420a and is integrally formed on an outer surface of the second jig 420a.

A method of manufacturing the display device 300a by using the apparatus 400a will now be described. First, the cover window 310a and the panel member 390a may be manufactured and prepared. In this case, a method of manufacturing the cover window 310a is similar to that described above, and thus a detailed description thereof will not be repeated. In addition, the TSP 340a and the display panel 330a may be adhered to each other by using the second adhesive layer 350a.

After the cover window 310a and the panel member 390a are manufactured and prepared as described above, the cover window 310a may be disposed on the first jig 410a. The cover window 310a may be formed to have a curved surface having a set or predetermined curvature radius of R as described above and may be seated on an outer surface of the first jig 410a. The first absorption pump 432a may operate to absorb (e.g., evacuate or vacuum) air out of the first absorption unit 431a, so that the cover window 310a may be fixed to the outer surface of the first jig 410a.

While the process is performed, the TSP 340a and the display panel 330a adhered by using the second adhesive layer 350a may be disposed on the second jig 420a. The display panel 330a may be disposed to face the second jig 420a, and the TSP 340a may be disposed to face the first jig 410a.

After the TSP 340a and the display panel 330a are disposed as described above, the first adhesive layer 320a may be coated on the TSP 340a. The first adhesive layer 320a may be formed of the same material as or a similar material to that of the second adhesive layer 350a.

When the cover window 310a, the TSP 340a, and the display panel 330a are completely disposed as described above, the first jig 410a and the second jig 420a may be moved toward each other by driving the first driving unit 415a and the second driving unit 425a. A protruding portion of the second jig 420a may first contact the display panel 330a, and the first adhesive layer 320a and the cover window 310a may be sequentially laminated from a central portion of the display panel 330a to both end portions.

In particular, when the cover window 310a and the panel member 390a contact each other, a load range applied when the first jig 410a and the second jig 420a compress the cover window 310a and the panel member 390a may be greater than or equal to 0.3 MPa and less than or equal to 0.5 MPa. When the load range is less than 0.3 MPa, an adhesive force between the cover window 310a and the panel member 390a may be reduced, and the cover window 310a and the panel member 390a may be delaminated and separated from each other. In addition, when the load range exceeds 0.5 MPa and the cover window 310a and the panel member 390a are attached to each other, the cover window 310a and the panel member 390a may be damaged, thereby reducing quality and reliability.

While the process is performed, the cushion unit 490a may uniformly distribute a force applied to the cover window 310a, the TSP 340a, and the display panel 330a.

When the process is completed, the first driving unit 415a and the second driving unit 425a may operate to separate the first jig 410a and the second jig 420a. An operator may complete an operation by removing the completed display device 300a from the first jig 410a or the second jig 420a.

The operation may be performed in a vacuum state. In further detail, the apparatus 400a may include a chamber (see, for example, chamber C in FIG. 4C) in which the first jig 410a, the second jig 420a, the fixing unit, and the driving unit M are disposed. In addition, the apparatus 400a may include a pressure adjustment unit that adjusts a pressure in the chamber. The pressure adjustment unit may maintain a pressure in the chamber in a vacuum state when the cover window 310a and the panel member 390a are laminated. In addition, the pressure adjustment unit may restore and maintain a pressure in the chamber in an atmospheric pressure state after a lamination process is completed.

Accordingly, the apparatus 400a may manufacture any type of display device 300a. In addition, the apparatus 400a may reduce or minimize a product defect rate by effectively removing vapors or preventing vapors from being generated between the cover window 310a and the panel member 390a when the cover window 310a and the panel member 390a are laminated.

Figure 16:
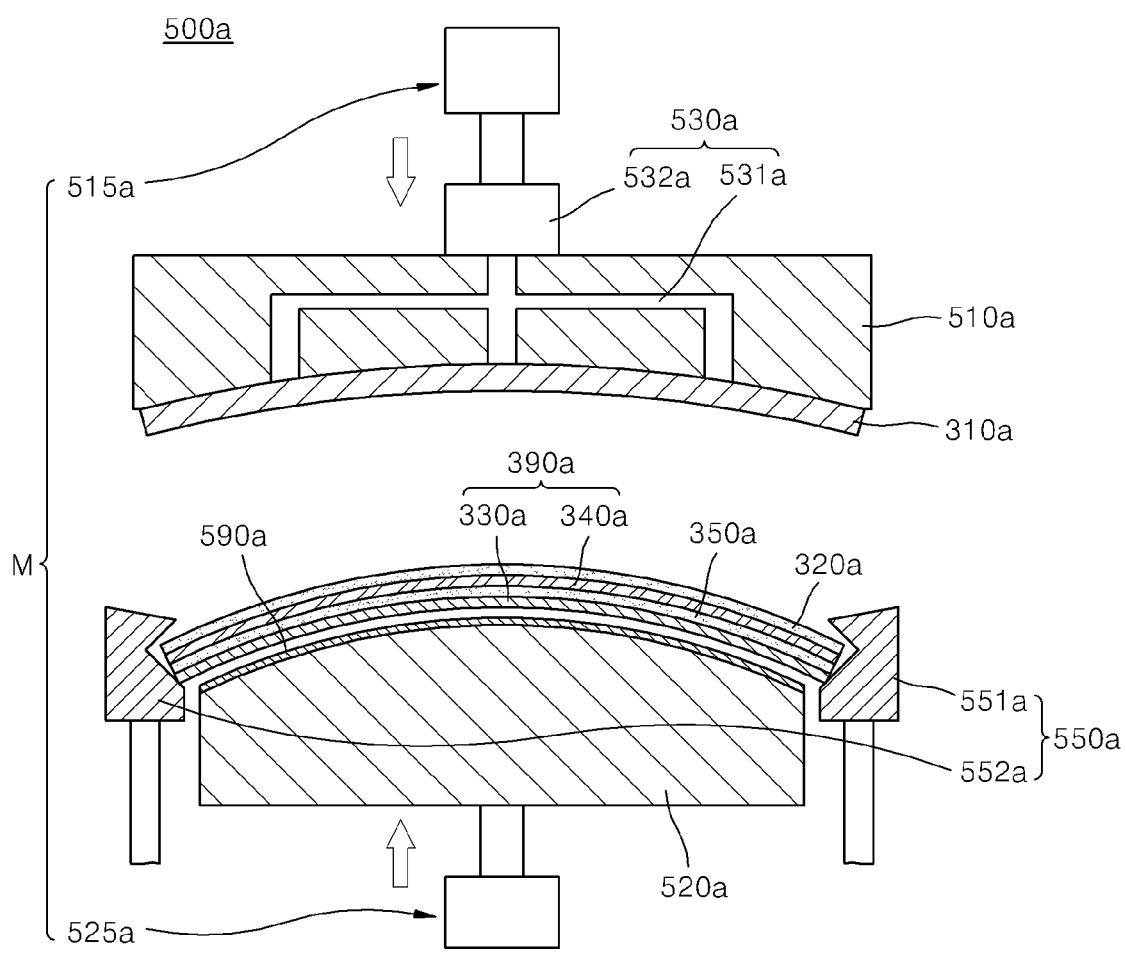
FIG. 16 is a cross-sectional view illustrating an apparatus for manufacturing the display device of FIG. 14, according to another embodiment of the present invention.

FIG. 16 is a cross-sectional view illustrating an apparatus 500a for manufacturing the display device 300a of FIG. 14, according to another embodiment of the present invention.

Referring to FIG. 16, the apparatus 500a includes a first jig 510a, a second jig 520a, a driving unit M, a fixing unit (for example, first fixing unit 530a), and a cushion unit 590a. In this case, the first jig 510a, the second jig 520a, the driving unit M, the fixing unit, and the cushion unit 590a are substantially the same as those described above, and thus a detailed description thereof will not be repeated.

The driving unit M may include a first driving unit 515a and a second driving unit 525a, and the fixing unit may include a first fixing unit 530a. The first driving unit 515a, the second driving unit 525a, and the first fixing unit 530a (which includes a first absorption unit 531a and a first absorption pump 532a) are substantially the same as those described above, and thus a detailed description thereof will not be repeated.

The apparatus 500a includes a clamping unit 550a that is spaced apart by a set or predetermined interval from at least one of the first jig 510a or the second jig 520a, and supports the panel member 390a. For convenience of description, however, it will be assumed that the clamping unit 550a is disposed adjacent to the second jig 520a.

The clamping unit 550a may support one end of the panel member 390a when the one end of the panel member 390a is inserted into the clamping unit 550a. A plurality of the clamping units 550a may be provided, where a distance between the clamping units 550a is less than a length or a width of the panel member 390a. The panel member 390a may include at least one of the display panel 330a or the TSP 340a as described above. For convenience of description, it will be assumed that the distance between the plurality of clamping units 550a is less than a width of the panel member 390a and the panel member 390a includes the display panel 330a and the TSP 340a.

In particular, the plurality of clamping units 550a face respective side surfaces of the second jig 520a, and fix both ends of the display panel 330a, the second adhesive layer 350a, the TSP 340a, and the first adhesive layer 320a. The plurality of clamping units 550a include a first clamping unit 551a and a second clamping unit 552a that are spaced apart by a set or predetermined interval from each other.

Accordingly, the apparatus 500a may rapidly and easily manufacture the display device 300a having a curved surface and a simple structure. In addition, since the apparatus 500a may accurately attach the cover window 310a having a curved surface to the panel member 390a, a product defect rate may be reduced or minimized.

In particular, since the apparatus 500a includes the clamping unit 550a to accurately align the panel member 390a and the cover window 310a, working efficiency may be improved.

A method of manufacturing the display device 300a by using the apparatus 500a will now be described with reference to FIG. 16.

The cover window 310a may be formed as described above, the display panel 330a may be formed, and then the TSP 340a and the display panel 330a may be adhered by using the second adhesive layer 350a. The cover window 310*a* may be mounted on the first jig 510*a* as described above. The cover window 310*a* may be formed to have a curved surface having a predetermined curvature radius of R as described above and may be seated on an outer surface of the first jig 510*a*. A first absorption pump 532*a* may operate to absorb air of a first absorption unit 531*a* so that the cover window 310*a* is fixed to the outer surface of the first jig 510*a*.

While the process is performed, the TSP 340*a* and the display panel 330*a* adhered by using the second adhesive layer 350*a* as described above may be disposed on the second jig 520*a*. The display panel 330*a* may be disposed to face the second jig 520*a*, and the TSP 340*a* may be disposed to face the first jig 510*a*. In particular, respective ends of the TSP 340*a* on which the first adhesive layer 320*a* is attached are fixed to the first clamping unit 551*a* and the second clamping unit 552*a*. For example, the respective ends of panel member 390*a* may be fixed by being inserted into grooves formed in the first clamping unit 551*a* and the second clamping unit 552*a* as described above.

Once the display panel 330*a*, the second adhesive layer 350*a*, the TSP 340*a*, and the first adhesive layer 320*a* are fixed in this manner, portions of the display panel 330*a*, the second adhesive layer 350*a*, the TSP 340*a*, and the first adhesive layer 320*a* may be curved upward (for example, with respect to a gravity direction). In further detail, since a distance between the first clamping unit 551*a* and the second clamping unit 552*a* is less than at least one of a width or a length of at least one of the display panel 330*a* or the TSP 340*a*, the portions of the display panel 330*a*, the second adhesive layer 350*a*, the TSP 340*a*, and the first adhesive layer 320*a* may protrude toward the first jig 510*a*.

When the display panel 330*a*, the second adhesive layer 350*a*, the TSP 340*a*, and the first adhesive layer 320*a* are fixed as described above, the display panel 330*a*, the second adhesive layer 350*a*, the TSP 340*a*, the first adhesive layer 320*a*, and the cover window 310*a* may be compressed against each other by moving at least one of the first jig 510*a* or the second jig 520*a*. For convenience of description, it will be assumed that the first adhesive layer 320*a* and the cover window 310*a* are compressed by moving both the first jig 510*a* and the second jig 520*a*.

When the first jig 510*a* and the second jig 520*a* move, the first driving unit 515*a* and the second driving unit 525*a* may operate to move the first jig 510*a* and the second jig 520*a* closer to each other.

The upwardly curved portions of the display panel 330*a*, the second adhesive layer 350*a*, the TSP 340*a*, and the first adhesive layer 320*a* first contact the cover window 310*a*. When the first jig 510*a* and the second jig 520*a* continuously move, the display panel 330*a*, the second adhesive layer 350*a*, the TSP 340*a*, and the first adhesive layer 320*a* may be laminated to the cover window 310*a* beginning from contact portions with the cover window 310*a* toward both end portions.

In particular, when the cover window 310*a* and the panel member 390*a* contact each other, a load range applied when the first jig 510*a* and the second jig 520*a* compress the cover window 310*a* and the panel member 390*a* may be greater than or equal to 0.3 MPa and less than or equal to 0.5 MPa. When the load range is less than 0.3 MPa, an adhesive force between the cover window 310*a* and the panel member 390*a* may be reduced, and the cover window 310*a* and the panel member 390*a* may be delaminated and separated from each other. In addition, when the load range exceeds 0.5 MPa and the cover window 310*a* and the panel member 390*a* are attached to each other, the cover window 310*a* and the panel member 390*a* may be damaged, thereby reducing quality and reliability.

In addition, when the first jig 510*a* and the second jig 520*a* move as described above, the TSP 340*a* and the display panel 330*a* may be fixed while the first clamping unit 551*a* and the second clamping unit 552*a* do not move.

The cushion unit 590*a* may uniformly distribute a force applied to the panel member 390*a* and the cover window 310*a* when the panel member 390*a* and the cover window 310*a* are compressed and laminated.

When the process is completed, the first driving unit 515*a* and the second driving unit 525*a* may operate to separate the first jig 510*a* and the second jig 520*a*. The operator may complete an operation by removing the completed display device 300*a* from the first jig 510*a* or the second jig 520*a*.

The operation may be performed in a vacuum state. In further detail, the apparatus 500*a* may include a chamber (see, for example, chamber C in FIG. 4C) in which the first jig 510*a*, the second jig 520*a*, the fixing unit, and the driving unit M are disposed. In addition, the apparatus 500*a* may include a pressure adjustment unit that adjusts a pressure in the chamber. The pressure adjustment unit may maintain a pressure in the chamber in a vacuum state when the cover window 310*a* and the panel member 390*a* are laminated. In addition, the pressure adjustment unit may restore and maintain a pressure in the chamber in an atmospheric pressure state after the process is completed.

Accordingly, the apparatus 500*a* may rapidly and accurately manufacture any type of display device 300*a* having a curved surface. In particular, the apparatus 500*a* may reduce or minimize a product defect rate by accurately attaching the display panel 330*a* and the cover window 310*a* having a curved surface.

In addition, the apparatus 500*a* may reduce or minimize a product defect rate by effectively removing air bubbles or preventing air bubbles from being generated after the display panel 330*a* and the curved portions are compressed.

Figure 17:
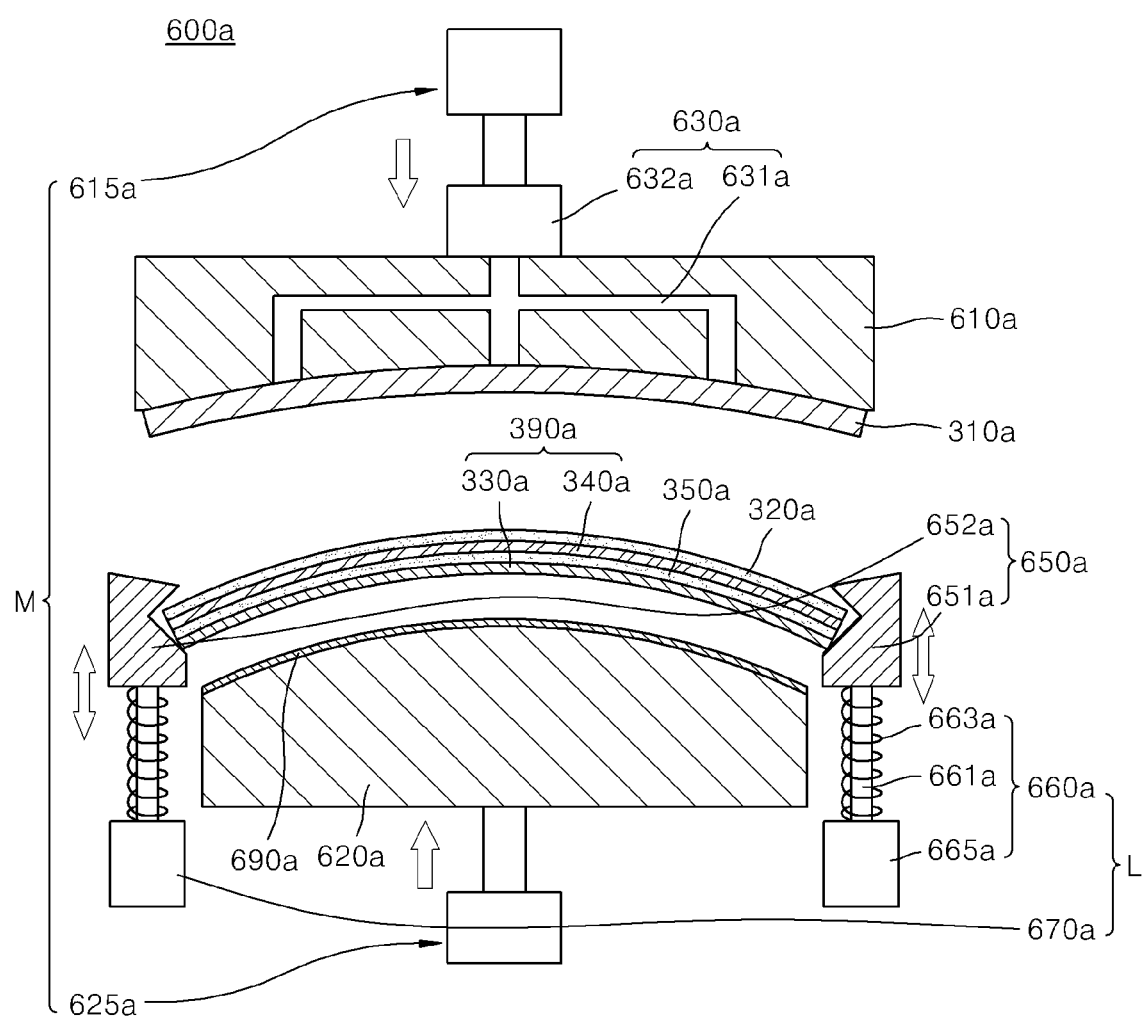
FIG. 17 is a cross-sectional view illustrating an apparatus for manufacturing the display device of FIG. 14, according to yet another embodiment of the present invention.

FIG. 17 is a cross-sectional view illustrating an apparatus 600*a* for manufacturing the display device 300*a* of FIG. 14, according to yet another embodiment of the present invention.

Referring to FIG. 17, the apparatus 600*a* includes a first jig 610*a*, a second jig 620*a*, a driving unit M, a clamping unit 650*a*, a fixing unit (for example, first fixing unit 630*a*), a linear driving unit L, and a cushion unit 690*a*. The first jig 610*a*, the second jig 620*a*, the linear driving unit L, the clamping unit 650*a*, the fixing unit, and the cushion unit 690*a* may be substantially the same as those described above, and thus a detailed description thereof will not be repeated.

The driving unit M may include a first driving unit 615*a* and a second driving unit 625*a*, and the fixing unit may include a first fixing unit 630*a*. The first driving unit 615*a*, the second driving unit 625*a*, and the first fixing unit 630*a* may be substantially the same as those described above, and thus a detailed description thereof will not be repeated. In particular, the first fixing unit 630*a* may include a first absorption pump 632*a* and a first absorption unit 631*a*.

The clamping unit 650*a* may include a first clamping unit 651*a* and a second clamping unit 652*a*. The first clamping unit 651*a* and the second clamping unit 652*a* may be substantially the same as those described above, and thus a detailed description thereof will not be repeated.

The apparatus 600*a* may include a linear driving unit L that includes a first linear driving unit 660*a* and a second linear driving unit 670*a* that respectively vertically move the first clamping unit 651*a* and the second clamping unit 652*a*. In particular, the first linear driving unit 660*a* and the second linear driving unit 670*a* may respectively linearly move the first clamping unit 651*a* and the second clamping unit 652*a* in the same direction as a direction in which the second jig 620*a* moves. The first linear driving unit 660*a* and the second linear driving unit 670*a* may be formed similarly, and thus the following description will focus on the first linear driving unit 660*a*.

The first linear driving unit 660*a* may include a first shaft 661*a* that is connected to the first clamping unit 651*a* and linearly moves the first clamping unit 651*a*. In addition, the first linear driving unit 660*a* may include a first driving module 665*a* that drives the first shaft 661*a*. The first driving module 665*a* may include a cylinder or a motor. For convenience of description, however, it will be assumed that the first driving module 665*a* includes a motor. It will be further assumed that the first shaft 661*a* includes a ball screw that is lowered or raised as the first driving module 665*a* rotates.

The first linear driving unit 660*a* may include a first elastic unit 663*a* that surrounds the first shaft 661*a*. The first elastic unit 663*a* may include a compression spring, and may be formed of an elastic material such as rubber. For convenience of description, however, it will be assumed that the first elastic unit 663*a* includes a compression spring.

The first elastic unit 663*a* may surround an outer surface of the first shaft 661*a* as described above and thus may provide a restoring force to the first clamping unit 651*a* when the first clamping unit 651*a* moves.

A method of manufacturing the display device 300*a* by using the apparatus 600*a* will be described. The cover window 310*a* and the panel member 390*a* may be manufactured and prepared. The panel member 390*a* may include at least one of the display panel 330*a* or the TSP 340*a* as described above. However, for convenience of description, it will be assumed that the panel member 390*a* includes both the display panel 330*a* and the TSP 340*a*.

Next, the cover window 310*a* may be disposed on the first jig 610*a*. The cover window 310*a* may be formed to have a curved surface having a predetermined curvature radius of R as described above, and may be seated on an outer surface of the first jig 610*a*. A first absorption pump 632*a* may absorb air of a first absorption unit 631*a* to fix the cover window 310*a* to the outer surface of the first jig 610*a*.

While the process is performed, the TSP 340*a* and the display panel 330*a* adhered by using the second adhesive layer 350*a* as described above may be disposed on the second jig 620*a*. The display panel 330*a* may be disposed to face the second jig 620*a* and the TSP 340*a* may be disposed to face the first jig 610*a*. In particular, the display panel 330*a* and the TSP 340*a* may be stacked, and an end of the display panel 330*a* and an end of the TSP 340*a* may be fixed by being inserted into the first clamping unit 651*a* and the second clamping unit 652*a*.

Next, the first adhesive layer 320*a* may be formed on the TSP 340*a*. Respective ends of the display panel 330*a* and the TSP 340*a* on which the first adhesive layer 320*a* is formed may be fixed to the first clamping unit 651*a* and the second clamping unit 652*a*.

Once the panel member 390*a* is fixed to the first clamping unit 651*a* and the second clamping unit 652*a*, one portion of the panel member 390*a* may be curved upward (for example, with respect to a gravity direction). In further detail, since a distance between the first clamping unit 651*a* and the second clamping unit 652*a* is less than at least one of a width or a length of the panel member 390*a*, the upwardly curved portion may protrude toward the first jig 610*a*. In this case, it will be assumed that the distance between the first clamping unit 651*a* and the second clamping unit 652*a* is less than a width of the panel member 390*a*.

After the panel member 390*a* is disposed in this manner, the panel member 390*a* and the cover window 310*a* may be compressed against each other by moving at least one of the first jig 610*a* or the second jig 620*a*. For convenience of description, however, it will be assumed that the panel member 390*a* and the cover window 310*a* are compressed by moving both the first jig 610*a* and the second jig 620*a*.

While the first jig 610*a* and the second jig 620*a* move in this manner, the first linear driving unit 660*a* and the second linear driving unit 670*a* may operate to vertically move the first clamping unit 651*a* and the second clamping unit 652*a*. In particular, the first clamping unit 651*a* and the second clamping unit 652*a* may move at a speed similar to a speed at which the second jig 620*a* moves.

When the second jig 620*a*, the first clamping unit 651*a*, and the second clamping unit 652*a* are raised in this manner, the panel member 390*a* may be raised while maintaining its curved state. When a distance between the first jig 610*a* and the second jig 620*a* reaches a set distance (for example, a predetermined distance), the first clamping unit 651*a* and the second clamping unit 652*a* may release from (for example, reduce their clamping force from) the panel member 390*a*.

During or after this releasing of the first clamping unit 651*a* and the second clamping unit 652*a*, the first linear driving unit 660*a* and the second linear driving unit 670*a* may lower the first clamping unit 651*a* and the second clamping unit 652*a*.

Next, the first driving unit 615*a* and the second driving unit 625*a* may continuously operate to bring the first jig 610*a* and the second jig 620*a* closer (for example, adjacent) to each other (for example, the second jig 620*a* may contact panel member 390*a*). As the first jig 610*a* and the second jig 620*a* move closer, the panel member 390*a* and the cover window 310*a* may be compressed against each other. A method of compressing the panel member 390*a* and the cover window 310*a* may be performed in the same manner as that described above, and thus a detailed description thereof will not be repeated.

In particular, when the cover window 310*a* and the panel member 390*a* contact each other, a load range applied when the first jig 610*a* and the second jig 620*a* compress the cover window 310*a* and the panel member 390*a* may be greater than or equal to 0.3 MPa and less than or equal to 0.5 MPa. When the load range is less than 0.3 MPa, an adhesive force between the cover window 310*a* and the panel member 390*a* may be reduced, and the cover window 310*a* and the panel member 390*a* may be delaminated and separated from each other. In addition, when the load range exceeds 0.5 MPa and the cover window 310*a* and the panel member 390*a* are attached to each other, the cover window 310*a* and the panel member 390*a* may be damaged, thereby reducing quality and reliability.

The cushion unit 690*a* may uniformly distribute a force applied to the cover window 310*a* and the panel member 390*a* when the cover window 310*a* and the panel member 390*a* are laminated due to compression.

When the process is completed, the first driving unit 615*a* and the second driving unit 625*a* may operate to separate the first jig 610*a* and the second jig 620*a*. The operator may complete an operation by removing the completed display device 300*a* from the first jig 610*a* or the second jig 620*a*.

The operation may be performed in a vacuum state. In further detail, the apparatus 600*a* may include a chamber (see, for example, chamber C in FIG. 4C) in which the first jig 610a, the second jig 620a, the fixing unit, and the driving unit are disposed. In addition, the apparatus 600a may include a pressure adjustment unit that adjusts a pressure in the chamber. The pressure adjustment unit may maintain a pressure in the chamber in a vacuum state when the cover window 310a and the panel member 390a are laminated. In addition, the pressure adjustment unit may restore and maintain a pressure in the chamber in an atmospheric pressure state after the process is completed.

Accordingly, the apparatus 600a may rapidly and accurately manufacture the display device 300a having a curved surface. In particular, the apparatus 600a may reduce or minimize a product defect rate by accurately attaching the panel member 390a and the cover window 310a having a curved surface.

In addition, the apparatus 600a may improve product quality by removing air bubbles that may be generated (or preventing air bubbles from being generated) when the panel member 390a and the cover window 310a are compressed.

Figure 18:
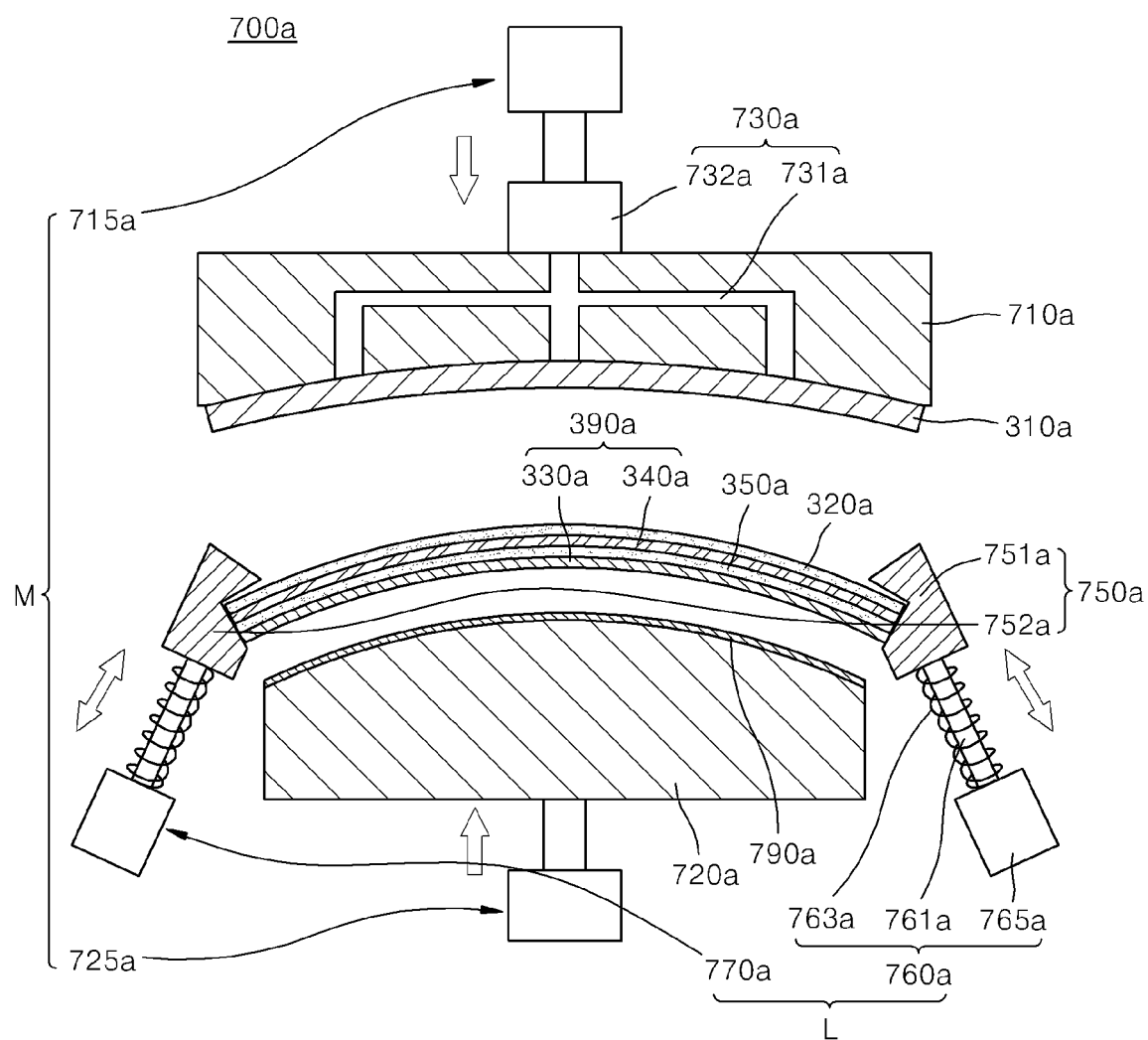
FIG. 18 is a cross-sectional view illustrating an apparatus for manufacturing the display device of FIG. 14, according to still yet another embodiment of the present invention.

FIG. 18 is a cross-sectional view illustrating an apparatus 700a for manufacturing the display device 300a of FIG. 14, according to still yet another embodiment of the present invention.

Referring to FIG. 18, the apparatus 700a may include a first jig 710a, a second jig 720a, a driving unit M, a clamping unit 750a, a fixing unit (for example, first fixing unit 730a), a linear driving unit L, and a cushion unit 790a. The first jig 710a and the second jig 720a may be substantially the same as those described above, and thus a detailed description thereof will not be repeated.

The driving unit M may include a first driving unit 715a and a second driving unit 725a, and the fixing unit may include a first fixing unit 730a. The first driving unit 715a, the second driving unit 725a, and the first fixing unit 730a (which includes first absorption unit 731a and first absorption pump 732a) may be substantially the same as those described above, and thus a detailed description thereof will not be repeated.

In addition, the clamping unit 750a may include a first clamping unit 751a and a second clamping unit 752a. The first clamping unit 751a and the second clamping unit 752a may be substantially the same as those described above, and thus a detailed description thereof will not be repeated.

The linear driving unit L may include a first linear driving unit 760a and a second linear driving unit 770a, and the first linear driving unit 760a and the second linear driving unit 770a may linearly move the first clamping unit 751a and the second clamping unit 752a, respectively. In particular, the first linear driving unit 760a and the second linear driving unit 770a may linearly move the first clamping unit 751a and the second clamping unit 752a in a diagonal direction. Since the second linear driving unit 770a may be formed similarly to the first linear driving unit 760a, the following description will focus on the first linear driving unit 760a.

In further detail, the first linear driving unit 760a may include a first shaft 761a, a first driving module 765a, and a first elastic unit 763a. The first shaft 761a, the first driving module 765a, and the first elastic unit 763a may be formed in a similar manner to those described above (such as the first linear driving unit 760 in FIGS. 12-13). The first shaft 761a is disposed in a diagonal direction to diagonally move the first clamping unit 751a.

In particular, when the first linear driving unit 760a operates, the first driving module 765a may vary a length of the first shaft 761a. Since the first driving module 765a and the first shaft 761a are diagonally disposed with respect to the second jig 720a as described above, the first clamping unit 751a may be diagonally moved by varying the movement of the first shaft 761a.

For example, when the first driving module 765a operates to diagonally move the first shaft 761a downward with respect to the second jig 720a, the first clamping unit 751a may diagonally move downward with respect to the second jig 720a as the first shaft 761a moves.

When the first driving module 765a operates in an opposite direction to diagonally move the first shaft 761a upward with respect to the second jig 720a, the first clamping unit 751a may diagonally move upward with respect to the second jig 720a as the first shaft 761a moves.

The first shaft 761a may include a ball screw as described above and thus may rotate as the first driving module 765a operates. In particular, the first shaft 761a may diagonally move downward or upward with respect to the second jig 720a as the first driving module 765a rotates.

The cushion unit 790a may be formed in various ways. For example, the cushion unit 790a may be provided on an outer surface of at least one of the first jig 710a or the second jig 720a. For ease of description, it will be assumed that the cushion unit 790a is formed on an entire outer surface of the second jig 720a.

A method of manufacturing the display device 300a may be similar to that described above. In further detail, the panel member 390a and the cover window 310a may be manufactured and prepared. The panel member 390a may include the display panel 330a and the TSP 340a as described above. However, for convenience of description, it will be assumed that the panel member 390a includes both the display panel 330a and the TSP 340a.

After the cover window 310a and the panel member 390a are manufactured and prepared as described above, the cover window 310a may be disposed on the first jig 710a. The cover window 310a may be formed to have a curved surface having a predetermined curvature radius of R as described above, and may be seated on an outer surface of the first jig 710a. A first absorption pump 732a may operate to absorb air of a first absorption unit 731a so that the cover window 310a is fixed to the outer surface of the first jig 710a.

When the display panel 330a and the TSP 340a are completely manufactured as described above, the display panel 330a and the TSP 340a may be adhered by using the second adhesive layer 350a, and the first adhesive layer 320a may be coated on the TSP 340a.

Next, the TSP 340a and the display panel 330a may be disposed on the second jig 720a. The display panel 330a may be disposed to face the second jig 720, and the TSP 340a may be disposed to face the first jig 710a. The panel member 390a manufactured as described above may be fixed by the first clamping unit 751a and the second clamping unit 752a. In further detail, since a distance between the first clamping unit 751a and the second clamping unit 752a is less than at least one of a width or a length of the panel member 390a, an upwardly curved portion of the panel member 390a may protrude toward the first jig 710a. In this case, it will be assumed that the distance between the first clamping unit 751a and the second clamping unit 752a is less than a width of the panel member 390a. When the fixing is completed, the panel member 390a and the cover window 310a may be compressed against each other by moving at least one of the first jig 710a or the second jig 720a. A method of compressing the panel member 390a and the cover window 310a may be similar to that described above, and thus a detailed description thereof will not be repeated.

When the first jig 710a and the second jig 720a move in this manner, the first clamping unit 751a and the second clamping unit 752a may also move. In particular, the first clamping unit 751a and the second clamping unit 752a may be diagonally moved by the first linear driving unit 760a and the second linear driving unit 770a, respectively. The first clamping unit 751a and the second clamping unit 752a may be raised diagonally.

When the first clamping unit 751a and the second clamping unit 752a are raised and then an interval between the first jig 710a and the second jig 720a reaches a preset interval, both ends of the panel member 390a may be released. The panel member 390a may be sequentially adhered to the cover window 310a beginning from a protruding portion toward both end portions.

After the releasing of the first clamping unit 751a and the second clamping unit 752a, the first linear driving unit 760a and the second linear driving unit 770a may operate to lower the first clamping unit 751a and the second clamping unit 752a. The first clamping unit 751a and the second clamping unit 752a may be lowered diagonally.

While the first clamping unit 751a and the second clamping unit 752a are lowered, the first jig 710a and the second jig 720a may get closer to each other to compress the panel member 390a and the cover window 310a. In this case, a method of adhering the panel member 390a and the cover window 310a through compression may be similar to that described above.

When the panel member 390a and the cover window 310a are compressed by moving the first jig 710a and the second jig 720a as described above, the cushion unit 790a may distribute a force applied to the panel member 390a and the cover window 310a. In addition, the cushion unit 790a may help prevent the panel member 390a or the cover window 310a from being damaged by absorbing part of a force applied to the panel member 390a and the cover window 310a.

In particular, when the cover window 310a and the display panel 330a contact each other, a load range applied when the first jig 710a and the second jig 720a compress the cover window 310a and the panel member 390a may be greater than or equal to 0.3 MPa and less than or equal to 0.5 MPa. When the load range is less than 0.3 MPa, an adhesive force between the cover window 310a and the panel member 390a may be reduced, and the cover window 310a and the panel member 390a may be delaminated and separated from each other. In addition, when the load range exceeds 0.5 MPa and the cover window 310a and the panel member 390a are attached to each other, the cover window 310a and the panel member 390a may be damaged, thereby reducing quality and reliability.

After the process is completed, the first driving unit 715a and the second driving unit 725a may operate to separate the first jig 710a and the second jig 720a. The operator may complete an operation by removing the completed display device 300a from the first jig 710a or the second jig 720a.

The operation may be performed in a vacuum state. In further detail, the apparatus 700a may include a chamber (see, for example, chamber C in FIG. 4C) in which the first jig 710a, the second jig 720a, the fixing unit, and the driving unit M are disposed. In addition, the apparatus 700a may include a pressure adjustment unit that adjusts a pressure in the chamber. The pressure adjustment unit may maintain a pressure in the chamber in a vacuum state when the cover window 310a and the panel member 390a are laminated. In addition, the pressure adjustment unit may restore and maintain a pressure in the chamber in an atmospheric pressure state after the process is completed.

Accordingly, the apparatus 700a may manufacture the display device 300a having a curved surface. In particular, the apparatus 700a may reduce or minimize a product defect rate by accurately attaching the display panel 330a and the cover window 310a having a curved surface.

In addition, the apparatus 700a may improve quality by removing air bubbles or preventing air bubbles from being generated after the display panel 330a and the curved portions are compressed.

Figure 19:
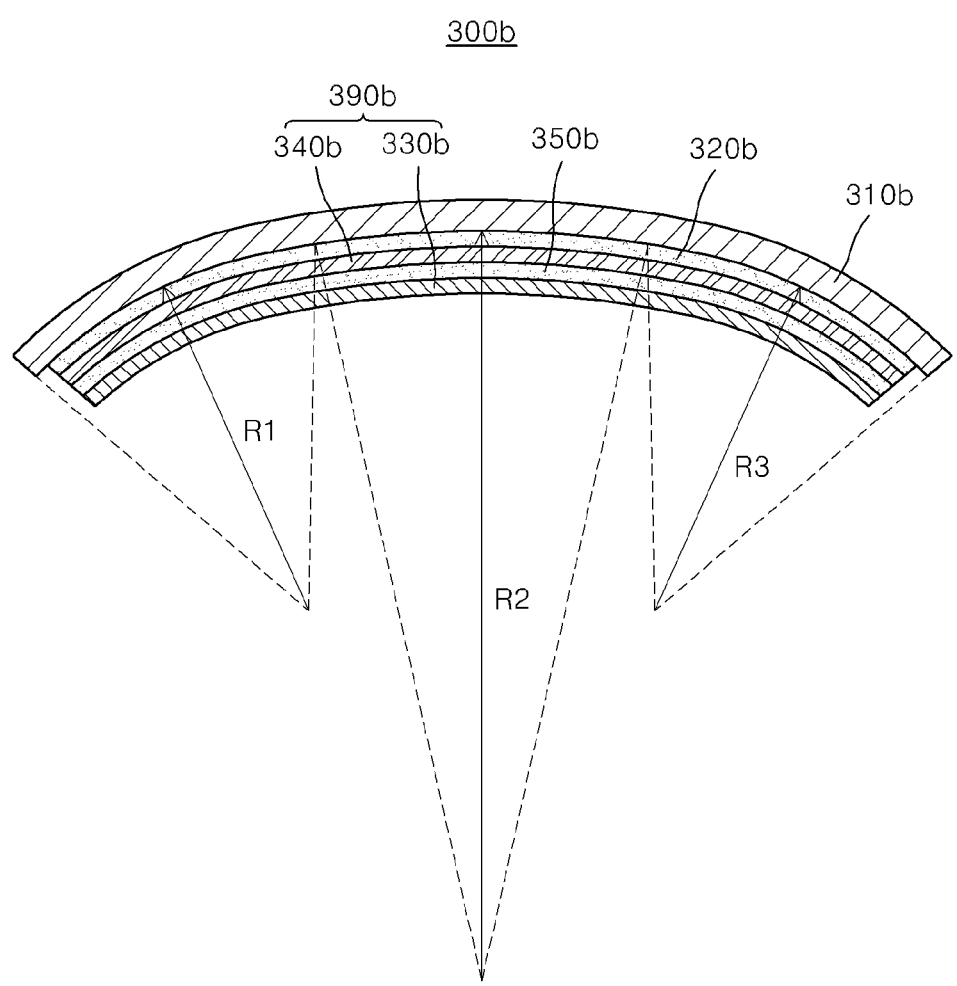
FIG. 19 is a cross-sectional view illustrating a display device according to still yet another embodiment of the present invention.

FIG. 19 is a cross-sectional view illustrating a display device 300b according to still yet another embodiment of the present invention.

Referring to FIG. 19, the display device 300b may include a cover window 310b and a panel member 390b as described above. In addition, the display device 300b may include a first adhesive layer 320b that is disposed between the panel member 390b and the cover window 310b. The panel member 390b may include a display panel 330b and a TSP 340b as described above. In particular, a second adhesive layer 350b may be provided between the display panel 330b and the TSP 340b to attach the display panel 330b and the TSP 340b.

At least a portion of the cover window 310b may be curved. The cover window 310b may be formed such that a surface on which an image or text is displayed is curved after then panel member 390b is attached. In particular, the cover window 310b may be formed to have at least one curved surface having a curvature radius. In some embodiments, the cover window 310b may be formed to have a first curved surface having a curvature radius of R1, a second curved surface having a curvature radius of R2, and may further include a third curved surface having a curvature radius of R3 in at least one of a longitudinal direction or a width direction. In other embodiments, the cover window 310b may further include curved surfaces having curvature radii of R4, R5, . . . , and RN (N is a natural number) in addition to the curved surfaces having the curvature radii of R1, R2, and R3 (e.g., there may be a separate curvature radius of each portion or curved surface of the cover window 310b). However, for convenience of description, it will be assumed that the cover window 310b is formed to have the first, second, and third curved surfaces having the curvature radii of R1, R2, and R3 in a width direction.

The first adhesive layer 320b and the second adhesive layer 350b may be formed of the same material. In further detail, the first adhesive layer 320b and the second adhesive layer 350b may be formed of an adhesive and transparent material. For example, the first adhesive layer 320b and the second adhesive layer 350b may include an optical clear adhesive film (OCA film) or an adhesive material.

Accordingly, since the display device 300b is formed to have a set or predetermined curvature radius, the display device 300b may be applied to various members.

Figure 20:
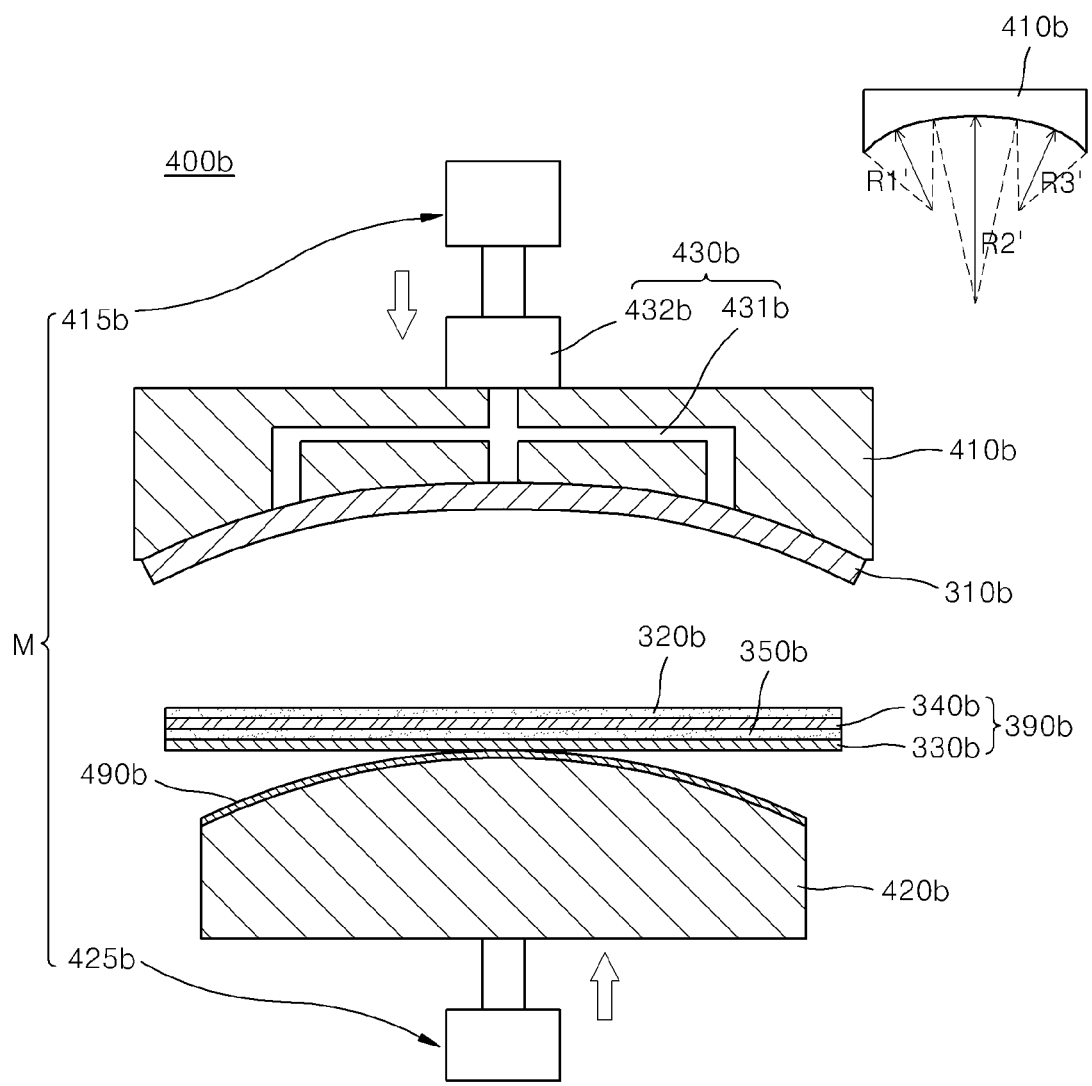
FIG. 20 is a cross-sectional view illustrating an apparatus for manufacturing the display device of FIG. 19, according to an embodiment of the present invention.

FIG. 20 is a cross-sectional view illustrating an apparatus 400b for manufacturing the display device 300b of FIG. 19, according to an embodiment of the present invention.

Referring to FIG. 20, the apparatus 400b may include a first jig 410b, a second jig 420b, a driving unit M, a fixing unit (for example, first fixing unit 430b), and a cushion unit 490b. An outer surface of the first jig 410b on which the cover window 310b is seated may be formed equally or similarly to an outer surface of the cover window 310b contacting the outer surface of the first jig 410b. In further detail, the first jig 410b may have at least two curved surfaces having curvature radii of R1', R2', R3', . . . , like the cover window 310b. In particular, the first jig 410b may be formed by being recessed away from the second jig 420b.

An outer surface of the second jig 420b may protrude toward the first jig 410b to correspond to or engage with a recessed portion of the first jig 410b (e.g., the first jig 410b may have a recessed outer surface). The outer surface of the second jig 420b may be at least two curved surfaces having set or predetermined curvature radii.

The driving unit M may include a first driving unit 415b and a second driving unit 425b. The first driving unit 415b may linearly move the first jig 410b toward the second jig 420b, and the second driving unit 425b may linearly move the second jig 420b toward the first jig 410b. The first driving unit 415b and the second driving unit 425b may be formed in the same manner as or a similar manner to those described above.

In addition, the fixing unit may include a first fixing unit 430b provided on the first jig 410b and a second fixing unit provided on the second jig 420b. For convenience of description, it will be assumed that the fixing unit includes the first fixing unit 430b. In addition, the first fixing unit 430b and the second fixing unit may be formed in the same manner as or a similar manner, and thus a detailed description of the second fixing unit will not be given.

The first fixing unit 430b may be formed in various ways. For example, the first fixing unit 430b may include an adhesive member, an adhesive chuck, or an electrostatic chuck. In addition, the first fixing unit 430b may include a first absorption unit 431b and a first absorption pump 432b that is connected to the first absorption unit 431b. In particular, the first fixing unit 430b is not limited thereto, and may include a clamp, or a protrusion that is provided on the first jig 410b and mechanically restricts the cover window 310b. However, for convenience of description, it will be assumed that the first fixing unit 430b includes the first absorption unit 431b and the first absorption pump 432b.

The cushion unit 490b may be provided on at least one of the first jig 410b or the second jig 420b. In this case, the cushion unit 490b is the same as or similar to that described above, and thus a detailed description thereof will not be repeated. In addition, for convenience of description, it will be assumed that the cushion unit 490b is provided only on the second jig 420b and is integrally formed on an outer surface of the second jig 420b.

A method of manufacturing the display device 300b by using the apparatus 400b will now be described. First, the cover window 310b and the panel member 390b may be manufactured and prepared. In this case, a method of manufacturing the cover window 310b is similar to that described above, and thus a detailed description thereof will not be repeated. In addition, the panel member 390b may adhere the TSP 340b and the display panel 330b by using the second adhesive layer 350b.

After the cover window 310b and the panel member 390b are manufactured and prepared as described above, the cover window 310b may be disposed on the first jig 410b. The cover window 310b may be formed to have at least two curved surfaces having curvature radii as described above and may be seated on an outer surface of the first jig 410b. The first absorption pump 432b may operate to absorb (e.g., evacuate or vacuum) air out of the first absorption unit 431b, so that the cover window 310b may be fixed to the outer surface of the first jig 410b.

While the process is performed, the TSP 340b and the display panel 330b adhered by using the second adhesive layer 350b may be disposed on the second jig 420b. The display panel 330b may be disposed to face the second jig 420b, and the TSP 340b may be disposed to face the first jig 410b.

After the TSP 340b and the display panel 330b are disposed as described above, the first adhesive layer 320b may be coated on the TSP 340b. The first adhesive layer 320b may be formed of the same material as or a similar material to that of the second adhesive layer 350b.

When the cover window 310b, the TSP 340b, and the display panel 330b are completely disposed as described above, the first jig 410b and the second jig 420b may be moved toward each other by driving the first driving unit 415b and the second driving unit 425b. A protruding portion of the second jig 420b may first contact the display panel 330b, and the first adhesive layer 320b and the cover window 310b may be sequentially laminated from central portions of the display panel 330b to both end portions.

In particular, when the cover window 310b and the panel member 390b contact each other, a load range applied when the first jig 410b and the second jig 420b compress the cover window 310b and the panel member 390b may be greater than or equal to 0.3 MPa and less than or equal to 0.5 MPa. When the load range is less than 0.3 MPa, an adhesive force between the cover window 310b and the panel member 390b may be reduced, and the cover window 310b and the panel member 390b may be delaminated and separated from each other. In addition, when the load range exceeds 0.5 MPa and the cover window 310b and the panel member 390b are attached to each other, the cover window 310b and the panel member 390b may be damaged, thereby reducing quality and reliability.

While the process is performed, the cushion unit 490b may uniformly distribute a force applied to the panel member 390b and the cover window 310b.

When the process is completed, the first driving unit 415b and the second driving unit 425b may operate to separate the first jig 410b and the second jig 420b. The operator may complete an operation by removing the completed display device 300b from the first jig 410b or the second jig 420b.

The operation may be performed in a vacuum state. In further detail, the apparatus 400b may include a chamber (see, for example, chamber C in FIG. 4C) in which the first jig 410b, the second jig 420b, the fixing unit, and the driving unit M are disposed. In addition, the apparatus 400b may include a pressure adjustment unit that adjusts a pressure in the chamber. The pressure adjustment unit may maintain a pressure in the chamber in a vacuum state when the cover window 310b and the panel member 390b are laminated. In addition, the pressure adjustment unit may restore and maintain a pressure in the chamber in an atmospheric pressure state after the process is completed.

Accordingly, the apparatus 400b may manufacture any type of display device 300b. In addition, the apparatus 400b may reduce or minimize a product defect rate by effectively removing vapors or preventing vapors from being generated between the cover window 310b and the panel member 390b when the cover window 310b and the panel member 390b are laminated.

Figure 21:
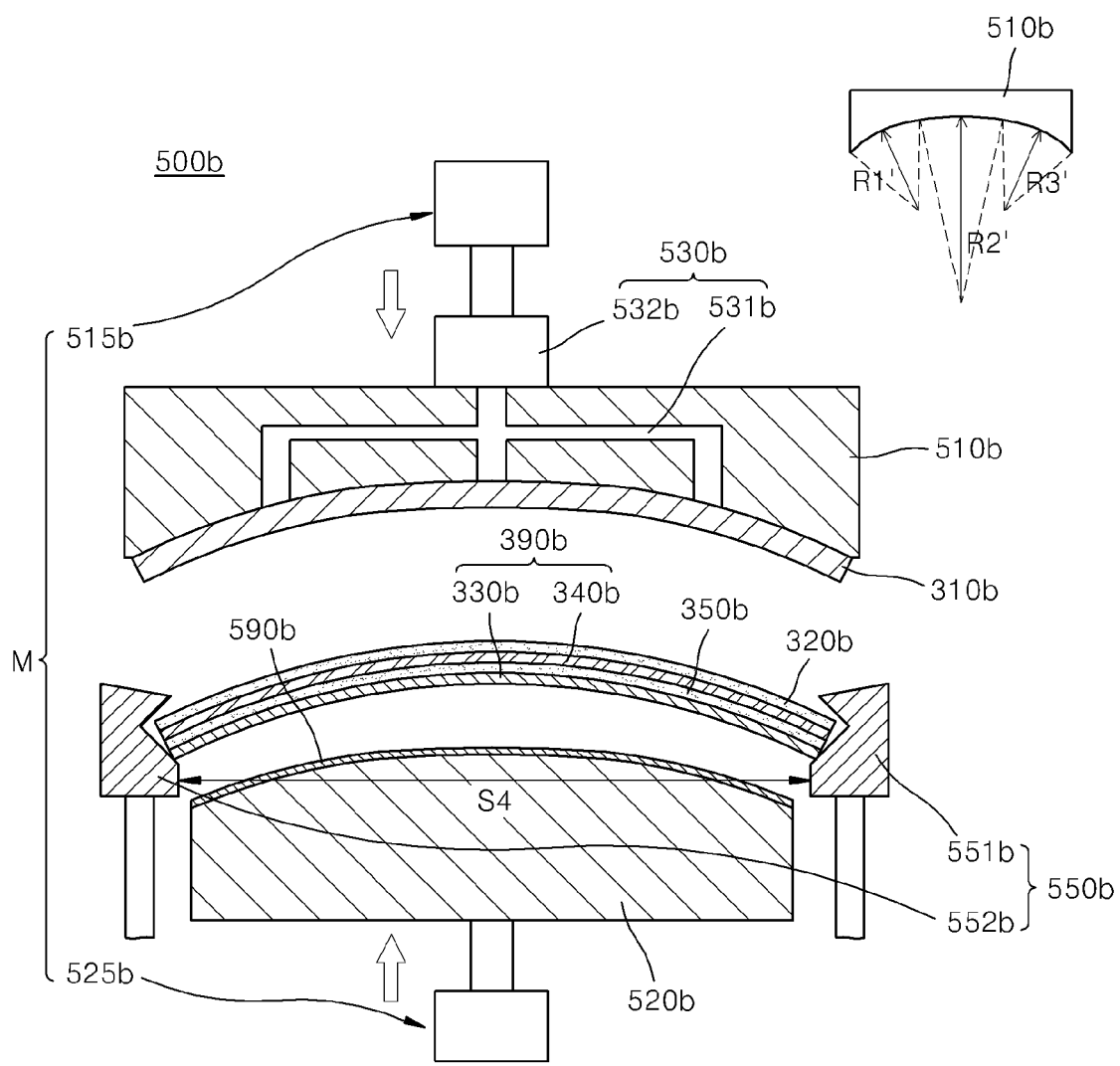
FIG. 21 is a cross-sectional view illustrating an apparatus for manufacturing the display device of FIG. 19, according to another embodiment of the present invention.

FIG. 21 is a cross-sectional view illustrating an apparatus 500b for manufacturing the display device 300b of FIG. 19, according to another embodiment of the present invention.

Referring to FIG. 21, the apparatus 500b includes a first jig 510b, a second jig 520b, a driving unit M, a fixing unit (for example, first fixing unit 530b), and a cushion unit 590b. In this case, the first jig 510b, the second jig 520b, the driving unit M, the fixing unit, and the cushion unit 590b are substantially the same as those described above, and thus a detailed description thereof will not be repeated.

The driving unit M may include a first driving unit 515b and a second driving unit 525b, and the fixing unit may include a first fixing unit 530b. The first driving unit 515b, the second driving unit 525b, and the first fixing unit 530b (which includes a first absorption unit 531b and a first absorption pump 532b) are substantially the same as those described above, and thus a detailed description thereof will not be repeated.

The apparatus 500b includes a clamping unit 550b that is spaced apart by a set or predetermined interval from at least one of the first jig 510b or the second jig 520b, and supports the panel member 390b. For convenience of description, however, it will be assumed that the clamping unit 550b is disposed adjacent to the second jig 520b.

The clamping unit 550b may support one end of the panel member 390b when the one end of the panel member 390b is inserted into the clamping unit 550b. A plurality of the clamping units 550b may be provided, where a distance S4 between the clamping units 550b is less than a length or a width of the panel member 390b. The panel member 390b may include at least one of the display panel 330b or the TSP 340b as described above. For convenience of description, it will be assumed that the distance S4 between the plurality of clamping units 550b is less than a width of the panel member 390b and the panel member 390b includes the display panel 330b and the TSP 340b.

In particular, the plurality of clamping units 550b face respective side surfaces of the second jig 520b, and fix both ends of the display panel 330b, the second adhesive layer 350b, the TSP 340b, and the first adhesive layer 320b. The plurality of clamping units 550b include a first clamping unit 551b and a second clamping unit 552b that are spaced apart by a set or predetermined interval from each other.

Accordingly, the apparatus 500b may rapidly and easily manufacture the display device 300b having a curved surface and a simple structure. In addition, since the apparatus 500b may accurately attach the cover window 310b having a curved surface to the panel member 390b, a product defect rate may be reduced or minimized.

In particular, since the apparatus 500b includes the clamping unit 550b to accurately align the panel member 390b and the cover window 310b, working efficiency may be improved.

A method of manufacturing the display device 300b by using the apparatus 500b will now be described with reference to FIG. 21.

The cover window 310b may be formed as described above, the display panel 330b may be formed, and then the TSP 340b and the display panel 330b may be adhered by using the second adhesive layer 350b. The cover window 310b may be mounted on the first jig 510b as described above.

Next, respective ends of the TSP 340b on which the first adhesive layer 320b is attached are fixed to the first clamping unit 551b and the second clamping unit 552b. For example, the respective ends of panel member 390b may be fixed by being inserted into grooves formed in the first clamping unit 551b and the second clamping unit 552b as described above.

Once the display panel 330b, the second adhesive layer 350b, the TSP 340b, and the first adhesive layer 320b are fixed in this manner, portions of the display panel 330b, the second adhesive layer 350b, the TSP 340b, and the first adhesive layer 320b may be curved upward (for example, with respect to a gravity direction). In further detail, since a distance S4 between the first clamping unit 551 b and the second clamping unit 552b is less than at least one of a width or a length of at least one of the display panel 330b or the TSP 340b, the portions of the display panel 330b, the second adhesive layer 350b, the TSP 340b, and the first adhesive layer 320b may protrude toward the first jig 510b.

When the display panel 330b, the second adhesive layer 350b, the TSP 340b, and the first adhesive layer 320b are fixed as described above, the display panel 330b, the second adhesive layer 350b, the TSP 340b, the first adhesive layer 320b, and the cover window 310b may be compressed against each other by moving at least one of the first jig 510b or the second jig 520b. For convenience of description, it will be assumed that the first adhesive layer 320b and the cover window 310b are compressed by moving both the first jig 510b and the second jig 520b.

When the first jig 510b and the second jig 520b move, the first driving unit 515b and the second driving unit 525b may operate to move the first jig 510b and the second jig 520b closer to each other.

The upwardly curved portions of the display panel 330b, the second adhesive layer 350b, the TSP 340b, and the first adhesive layer 320b first contact the cover window 310b. When the first jig 510b and the second jig 520b continuously move, the display panel 330b, the second adhesive layer 350b, the TSP 340b, and the first adhesive layer 320b may be laminated to the cover window 310b beginning from contact portions with the cover window 310b toward both end portions.

In particular, when the cover window 310b and the panel member 390b contact each other, a load range applied when the first jig 510b and the second jig 520b compress the cover window 310b and the panel member 390b may be greater than or equal to 0.3 MPa and less than or equal to 0.5 MPa. When the load range is less than 0.3 MPa, an adhesive force between the cover window 310b and the panel member 390b may be reduced, and the cover window 310b and the panel member 390b may be delaminated and separated from each other. In addition, when the load range exceeds 0.5 MPa and the cover window 310b and the panel member 390b are attached to each other, the cover window 310b and the panel member 390b may be damaged, thereby reducing quality and reliability.

The cushion unit 590b may uniformly distribute a force applied to the panel member 390b and the cover window 310b when the panel member 390b and the cover window 310b are compressed and laminated.

The operation may be performed in a vacuum state. In further detail, the apparatus 500b may include a chamber (see, for example, chamber C in FIG. 4C) in which the first jig 510b, the second jig 520b, the fixing unit, and the driving unit M are disposed. In addition, the apparatus 500b may include a pressure adjustment unit that adjusts a pressure in the chamber. The pressure adjustment unit may maintain a pressure in the chamber in a vacuum state when the cover window 310b and the panel member 390b are laminated. In addition, the pressure adjustment unit may restore and maintain a pressure in the chamber in an atmospheric pressure state after the process is completed.

Accordingly, the apparatus 500b may rapidly and accurately manufacture any type of display device 300b having a curved surface. In particular, the apparatus 500b may reduce or minimize a product defect rate by accurately attaching the display panel 330b and the cover window 310b having a curved surface.

In addition, the apparatus 500b may reduce or minimize a product defect rate by effectively removing air bubbles or preventing air bubbles from being generated after the display panel 330b and the curved portions are compressed.

Figure 22:
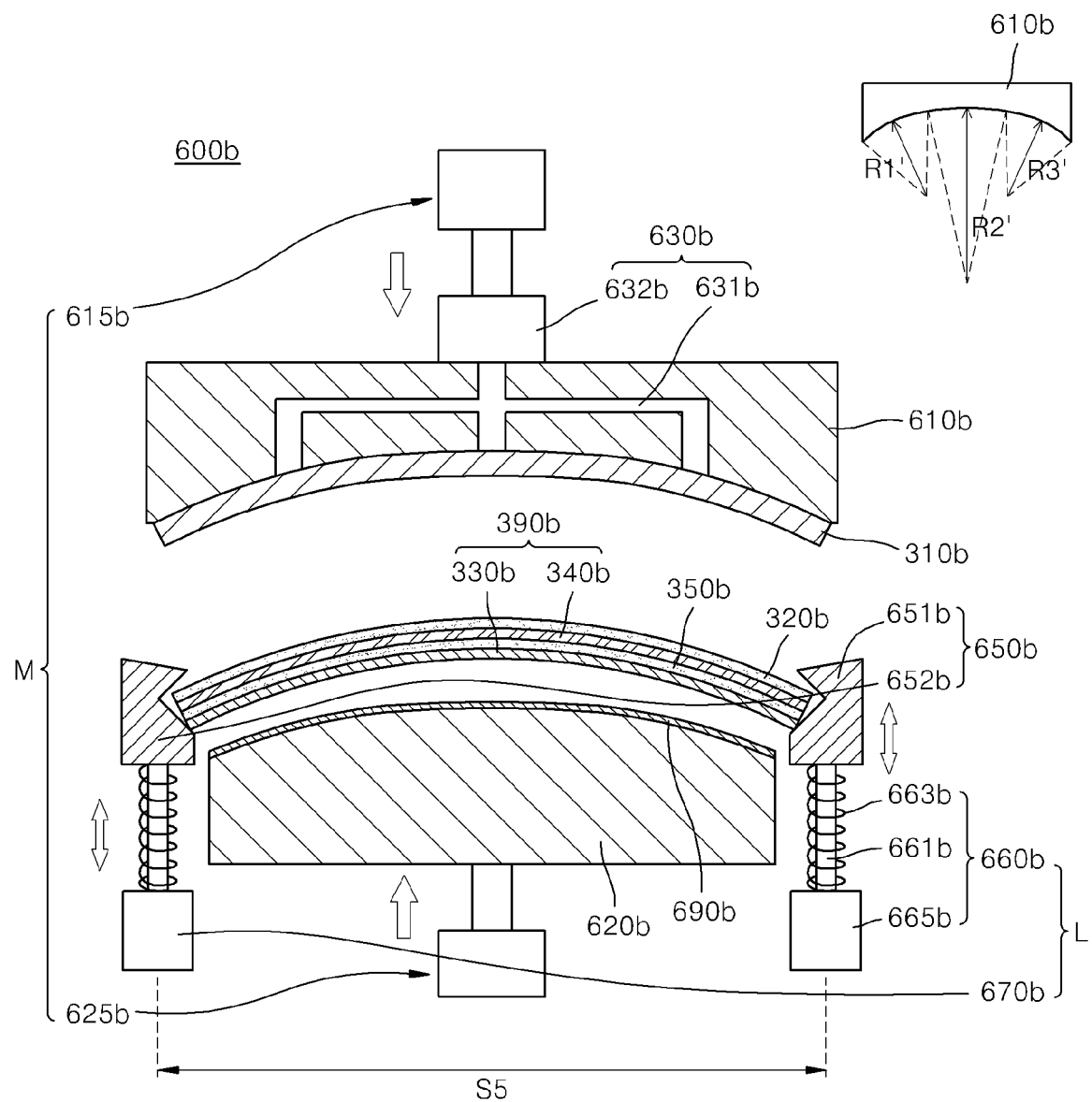
FIG. 22 is a cross-sectional view illustrating an apparatus for manufacturing the display device of FIG. 19, according to yet another embodiment of the present invention.

FIG. 22 is a cross-sectional view illustrating an apparatus 600b for manufacturing the display device 300b of FIG. 19, according to yet another embodiment of the present invention.

Referring to FIG. 22, the apparatus 600b includes a first jig 610b, a second jig 620b, a driving unit M, a clamping unit 650b, a fixing unit (for example, first fixing unit 630b), a linear driving unit L, and a cushion unit 690b. The first jig 610b, the second jig 620b, the linear driving unit L, the clamping unit 650b, the fixing unit, and the cushion unit 690b may be substantially the same as those described above, and thus a detailed description thereof will not be repeated.

The driving unit M may include a first driving unit 615b and a second driving unit 625b, and the fixing unit may include a first fixing unit 630b. The first driving unit 615b, the second driving unit 625b, and the first fixing unit 630b may be substantially the same as those described above, and thus a detailed description thereof will not be repeated. In particular, the first fixing unit 630b may include a first absorption pump 632b and a first absorption unit 631b.

The clamping unit 650b may include a first clamping unit 651b and a second clamping unit 652b. The first clamping unit 651b and the second clamping unit 652b may be substantially the same as those described above, and thus a detailed description thereof will not be repeated.

The apparatus 600b may include a linear driving unit L that includes a first linear driving unit 660b and a second linear driving unit 670b that respectively vertically move the first clamping unit 651b and the second clamping unit 652b. The first linear driving unit 660b and the second linear driving unit 670b may be formed similarly, and thus the following description will focus on the first linear driving unit 660b.

The first linear driving unit 660b may include a first shaft 661b that is connected to the first clamping unit 651b and linearly moves the first clamping unit 651b. In addition, the first linear driving unit 660b may include a first driving module 665b that drives the first shaft 661b. The first driving module 665b may include a cylinder or a motor. For convenience of description, however, it will be assumed that the first driving module 665b includes a motor. It will be further assumed that the first shaft 661b includes a ball screw that is lowered or raised as the first driving module 665b rotates.

The first linear driving unit 660b may include a first elastic unit 663b that surrounds the first shaft 661b. The first elastic unit 663b may include a compression spring, and may be formed of an elastic material such as rubber. For convenience of description, however, it will be assumed that the first elastic unit 663b includes a compression spring.

The first elastic unit 663b may surround an outer surface of the first shaft 661b as described above and thus may provide a restoring force to the first clamping unit 651b when the first clamping unit 651b moves.

A method of manufacturing the display device 300b by using the apparatus 600b will be described. The cover window 310b and the panel member 390b may be manufactured and prepared. The panel member 390b may include at least one of the display panel 330b or the TSP 340b as described above. However, for convenience of description, it will be assumed that the panel member 390b includes both the display panel 330b and the TSP 340b.

The display panel 330b and the TSP 340b may be attached by using the second adhesive layer 350b, and then the first adhesive layer 320b may be formed on the TSP 340b. Respective ends of the display panel 330b and the TSP 340b on which the first adhesive layer 320b is formed may be fixed to the first clamping unit 651b and the second clamping unit 652b.

Once the panel member 390b is fixed to the first clamping unit 651b and the second clamping unit 652b, one portion of the panel member 390b may be curved upward (for example, with respect to a gravity direction). In further detail, since a distance S5 between the first clamping unit 651b and the second clamping unit 652b is less than at least one of a width or a length of the panel member 390b, the upwardly curved portion may protrude toward the first jig 610b. In this case, it will be assumed that the distance S5 between the first clamping unit 651b and the second clamping unit 652b is less than a width of the panel member 390b.

After the panel member 390b is disposed in this manner, the panel member 390b and the cover window 310b may be compressed against each other by moving at least one of the first jig 610b or the second jig 620b. For convenience of description, however, it will be assumed that the panel member 390b and the cover window 310b are compressed by moving both the first jig 610b and the second jig 620b.

While the first jig 610b and the second jig 620b move in this manner, the first linear driving unit 660b and the second linear driving unit 670b may operate to vertically move the first clamping unit 651b and the second clamping unit 652b. In particular, the first clamping unit 651b and the second clamping unit 652b may move at a speed similar to a speed at which the second jig 620b moves.

When the second jig 620b, the first clamping unit 651b, and the second clamping unit 652b are raised in this manner, the panel member 390b may be raised while maintaining its curved state. When a distance between the first jig 610b and the second jig 620b reaches a set distance (for example, a predetermined distance), the first clamping unit 651b and the second clamping unit 652b may release from (for example, reduce their clamping force from) the panel member 390b.

During or after this releasing of the first clamping unit 651b and the second clamping unit 652b, the first linear driving unit 660b and the second linear driving unit 670b may lower the first clamping unit 651b and the second clamping unit 652b.

Next, the first driving unit 615b and the second driving unit 625b may continuously operate to bring the first jig 610b and the second jig 620b closer (for example, adjacent) to each other (for example, the second jig 620b may contact panel member 390b). As the first jig 610b and the second jig 620b move closer, the panel member 390b and the cover window 310b may be compressed against each other. A method of compressing the panel member 390b and the cover window 310b may be performed in the same manner as that described above, and thus a detailed description thereof will not be repeated.

In particular, when the cover window 310b and the panel member 390b contact each other, a load range applied when the first jig 610b and the second jig 620b compress the cover window 310b and the panel member 390b may be greater than or equal to 0.3 MPa and less than or equal to 0.5 MPa. When the load range is less than 0.3 MPa, an adhesive force between the cover window 310b and the panel member 390b may be reduced, and the cover window 310b and the panel member 390b may be delaminated and separated from each other. In addition, when the load range exceeds 0.5 MPa and the cover window 310b and the panel member 390b are attached to each other, the cover window 310b and the panel member 390b may be damaged, thereby reducing quality and reliability.

The cushion unit 690b may uniformly distribute a force applied to the cover window 310b and the panel member 390b when the cover window 310b and the panel member 390b are laminated due to compression.

The operation may be performed in a vacuum state. In further detail, the apparatus 600b may include a chamber (see, for example, chamber C in FIG. 4C) in which the first jig 610b, the second jig 620b, the fixing unit, and the driving unit are disposed. In addition, the apparatus 600b may include a pressure adjustment unit that adjusts a pressure in the chamber. The pressure adjustment unit may maintain a pressure in the chamber in a vacuum state when the cover window 310b and the panel member 390b are laminated. In addition, the pressure adjustment unit may restore and maintain a pressure in the chamber in an atmospheric pressure state after the process is completed.

Accordingly, the apparatus 600b may rapidly and accurately manufacture the display device 300b having a curved surface. In particular, the apparatus 600b may reduce or minimize a product defect rate by accurately attaching the panel member 390b and the cover window 310b having a curved surface.

In addition, the apparatus 600b may improve product quality by removing air bubbles that may be generated (or preventing air bubbles from being generated) when the panel member 390b and the cover window 310b are compressed.

Figure 23:
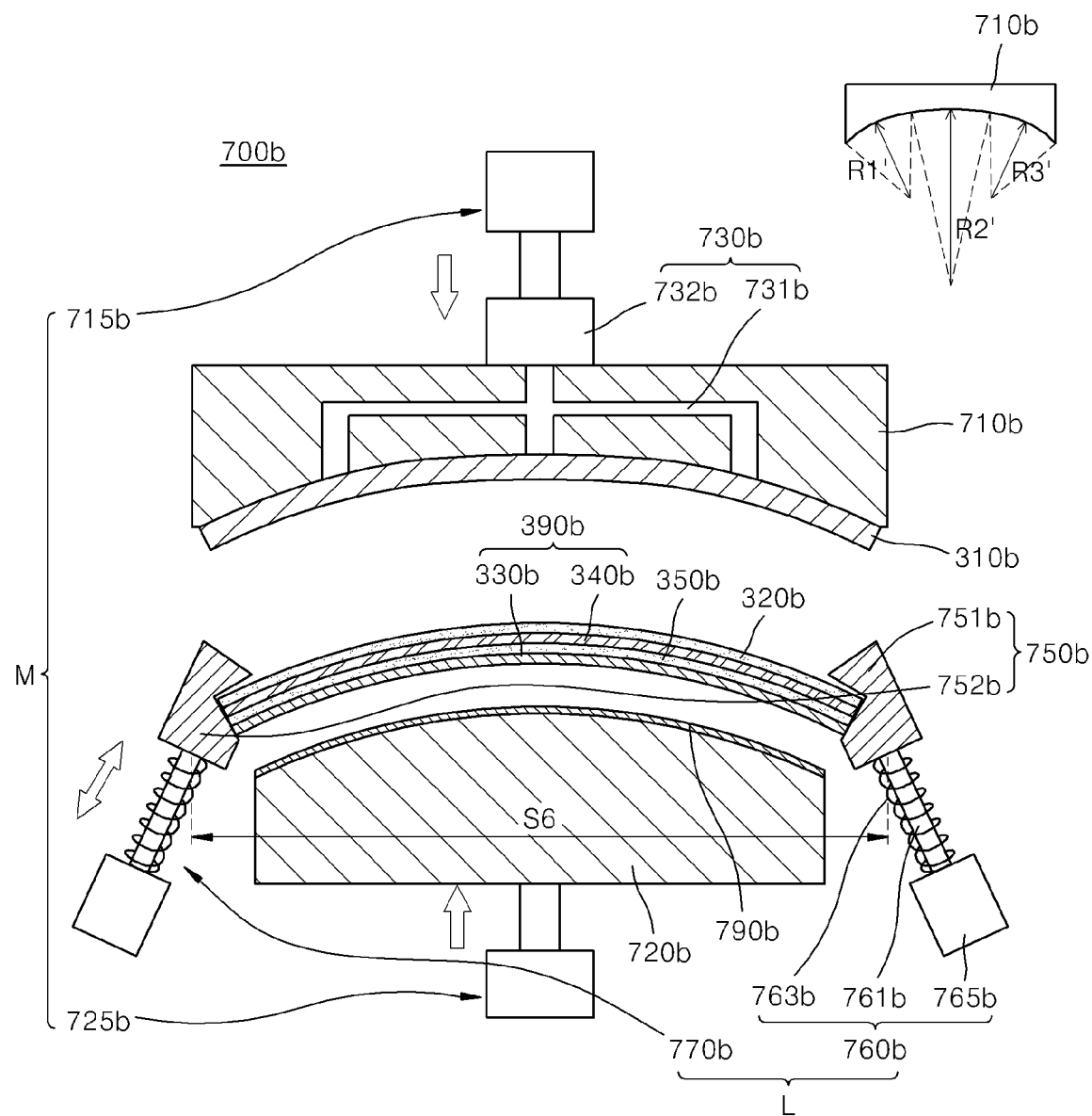
FIG. 23 is a cross-sectional view illustrating an apparatus for manufacturing the display device of FIG. 19, according to still yet another embodiment of the present invention.

FIG. 23 is a cross-sectional view illustrating an apparatus 700b for manufacturing the display device 300b of FIG. 19, according to still yet another embodiment of the present invention.

Referring to FIG. 23, the apparatus 700b may include a first jig 710b, a second jig 720b, a driving unit M, a clamping unit 750b, a fixing unit (for example, first fixing unit 730b), a linear driving unit L, and a cushion unit 790b. The first jig 710b and the second jig 720b may be substantially the same as those described above, and thus a detailed description thereof will not be repeated.

The driving unit M may include a first driving unit 715b and a second driving unit 725b, and the fixing unit may include a first fixing unit 730b. The first driving unit 715b, the second driving unit 725b, and the first fixing unit 730b (which includes first absorption unit 731b and first absorption pump 732b) may be substantially the same as those described above, and thus a detailed description thereof will not be repeated.

In addition, the clamping unit 750b may include a first clamping unit 751b and a second clamping unit 752b. The first clamping unit 751b and the second clamping unit 752b may be substantially the same as those described above, and thus a detailed description thereof will not be repeated.

The linear driving unit L may include a first linear driving unit 760b and a second linear driving unit 770b, and the first linear driving unit 760b and the second linear driving unit 770b may linearly move the first clamping unit 751b and the second clamping unit 752b, respectively. In particular, the first linear driving unit 760b and the second linear driving unit 770b may linearly move the first clamping unit 751b and the second clamping unit 752b in a diagonal direction. Since the second linear driving unit 770b may be formed similarly to the first linear driving unit 760b, the following description will focus on the first linear driving unit 760b.

In further detail, the first linear driving unit 760b may include a first shaft 761b, a first driving module 765b, and a first elastic unit 763b. The first shaft 761b, the first driving module 765b, and the first elastic unit 763b may be formed in a similar manner to those described above (such as the first linear driving unit 760 in FIGS. 12-13). The first shaft 761b is disposed in a diagonal direction to diagonally move the first clamping unit 751b.

In particular, when the first linear driving unit 760b operates, the first driving module 765b may vary a length of the first shaft 761b. Since the first driving module 765b and the first shaft 761b are diagonally disposed with respect to the second jig 720b as described above, the first clamping unit 751b may be diagonally moved by varying the movement of the first shaft 761b.

For example, when the first driving module 765b operates to diagonally move the first shaft 761b downward with respect to the second jig 720b, the first clamping unit 751b may diagonally move downward with respect to the second jig 720b as the first shaft 761b moves.

When the first driving module 765b operates in an opposite direction to diagonally move the first shaft 761b upward with respect to the second jig 720b, the first clamping unit 751b may diagonally move upward with respect to the second jig 720b as the first shaft 761b moves.

The first shaft 761b may include a ball screw as described above and thus may rotate as the first driving module 765b operates. In particular, the first shaft 761b may diagonally move downward or upward with respect to the second jig 720b as the first driving module 765b rotates.

The cushion unit 790b may be formed in various ways. For example, the cushion unit 790b may be provided on an outer surface of at least one of the first jig 710b or the second jig 720b. For ease of description, it will be assumed that the cushion unit 790b is formed on an entire outer surface of the second jig 720b.

A method of manufacturing the display device 300b may be similar to that described above. In further detail, the panel member 390b and the cover window 310b may be manufactured and prepared. The panel member 390b may include the display panel 330b and the TSP 340b as described above. However, for convenience of description, it will be assumed that the panel member 390b includes both the display panel 330b and the TSP 340b.

When the display panel 330b and the TSP 340b are completely manufactured as described above, the display panel 330b and the TSP 340b may be adhered by using the second adhesive layer 350b, and the first adhesive layer 320b may be coated on the TSP 340b.

The panel member 390b manufactured as described above may be fixed by the first clamping unit 751b and the second clamping unit 752b. In further detail, since a distance S6 between the first clamping unit 751b and the second clamping unit 752b is less than at least one of a width or a length of the panel member 390b, an upwardly curved portion of the panel member 390b may protrude toward the first jig 710b. In this case, it will be assumed that the distance S6 between the first clamping unit 751b and the second clamping unit 752b is less than a width of the panel member 390b. When the fixing is completed, the panel member 390b and the cover window 310b may be compressed against each other by moving at least one of the first jig 710b or the second jig 720b. A method of compressing the panel member 390b and the cover window 310b may be similar to that described above, and thus a detailed description thereof will not be repeated.

When the first jig 710b and the second jig 720b move in this manner, the first clamping unit 751b and the second clamping unit 752b may also move. In particular, the first clamping unit 751b and the second clamping unit 752b may be diagonally moved by the first linear driving unit 760b and the second linear driving unit 770b, respectively. The first clamping unit 751b and the second clamping unit 752b may be raised diagonally.

When the first clamping unit 751b and the second clamping unit 752b are raised and then an interval between the first jig 710b and the second jig 720b reaches a preset interval, both ends of the panel member 390b may be released. The panel member 390b may be sequentially adhered to the cover window 310b beginning from a protruding portion toward both end portions.

After the releasing of the first clamping unit 751b and the second clamping unit 752b, the first linear driving unit 760b and the second linear driving unit 770b may operate to lower the first clamping unit 751b and the second clamping unit 752b. The first clamping unit 751b and the second clamping unit 752b may be lowered diagonally.

While the first clamping unit 751b and the second clamping unit 752b are lowered, the first jig 710b and the second jig 720b may get closer to each other to compress the panel member 390b and the cover window 310b. In this case, a method of adhering the panel member 390b and the cover window 310b through compression may be similar to that described above.

When the panel member 390b and the cover window 310b are compressed by moving the first jig 710b and the second jig 720b as described above, the cushion unit 790b may distribute a force applied to the panel member 390b and the cover window 310b. In addition, the cushion unit 790b may help prevent the panel member 390b or the cover window 310b from being damaged by absorbing part of a force applied to the panel member 390b and the cover window 310b.

In particular, when the cover window 310b and the display panel 330b contact each other, a load range applied when the first jig 710b and the second jig 720b compress the cover window 310b and the panel member 390b may be greater than or equal to 0.3 MPa and less than or equal to 0.5 MPa. When the load range is less than 0.3 MPa, an adhesive force between the cover window 310b and the panel member 390b may be reduced, and the cover window 310b and the panel member 390b may be delaminated and separated from each other. In addition, when the load range exceeds 0.5 MPa and the cover window 310b and the panel member 390b are attached to each other, the cover window 310b and the panel member 390b may be damaged, thereby reducing quality and reliability.

The operation may be performed in a vacuum state. In further detail, the apparatus 700b may include a chamber (see, for example, chamber C in FIG. 4C) in which the first jig 710b, the second jig 720b, the fixing unit, and the driving unit M are disposed. In addition, the apparatus 700b may include a pressure adjustment unit that adjusts a pressure in the chamber. The pressure adjustment unit may maintain a pressure in the chamber in a vacuum state when the cover window 310b and the panel member 390b are laminated. In addition, the pressure adjustment unit may restore and maintain a pressure in the chamber in an atmospheric pressure state after the process is completed.

Accordingly, the apparatus 700b may manufacture the display device 300b having a curved surface. In particular, the apparatus 700b may reduce or minimize a product defect rate by accurately attaching the display panel 330b and the cover window 310b having a curved surface.

In addition, the apparatus 700b may improve quality by removing air bubbles or preventing air bubbles from being generated after the display panel 330b and the curved portions are compressed.

Figure 24:
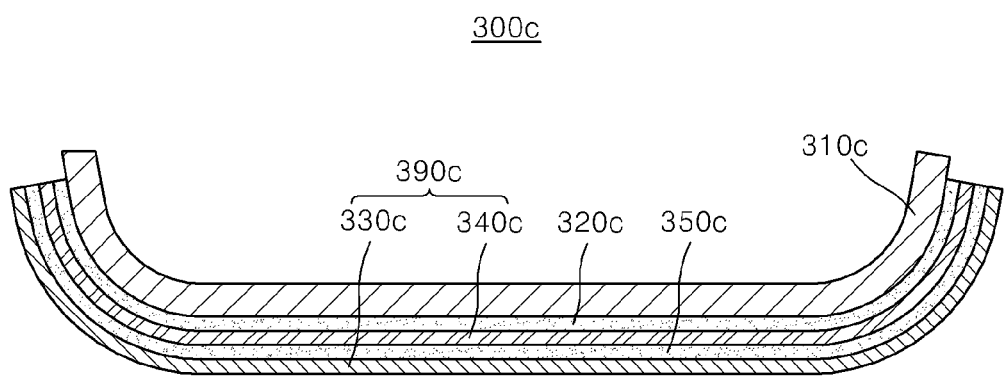
FIG. 24 is a cross-sectional view illustrating a display device according to still another embodiment of the present invention.

FIG. 24 is a cross-sectional view illustrating a display device 300c according to still another embodiment of the present invention.

Referring to FIG. 24, the display device 300c may include a cover window 310c and a panel member 390c. The panel member 390c may include at least one of a TSP 340c or a display panel 330c. However, for convenience of description, it will be assumed that the panel member 390c includes both the TSP 340c and the display panel 330c.

The panel member 390c may include a first adhesive layer 320c, the TSP 340c, a second adhesive layer 350c, and the display panel 330c. In particular, the first adhesive layer 320c, the TSP 340c, the second adhesive layer 350c, and the display panel 330c are the same as or similar to those described above, and thus a detailed description thereof will not be repeated.

At least a portion of the cover window 310c may be curved. In further detail, a middle portion of the cover window 310c may be flat and both ends of the middle portion may be curved. The cover window 310c may be formed of a glass material or a plastic material as described above. In particular, the cover window 310c may be formed such that a surface to which the display panel 330c is attached and on which an image or text is displayed is concave.

In the display device 300c formed as described above, the cover window 310c, the TSP 340c, and the display panel 330c may be adhered and fixed by the first adhesive layer 320c and the second adhesive layer 350c.

The TSP 340c and the display panel 330c may be attached to a protruding outer surface of the cover window 310c. In further detail, the TSP 340c and the display panel 330c may be provided on a protruding portion, instead of a recessed portion, of the curved cover window 310c.

Accordingly, the display device 300c shaped as described above may be applied to various members.

Figure 25:
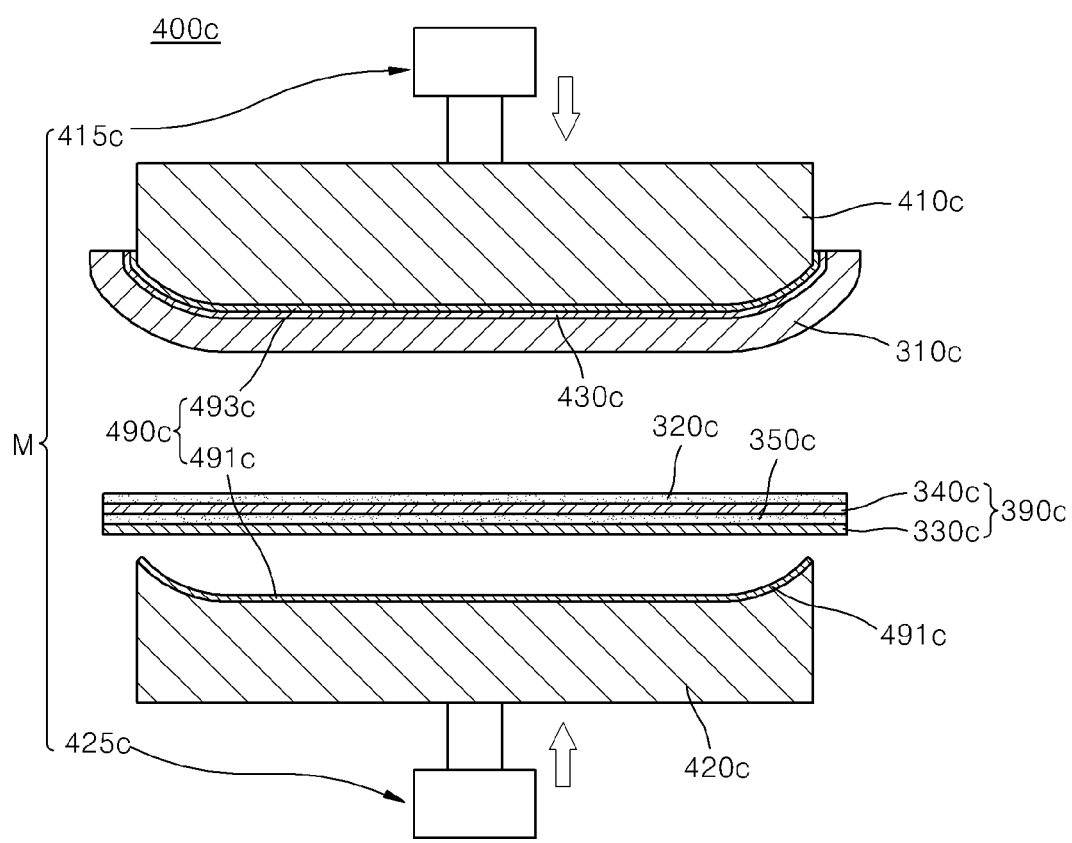
FIG. 25 is a cross-sectional view illustrating an apparatus for manufacturing the display device of FIG. 24, according to an embodiment of the present invention.

FIG. 25 is a cross-sectional view illustrating an apparatus 400c for manufacturing the display device 300c of FIG. 24, according to an embodiment of the present invention.

Referring to FIG. 25, the apparatus 400c may include a first jig 410c, a second jig 420c, a driving unit M, a fixing unit (for example, first fixing unit 430c), and a cushion unit 490c. At least a portion of the first jig 410c may be formed equally or similarly to an outer surface of the cover window 310c. In further detail, an outer surface of the first jig 410c on which the cover window 310c is seated may be the same as or similar in shape to an outer surface of the cover window 310c seated on the outer surface of the first jig 410c. In particular, the first jig 410c may protrude toward the second jig 420c.

An outer surface of the second jig 420c may be recessed away from the first jig 410c to correspond to or engage with a protruding portion of the first jig 410c.

The driving unit M may include a first driving unit 415c and a second driving unit 425c. The first driving unit 415c may linearly move the first jig 410c toward the second jig 420c, and the second driving unit 425c may linearly move the second jig 420c toward the first jig 410c. The first driving unit 415c and the second driving unit 425c may be formed in the same manner as or a similar manner to those described above.

In addition, the fixing unit may include a first fixing unit 430c provided on the first jig 410c and a second fixing unit provided on the second jig 420c. For convenience of description, it will be assumed that the fixing unit includes the first fixing unit 430c. In addition, the first fixing unit 430c and the second fixing unit may be formed in the same manner or a similar manner, and thus a detailed description of the second fixing unit will not be given.

The first fixing unit 430c may be formed in various ways. For example, the first fixing unit 430c may include an adhesive member, an adhesive chuck, or an electrostatic chuck. In addition, the first fixing unit 430c may include a first absorption unit, and a first absorption pump that is connected to the first absorption unit as described above. In particular, the first fixing unit 430c is not limited thereto, and may include a clamp, or a protrusion that is provided on the first jig 410c and mechanically restricts the cover window 310c. However, for convenience of description, it will be assumed that the first fixing unit 430c includes an adhesive member and is provided on an outer surface of a first cushion unit 493c.

The cushion unit 490c may be provided on at least one of the first jig 410c or the second jig 420c. A size of the cushion unit 490c may be less than a size of at least one of the cover window 310c or the panel member 390c. In further detail, the cushion unit 490c may be disposed only on a contact portion with at least one of the cover window 310c or the panel member 390c, and may be disposed to extend beyond the contact portion. The cushion unit 490c may be the same as or similar to that described above, and thus a detailed description thereof will not be repeated.

The cushion unit 490c may include the first cushion unit 493c that is provided on a surface of the first jig 410c, and a second cushion unit 491c that is provided on a surface of the second jig 420c. The first cushion unit 493c and the second cushion unit 491c may be integrally formed and respectively provided on the first jig 410c and the second jig 420c. In addition, a plurality of the first cushion units 493c and the second cushion units 491c may be formed, and the plurality of first cushion units 493c and the plurality of second cushion units 491c may be provided on an outer surface of the first jig 410c and an outer surface of the second jig 420c, respectively, and spaced apart from each other. However, for convenience of description, it will be assumed that the first cushion unit 493c and the second cushion unit 491c are respectively provided on the first jig 410c and the second jig 420c.

A method of manufacturing the display device 300c by using the apparatus 400c will now be described. First, the cover window 310c and the panel member 390c may be manufactured and prepared. In this case, a method of manufacturing the cover window 310c is similar to that described above, and thus a detailed description thereof will not be repeated. In addition, the TSP 340c and the display panel 330c may be adhered to each other by using the second adhesive layer 350c.

After the cover window 310c and the panel member 390c are manufactured and prepared as described above, the cover window 310c may be disposed on the first jig 410c. The cover window 310c may be adhered and fixed to the first fixing unit 430c. In particular, a size of the first fixing unit 430c may be less than a size of the cover window 310c.

While the process is performed, the TSP 340c and the display panel 330c adhered by using the second adhesive layer 350c may be disposed on the second jig 420c. The display panel 330c may be disposed to face the second jig 420c, and the TSP 340c may be disposed to face the first jig 410c.

After the TSP 340c and the display panel 330c are disposed as described above, the first adhesive layer 320c may be coated on the TSP 340c. The first adhesive layer 320c may be formed of the same material as or a similar material to that of the second adhesive layer 350c.

When the panel member 390c is completely disposed as described above, the first jig 410c and the second jig 420c may be moved toward each other by driving the first driving unit 415c and the second driving unit 425c.

In particular, when the cover window 310c and the panel member 390c contact each other, a load range applied when the first jig 410c and the second jig 420c compress the cover window 310c and the panel member 390c may be greater than or equal to 0.3 MPa and less than or equal to 0.5 MPa. When the load range is less than 0.3 MPa, an adhesive force between the cover window 310c and the panel member 390c may be reduced, and the cover window 310c and the panel member 390c may be delaminated and separated from each other. In addition, when the load range exceeds 0.5 MPa and the cover window 310c and the panel member 390c are attached to each other, the cover window 310c and the panel member 390c may be damaged, thereby reducing quality and reliability.

While the process is performed, the first cushion unit 493c and the second cushion unit 491c may uniformly distribute a force applied to the cover window 310c, the TSP 340c, and the display panel 330c.

When the process is completed, the first driving unit 415c and the second driving unit 425c may operate to separate the first jig 410c and the second jig 420c. The operator may complete an operation by removing the completed display device 300c from the first jig 410c or the second jig 420c.

The operation may be performed in a vacuum state. In further detail, the apparatus 400c may include a chamber (see, for example, chamber C in FIG. 4C) in which the first jig 410c, the second jig 420c, the fixing unit, and the driving unit M are disposed. In addition, the apparatus 400c may include a pressure adjustment unit that adjusts a pressure in the chamber. The pressure adjustment unit may maintain a pressure in the chamber in a vacuum state when the cover window 310c and the panel member 390c are laminated. In addition, the pressure adjustment unit may restore and maintain a pressure in the chamber in an atmospheric pressure state after a lamination process is completed.

Accordingly, the apparatus 400c may manufacture any type of display device 300c. In addition, the apparatus 400c may reduce or minimize a product defect rate by effectively removing vapors or preventing vapors from being generated between the cover window 310c and the panel member 390c when the cover window 310c and the panel member 390c are laminated.

Figure 26:
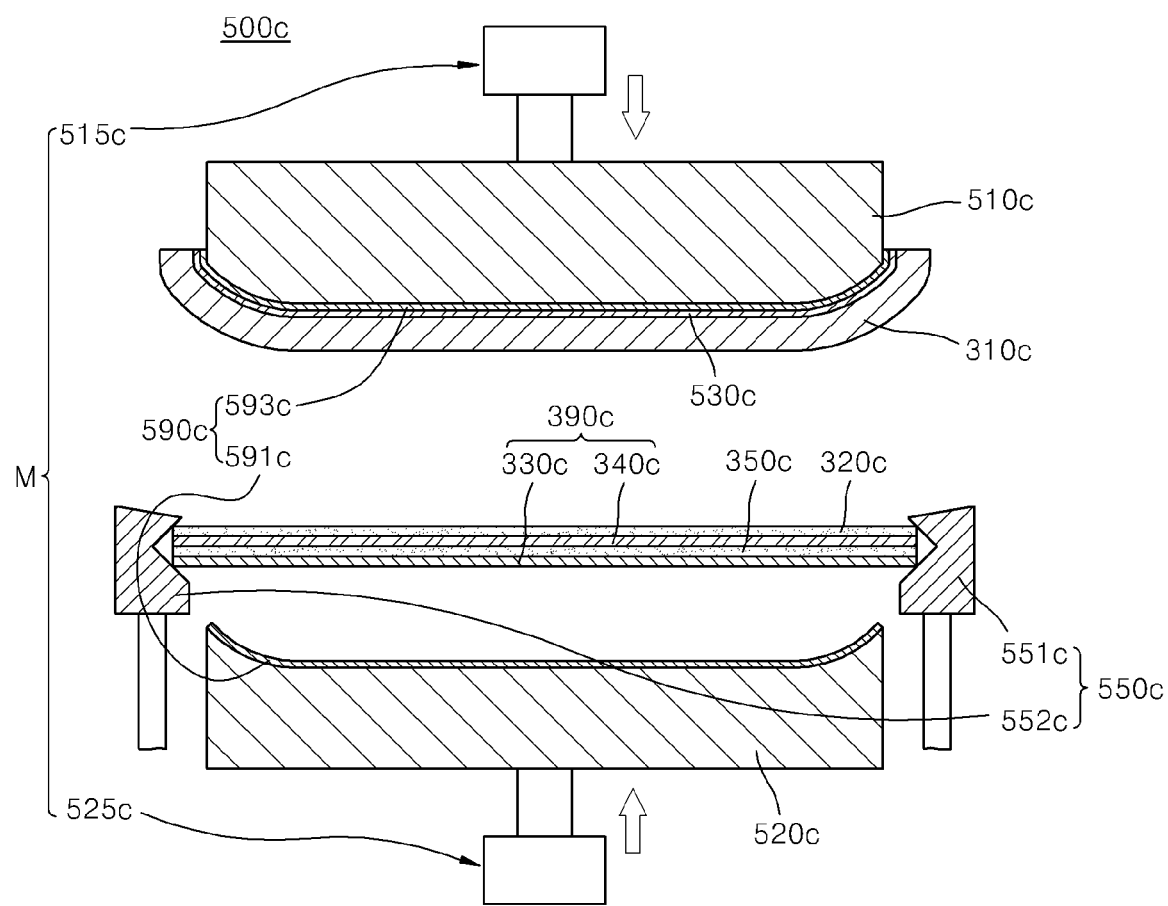
FIG. 26 is a cross-sectional view illustrating an apparatus for manufacturing the display device of FIG. 24, according to another embodiment of the present invention.

FIG. 26 is a cross-sectional view illustrating an apparatus 500c for manufacturing the display device 300c of FIG. 24, according to another embodiment of the present invention.

Referring to FIG. 26, the apparatus 500c may include a first jig 510c, a second jig 520c, a driving unit M, a fixing unit (for example, first fixing unit 530c), a cushion unit 590c, and a clamping unit 550c. In this case, the first jig 510c, the second jig 520c, the driving unit M, the fixing unit, and the cushion unit 590c (including a first cushion unit 593c and a second cushion unit 591c) are the same as or similar to those described above, and thus a detailed description thereof will not be repeated.

The clamping unit 550c may include a first clamping unit 551c and a second clamping unit 552c. The first clamping unit 551c and the second clamping unit 552c may be disposed to face each other on a side surface of the first jig 510c or the second jig 520c. However, for convenience of description, it will be assumed that the first clamping unit 551c and the second clamping unit 552c are disposed to face each other on a side surface of the second jig 520c. In addition, the first clamping unit 551c and the second clamping unit 552c are formed in the same or similar manner as those described above, and thus a detailed description thereof will not be repeated.

A method of manufacturing the display device 300c by using the apparatus 500c will now be described. First, the cover window 310c and the panel member 390c may be manufactured and prepared. In this case, a method of manufacturing the cover window 310c is similar to that described above, and thus a detailed description thereof will not be repeated. In addition, the TSP 340c and the display panel 330c may be adhered by using the second adhesive layer 350c.

After the cover window 310c and the panel member 390c are manufactured and prepared as described above, the cover window 310c may be disposed on the first jig 510c. The cover window 310c may be adhered and fixed by a first fixing unit 530c.

While the process is performed, the TSP 340c and the display panel 330c adhered by using the second adhesive layer 350c as described above may be disposed on the second jig 520c. The display panel 330c may be disposed to face the second jig 520c, and the TSP 340c may be disposed to face the first jig 510c. In particular, the display panel 330c and the TSP 340c may be stacked, and an end of the display panel 330c and an end of the TSP 340c may be fixed by being inserted into the first clamping unit 551c and the second clamping unit 552c.

After the TSP 340c and the display panel 330c are disposed as described above, the first adhesive layer 320c may be coated on the TSP 340c. The first adhesive layer 320c may be formed of the same or similar material as that of the second adhesive layer 350c.

When the cover window 310c, the TSP 340c, and the display panel 330c are completely disposed as described above, the first jig 510c and the second jig 520c may be moved toward each other by driving a first driving unit 515c and a second driving unit 525c. A flat portion of the cover window 310c may first contact the first adhesive layer 320c, and curved ends of the cover window 310c may sequentially contact the first adhesive layer 320c to be laminated.

In particular, when the cover window 310c and the panel member 390c contact each other as described above, a load range applied when the first jig 510c and the second jig 520c compress the cover window 310c and the panel member 390c may be greater than or equal to 0.3 MPa and less than or equal to 0.5 MPa. When the load range is less than 0.3 MPa, an adhesive force between the cover window 310c and the panel member 390c may be reduced, and the cover window 310c and the panel member 390c may be delaminated and separated from each other. In addition, when the load range exceeds 0.5 MPa and the cover window 310c and the panel member 390c are attached to each other, the cover window 310c and the panel member 390c may be damaged, thereby reducing quality and reliability.

In addition, when the first jig 510c and the second jig 520c move as described above, the TSP 340c and the display panel 330c may be fixed while the first clamping unit 551c and the second clamping unit 552c do not move.

While the process is performed, the first cushion unit 593c and the second cushion unit 591c may uniformly distribute a force applied to the cover window 310c, the TSP 340c, and the display panel 330c.

When the process is completed, the first driving unit 515c and the second driving unit 525c may operate to separate the first jig 510c and the second jig 520c. The operator may complete an operation by removing the completed display device 300c from the first jig 510c or the second jig 520c.

The operation may be performed in a vacuum state. In further detail, the apparatus 500c may include a chamber (see, for example, chamber C in FIG. 4C) in which the first jig 510c, the second jig 520c, the fixing unit, and the driving unit M are disposed. In addition, the apparatus 500c may include a pressure adjustment unit for adjusting a pressure in the chamber. The pressure adjustment unit may maintain a pressure in the chamber in a vacuum state when the cover window 310c and the panel member 390c are laminated. In addition, the pressure adjustment unit may restore and maintain a pressure in the chamber in an atmospheric pressure state after the process is completed.

Accordingly, the apparatus 500c may manufacture any type of display device 300c. In addition, the apparatus 500c may reduce or minimize a product defect rate by effectively removing vapors or preventing vapors from being generated between the cover window 310c and the panel member 390c when the cover window 310c and the panel member 390c are laminated.

Figure 27:
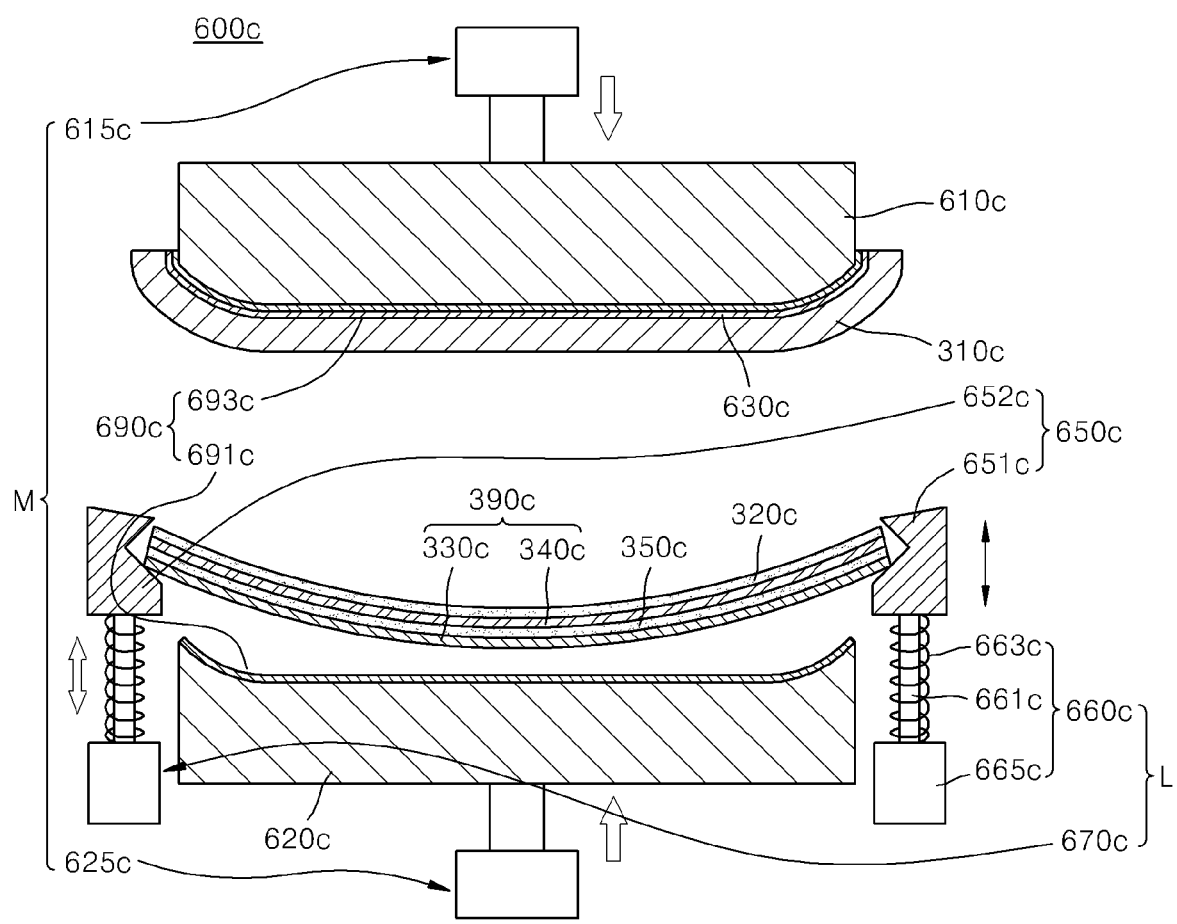
FIG. 27 is a cross-sectional view illustrating an apparatus for manufacturing the display device of FIG. 24, according to yet another embodiment of the present invention.

FIG. 27 is a cross-sectional view illustrating an apparatus 600c for manufacturing the display device 300c of FIG. 24, according to yet another embodiment of the present invention.

Referring to FIG. 27, the apparatus 600c may include a first jig 610c, a second jig 620c, a driving unit M, a fixing unit (for example, first fixing unit 630c), a cushion unit 690c, a clamping unit 650c, and a linear driving unit L. In this case, the first jig 610c, the second jig 620c, the driving unit M, the fixing unit, the cushion unit 690c (including a first cushion unit 693c and a second cushion unit 691c), and the clamping unit 650c are the same as or similar to those described above, and thus a detailed description thereof will not be repeated.

The linear driving unit L may include a first linear driving unit 660c that is provided on a first clamping unit 651c and linearly moves the first clamping unit 651c, and a second linear driving unit 670c that is provided on a second clamping unit 652c and linearly moves the second clamping unit 652c. In particular, the first linear driving unit 660c and the second linear driving unit 670c may respectively linearly move the first clamping unit 651c and the second clamping unit 652c in the same direction as a direction in which the second jig 620c moves (e.g., in a moving direction of the second jig 620c). The first linear driving unit 660c and the second linear driving unit 670c may be formed in the same or similar manner. For convenience of description, the following description will focus on the first linear driving unit 660c.

The first linear driving unit 660c may include a first shaft 661c that is connected to the first clamping unit 651c and linearly moves. In addition, the first linear driving unit 660c may include a first driving module 665c that drives the first shaft 661c. The first driving module 665c may be formed to include a cylinder or a motor. However, for convenience of description, it will be assumed that the first driving module 665c includes a motor. In addition, it will be assumed that the first shaft 661c includes a ball screw that is raised and lowered as the first driving module 665c rotates.

The first linear driving unit 660c may include a first elastic unit 663c that surrounds the first shaft 661c. The first elastic unit 663c may include a compression spring, or may be formed of an elastic material such as rubber. However, for convenience of description, it will be assumed that the first elastic unit 663c includes a compression spring.

The first elastic unit 663c may be disposed to surround an outer surface of the first shaft 661c as described above, and thus may provide a restoring force to the first clamping unit 651c when the first clamping unit 651c moves.

A method of manufacturing the display device 300c by using the apparatus 600c will now be described. First, the cover window 310c and the panel member 390c may be manufactured and prepared. In this case, a method of manufacturing the cover window 310c is similar to that described above, and thus a detailed description thereof will not be repeated. In addition, the TSP 340c and the display panel 330c may be adhered to each other by using the second adhesive layer 350c.

After the cover window 310c and the panel member 390c are manufactured and prepared as described above, the cover window 310c may be disposed on the first jig 610c. The cover window 310c may be adhered and fixed by the first fixing unit 630c. In addition, the cover window 310c may be disposed such that a protruding portion faces the second jig 620c.

While the process is performed, the TSP 340c and the display panel 330c adhered by using the second adhesive layer 350c as described above may be disposed on the second jig 620c. The display panel 330c may be disposed to face the second jig 620c, and the TSP 340c may be disposed to face the first jig 610c. In particular, the display panel 330c and the TSP 340c may be stacked, and an end of the display panel 330c and an end of the TSP 340c may be fixed by being inserted into the first clamping unit 651c and the second clamping unit 652c. In addition, a central portion of the display panel 330c and a central portion of the TSP 340c may be disposed adjacent to a recessed portion of the second jig 620c, or may be disposed adjacent to the cover window 310c. However, for convenience of description, it will be assumed that a central portion of the display panel 330c and a central portion of the TSP 340c are disposed adjacent to a recessed portion of the second jig 620c.

After the TSP 340c and the display panel 330c are disposed as described above, the first adhesive layer 320c may be coated on the TSP 340c. The first adhesive layer 320c may be formed of the same or similar material as that of the second adhesive layer 350c. In another embodiment, the first adhesive layer 320c may be coated on the TSP 340c before the display panel 330c and the TSP 340c are disposed on the first clamping unit 651c and the second clamping unit 652c.

When the cover window 310c, the TSP 340c, and the display panel 330c are completely disposed as described above, the first jig 610c and the second jig 620c may be moved toward each other by driving a first driving unit 615c and a second driving unit 625c. The cover window 310c and the panel member 390c may sequentially contact and laminated beginning from a flat portion of the cover window 310c toward both ends of the panel member 390c.

In particular, when the cover window 310c and the panel member 390c contact each other, a load range applied when the first jig 610c and the second jig 620c compress the cover window 310c and the panel member 390c may be greater than or equal to 0.3 MPa and less than or equal to 0.5 MPa. When the load range is less than 0.3 MPa, an adhesive force between the cover window 310c and the panel member 390c may be reduced, and the cover window 310c and the panel member 390c may be delaminated and separated from each other. In addition, when the load range exceeds 0.5 MPa and the cover window 310c and the panel member 390c are attached to each other, the cover window 310c and the panel member 390c may be damaged, thereby reducing quality and reliability.

In addition, when the first jig 610c and the second jig 620c move as described above, the first clamping unit 651c and the second clamping unit 652c may fix the TSP 340c and the display panel 330c while linearly moving as the first jig 610c and the second jig 620c move. The first linear driving unit 660c and the second linear driving unit 670c may be controlled based on a linear movement of at least one of the first jig 610c or the second jig 620c.

While the process is performed, the first cushion unit 693c and the second cushion unit 691c may uniformly distribute a force applied to the cover window 310c, the TSP 340c, and the display panel 330c.

When the process is completed, the first driving unit 615c and the second driving unit 625c may operate to separate the first jig 610c and the second jig 620c. The operator may complete an operation by removing the completed display device 300c from the first jig 610c or the second jig 620c.

The operation may be performed in a vacuum state. In further detail, the apparatus 600c may include a chamber (see, for example, chamber C in FIG. 4C) in which the first jig 610c, the second jig 620c, the fixing unit, and the driving unit M are disposed. In addition, the apparatus 600c may include a pressure adjustment unit that adjusts a pressure in the chamber. The pressure adjustment unit may maintain a pressure in the chamber in a vacuum state when the cover window 310c and the panel member 390c are laminated. In addition, the pressure adjustment unit may restore and maintain a pressure in the chamber in an atmospheric pressure state after a process is completed.

Accordingly, the apparatus 600c may manufacture any type of display device 300c. In addition, the apparatus 600c may reduce or minimize a product defect rate by effectively removing vapors or preventing vapors from being generated between the cover window 310c and the panel member 390c when the cover window 310c and the panel member 390c are laminated.

Figure 28:
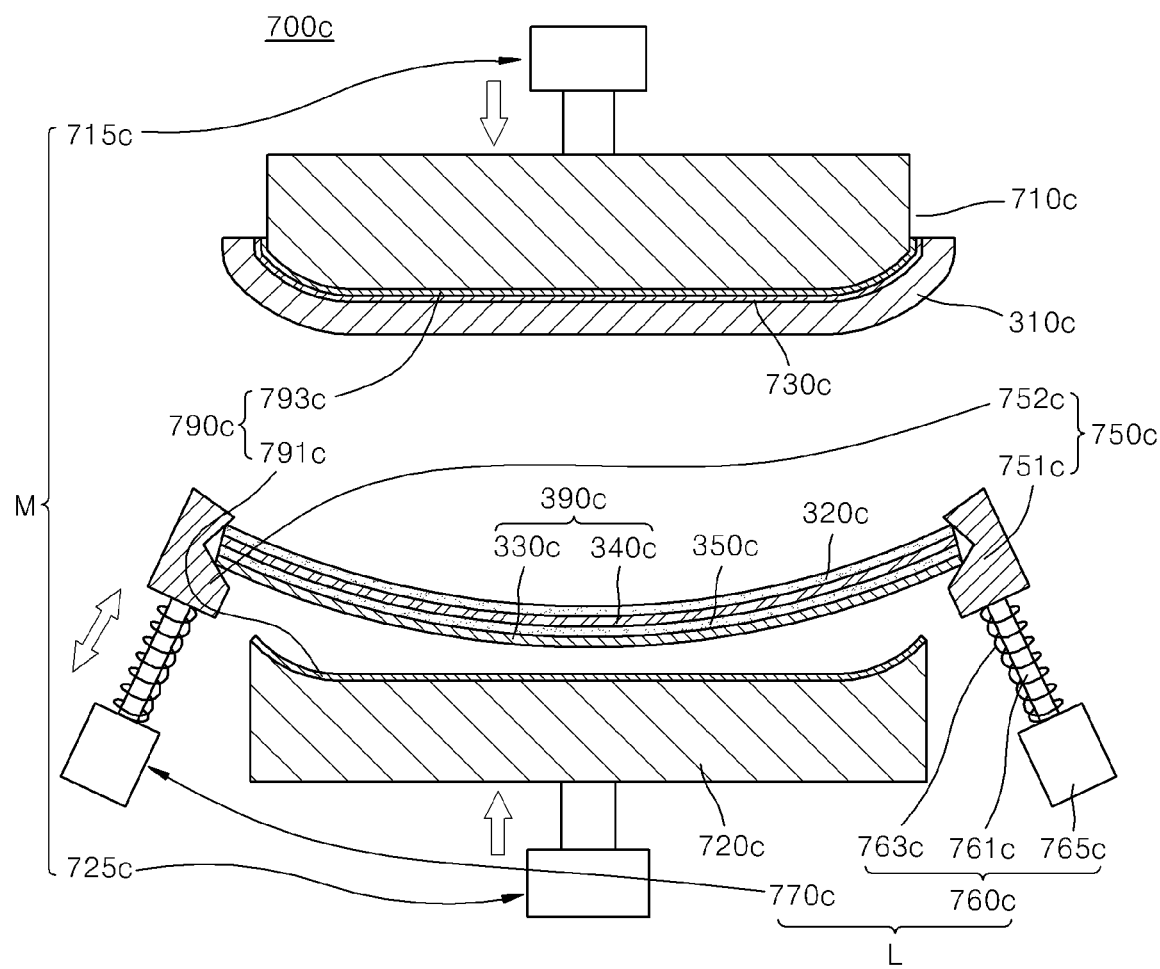
FIG. 28 is a cross-sectional view illustrating an apparatus for manufacturing the display device of FIG. 24, according to still yet another embodiment of the present invention.

FIG. 28 is a cross-sectional view illustrating an apparatus 700c for manufacturing the display device 300c of FIG. 24, according to still yet another embodiment of the present invention.

Referring to FIG. 28, the apparatus 700c may include a first jig 710c, a second jig 720c, a driving unit M, a fixing unit (for example, first fixing unit 730c), a cushion unit 790c, a clamping unit 750c, and a linear driving unit L. In this case, the first jig 710c, the second jig 720c, the driving unit M, the fixing unit, the cushion unit 790c, the clamping unit 750c, and the linear driving unit L are the same as or similar to those described above, and thus a detailed description thereof will not be repeated.

The linear driving unit L may include a first linear driving unit 760c that is provided on a first clamping unit 751c and linearly moves the first clamping unit 751c, and a second linear driving unit 770c that is provided on a second clamping unit 752c and linearly moves the second clamping unit 752c. The first linear driving unit 760c and the second linear driving unit 770c may respectively linearly move the first clamping unit 751c and the second clamping unit 752c in a diagonal direction. In particular, the first linear driving unit 760c and the second linear driving unit 770c may linearly move the first clamping unit 751c and the second clamping unit 752c such that movement directions of the first clamping unit 751c and the second clamping unit 752c form angles with respect to a movement direction of the second jig 720c.

A method of manufacturing the display device 300c by using the apparatus 700c will now be described. First, the cover window 310c and the panel member 390c may be manufactured and prepared. In this case, a method of manufacturing the cover window 310c is similar to that described above, and thus a detailed description thereof will not be repeated. In addition, the TSP 340c and the display panel 330c may be adhered to each other by using the second adhesive layer 350c.

After the cover window 310c and the panel member 390c are manufactured and prepared as described above, the cover window 310c may be disposed on the first jig 710c. The cover window 310c may be adhered and fixed by the first adhesive layer 320c.

While the process is performed, the TSP 340c and the display panel 330c adhered by using the second adhesive layer 350c as described above may be disposed on the second jig 720c. The display panel 330c may be disposed to face the second jig 720c, and the TSP 340c may be disposed to face the first jig 710c. In particular, the display panel 330c and the TSP 340c may be stacked, and an end of the display panel 330c and an end of the TSP 340c may be fixed by being inserted into the first clamping unit 751c and the second clamping unit 752c. The display panel 330c and the TSP 340c may be disposed such that central portions are lower in position than other portions due to the first clamping unit 751c and the second clamping unit 752c.

After the TSP 340c and the display panel 330c are disposed as described above, the first adhesive layer 320c may be coated on the TSP 340c. The first adhesive layer 320c may be formed of the same or similar material as that of the second adhesive layer 350c. In another embodiment, the first adhesive layer 320c may be coated on the TSP 340c before the display panel 330c and the TSP 340c are disposed on the first clamping unit 751c and the second clamping unit 752c as described above.

When the cover window 310c, the TSP 340c, and the display panel 330c are completely disposed as described above, the first jig 710c and the second jig 720c may be moved toward each other by driving a first driving unit 715c and a second driving unit 725c. A flat portion of the cover window 310c may first contact the first adhesive layer 320c, and both end portions of the cover window 310c may sequentially contact the first adhesive layer 320c to be laminated.

In particular, when the cover window 310c and the panel member 390c contact each other, a load range applied when the first jig 710c and the second jig 720c compress the cover window 310c and the panel member 390c may be greater than or equal to 0.3 MPa and less than or equal to 0.5 MPa. When the load range is less than 0.3 MPa, an adhesive force between the cover window 310c and the panel member 390c may be reduced, and the cover window 310c and the panel member 390c may be delaminated and separated from each other. In addition, when the load range exceeds 0.5 MPa and the cover window 310c and the panel member 390c are attached to each other, the cover window 310c and the panel member 390c may be damaged, thereby reducing quality and reliability.

In addition, when the first jig 710c and the second jig 720c move as described above, the first clamping unit 751c and the second clamping unit 752c may fix the TSP 340c and the display panel 330c while linearly moving as the first jig 710c and the second jig 720c move. The first linear driving unit 760c and the second linear driving unit 770c may be controlled based on a linear movement of at least one of the first jig 710c or the second jig 720c.

While the process is performed, a first cushion unit 793c and a second cushion unit 791c may uniformly distribute a force applied to the cover window 310c, the TSP 340c, and the display panel 330c.

When the process is completed, the first driving unit 715c and the second driving unit 725c may operate to separate the first jig 710c and the second jig 720c. The operator may complete an operation by removing the completed display device 300c from the first jig 710c or the second jig 720c.

The operation may be performed in a vacuum state. In further detail, the apparatus 700c may include a chamber (see, for example, chamber C in FIG. 4C) in which the first jig 710c, the second jig 720c, the fixing unit, and the driving unit M are disposed. In addition, the apparatus 700c may include a pressure adjustment unit that adjusts a pressure in the chamber. The pressure adjustment unit may maintain a pressure in the chamber in a vacuum state when the cover window 310c and the panel member 390c are laminated. In addition, the pressure adjustment unit may restore and maintain a pressure in the chamber in an atmospheric pressure state after a process is completed.

Accordingly, the apparatus 700c may manufacture any type of display device 300c. In addition, the apparatus 700c may reduce or minimize a product defect rate by effectively removing vapors or preventing vapors from being generated between the cover window 310c and the panel member 390c when the cover window 310c and the panel member 390c are laminated.

Figure 29:
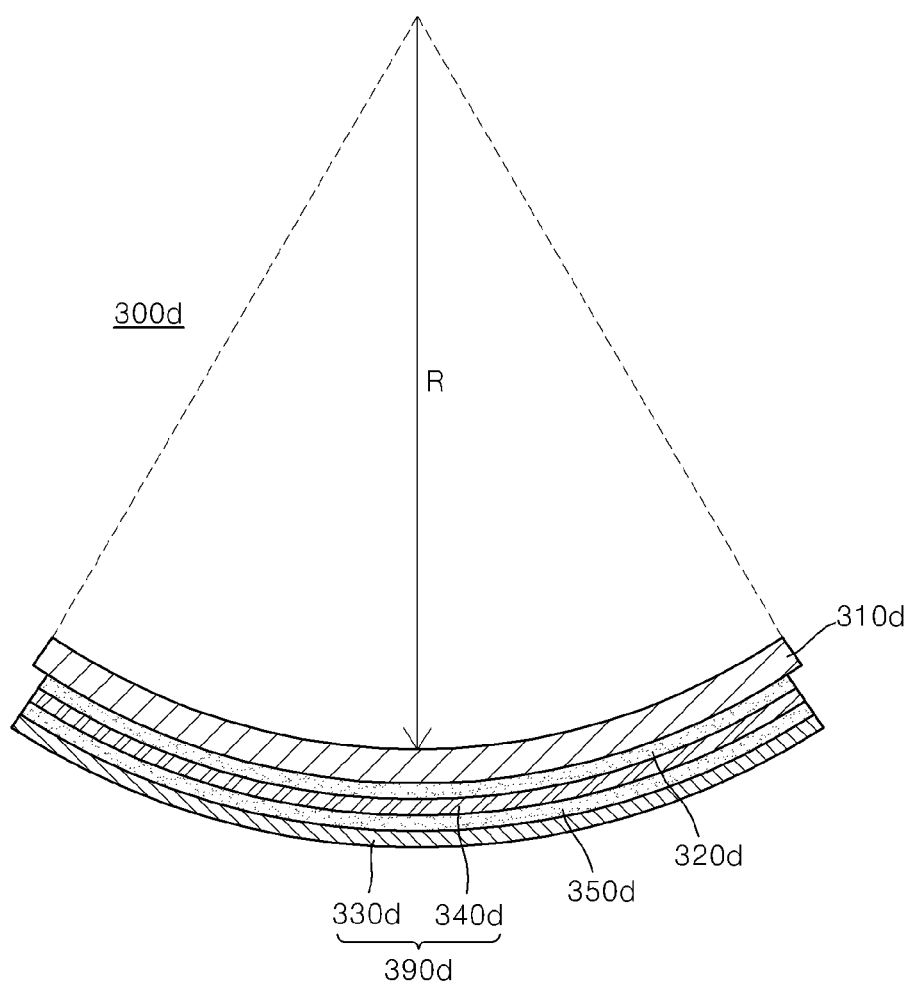
FIG. 29 is a cross-sectional view illustrating a display device according to a sixth embodiment of the present invention.

FIG. 29 is a cross-sectional view illustrating a display device 300d according to a sixth embodiment of the present invention.

Referring to FIG. 29, the display device 300d may include a cover window 310d and a panel member 390d as described above. In addition, the display device 300d may include a first adhesive layer 320d that is disposed between the panel member 390d and the cover window 310d. The panel member 390d may include a display panel 330d and a TSP 340d as described above. In particular, a second adhesive layer 350d may be provided between the display panel 330d and the TSP 340d to attach the display panel 330d and the TSP 340d.

The cover window 310d may be formed such that at least a portion of the cover window 310d is curved. In particular, the cover window 310d may be formed such that a surface to which the panel member 390d is attached and on which an image or text is displayed is curved. In particular, the cover window 310d may be formed to have a curved surface having a curvature radius of R. The cover window 310d may be formed to have a curved surface having a set or predetermined curvature radius in a longitudinal direction or a width direction. However, for convenience of description, it will be assumed that the cover window 310d is formed to have a curved surface having a set or predetermined curvature radius and the curved surface is formed in a width direction of the cover window 310d.

In particular, the cover window 310d may be formed such that a convex portion of the cover window 310d faces the first adhesive layer 320d. The TSP 340d, the second adhesive layer 350d, and the display panel 330d may be attached and fixed to a convex outer surface of the cover window 310d on the first adhesive layer 320d.

Accordingly, since the display device 300d is formed to have a set or predetermined curvature radius, the display device 300d may be applied to various members.

Figure 30:
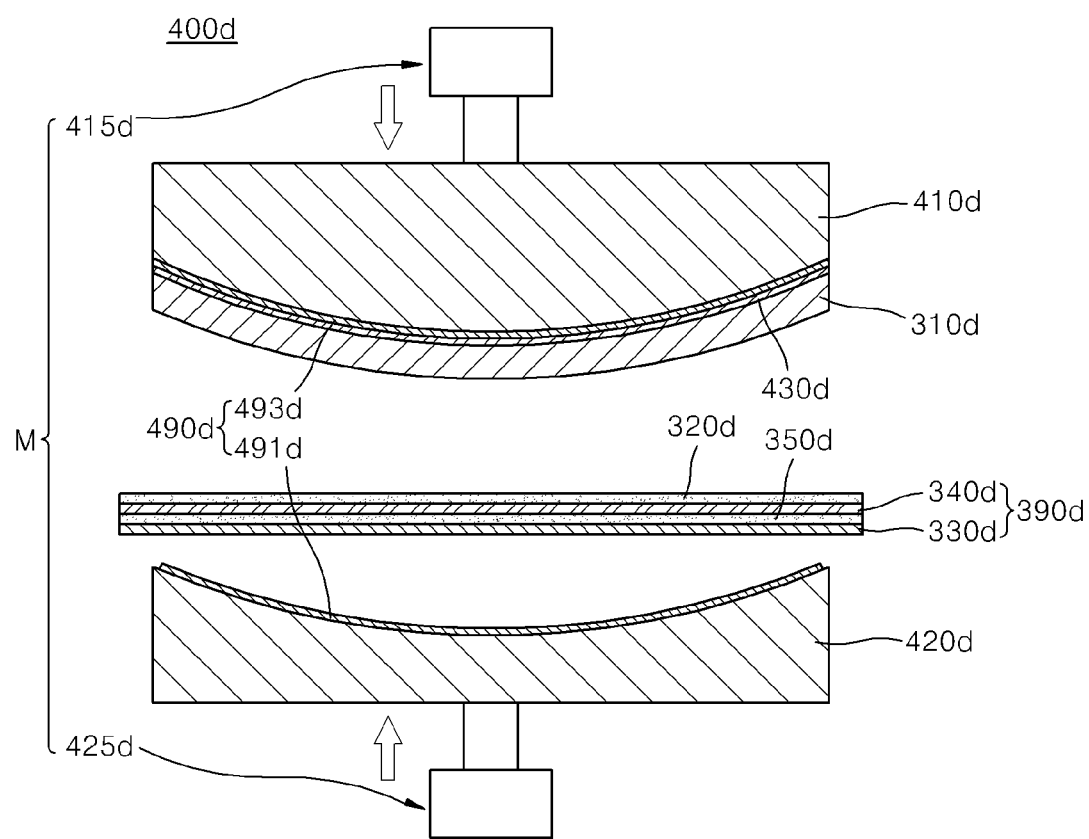
FIG. 30 is a cross-sectional view illustrating an apparatus for manufacturing the display device of FIG. 29, according to an embodiment of the present invention.

FIG. 30 is a cross-sectional view illustrating an apparatus 400d for manufacturing the display device 300d of FIG. 29, according to an embodiment of the present invention.

Referring to FIG. 30, the apparatus 400d may include a first jig 410d, a second jig 420d, a driving unit M, a fixing unit (for example, first fixing unit 430d), and a cushion unit 490d (including a first cushion unit 493d and a second cushion unit 491d). An outer surface of the first jig 410d on which the cover window 310d is seated may be the same as or similar to an outer surface of the cover window 310d contacting the first jig 410d. In further detail, the first jig 410d may have a curved surface having a set or predetermined curvature radius to correspond to the cover window 310d. In particular, the first jig 410d may be formed to protrude toward the second jig 420d.

An outer surface of the second jig 420d may be recessed away from the first jig 410d to correspond to or engage with a protruding portion of the first jig 410d. The outer surface of the second jig 420d may be a curved surface having a set or predetermined curvature radius.

The driving unit M may include a first driving unit 415d and a second driving unit 425d. The first driving unit 415d may linearly move the first jig 410d toward the second jig 420d, and the second driving unit 425d may linearly move the second jig 420d toward the first jig 410d. The first driving unit 415d and the second driving unit 425d may be formed in the same manner as or a similar manner to those described above.

In addition, the fixing unit may include a first fixing unit 430d provided on the first jig 410d and a second fixing unit provided on the second jig 420d. For convenience of description, it will be assumed that the fixing unit includes the first fixing unit 430d. In addition, the first fixing unit 430d and the second fixing unit may be formed in the same manner or a similar manner, and thus a detailed description of the second fixing unit will not be given.

The first fixing unit 430d may be formed in various ways. For example, the first fixing unit 430d may include an adhesive member, an adhesive chuck, or an electrostatic chuck. In addition, the first fixing unit 430d may include a first absorption unit, and a first absorption pump that is connected to the first absorption unit. In particular, the first fixing unit 430d is not limited thereto, and may include a clamp, or a protrusion that is provided on the first jig 410d and mechanically restricts the cover window 310d. However, for convenience of description, it will be assumed that the first fixing unit 430d includes an adhesive member.

A method of manufacturing the display device 300d by using the apparatus 400d will now be described. First, the cover window 310d and the panel member 390d may be manufactured and prepared. In this case, a method of manufacturing the cover window 310d is similar to that described above, and thus a detailed description thereof will not be repeated. In addition, the TSP 340d and the display panel 330d may be adhered to each other by using the second adhesive layer 350d.

After the cover window 310d and the panel member 390d are manufactured and prepared as described above, the cover window 310d may be disposed on the first jig 410d. The cover window 310d may be formed to have a curved surface having a set or predetermined curvature radius of R as described above and may be seated on an outer surface of the first jig 410d. The first fixing unit 430d may adhere and fix the cover window 310d.

While the process is performed, the TSP 340d and the display panel 330d adhered by using the second adhesive layer 350d may be disposed on the second jig 420d. The display panel 330d may be disposed to face the second jig 420d, and the TSP 340d may be disposed to face the first jig 410d.

After the TSP 340d and the display panel 330d are disposed as described above, the first adhesive layer 320d may be coated on the TSP 340d. The first adhesive layer 320d may be formed of the same material as or a similar material to that of the second adhesive layer 350d.

When the cover window 310d, the TSP 340d, and the display panel 330d are completely disposed as described above, the first jig 410d and the second jig 420d may be moved toward each other by driving the first driving unit 415d and the second driving unit 425d. A protruding portion of the cover window 310d may first contact the first adhesive layer 320d, and the first adhesive layer 320d and the cover window 310d may be sequentially laminated from central portions of the display panel 330d toward both end portions.

In particular, when the cover window 310d and the panel member 390d contact each other, a load range applied when the first jig 410d and the second jig 420d compress the cover window 310d and the panel member 390d may be greater than or equal to 0.3 MPa and less than or equal to 0.5 MPa. When the load range is less than 0.3 MPa, an adhesive force between the cover window 310d and the panel member 390d may be reduced, and the cover window 310d and the panel member 390d may be delaminated and separated from each other. In addition, when the load range exceeds 0.5 MPa and the cover window 310d and the panel member 390d are attached to each other, the cover window 310d and the panel member 390d may be damaged, thereby reducing quality and reliability.

While the process is performed, the cushion unit 490d may uniformly distribute a force applied to the cover window 310d, the TSP 340d, and the display panel 330d.

When the process is completed, the first driving unit 415d and the second driving unit 425d may operate to separate the first jig 410d and the second jig 420d. The operator may complete an operation by removing the completed display device 300d from the first jig 410d or the second jig 420d.

The operation may be performed in a vacuum state. In further detail, the apparatus 400d may include a chamber (see, for example, chamber C in FIG. 4C) in which the first jig 410d, the second jig 420d, the fixing unit, and the driving unit M are disposed. In addition, the apparatus 400d may include a pressure adjustment unit that adjusts a pressure in the chamber. The pressure adjustment unit may maintain a pressure in the chamber in a vacuum state when the cover window 310d and the panel member 390d are laminated. In addition, the pressure adjustment unit may restore and maintain a pressure in the chamber in an atmospheric pressure state after the process is completed.

Accordingly, the apparatus 400d may manufacture any type of display device 300d. In addition, the apparatus 400d may reduce or minimize a product defect rate by effectively removing vapors or preventing vapors from being generated between the cover window 310d and the panel member 390d when the cover window 310d and the panel member 390d are laminated.

Figure 31:
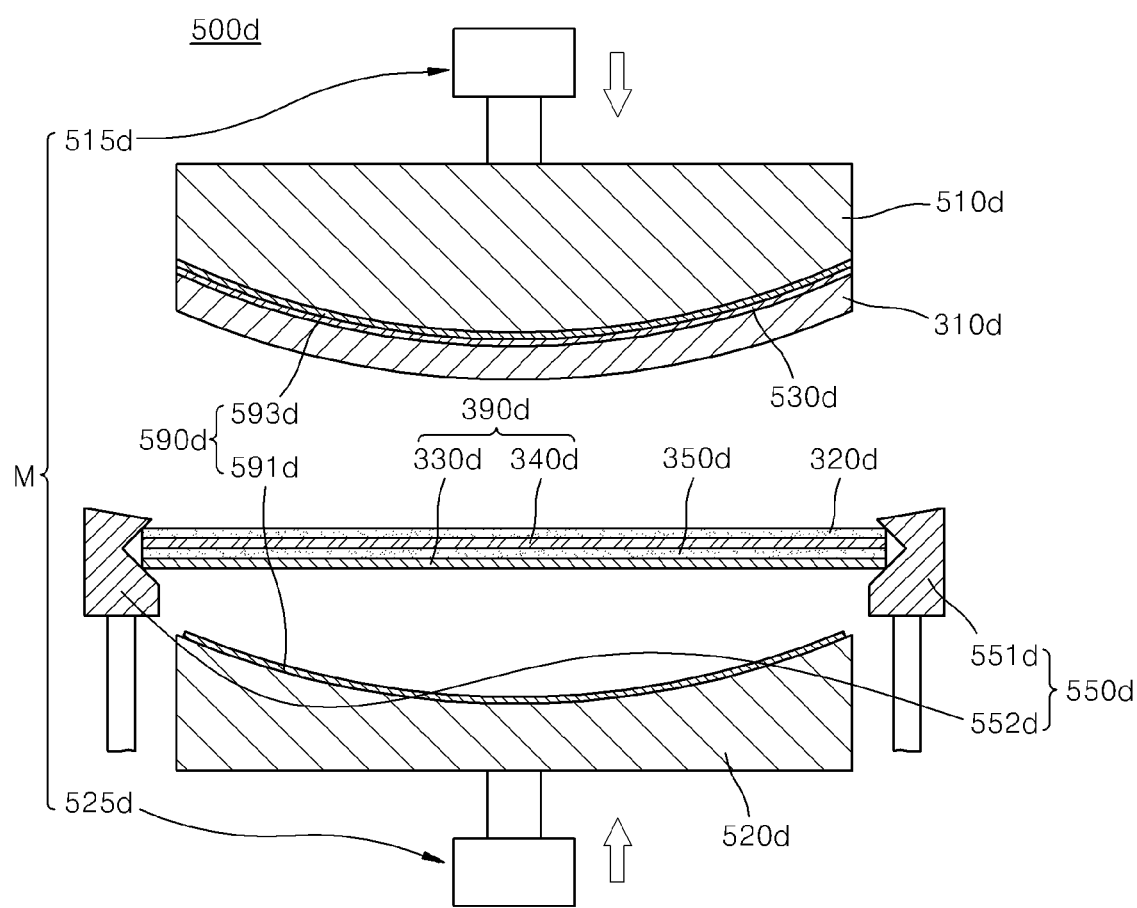
FIG. 31 is a cross-sectional view illustrating an apparatus for manufacturing the display device of FIG. 29, according to another embodiment of the present invention.

FIG. 31 is a cross-sectional view illustrating an apparatus 500d for manufacturing the display device 300d of FIG. 29, according to another embodiment of the present invention.

Referring to FIG. 31, the apparatus 500d may include a first jig 510d, a second jig 520d, a driving unit M, a fixing unit (for example, first fixing unit 530d), a cushion unit 590d, and a clamping unit 550d. In this case, the first jig 510d, the second jig 520d, the driving unit M, the fixing unit, and the cushion unit 590d (including a first cushion unit 593d and a second cushion unit 591d) are the same as or similar to those described above, and thus a detailed description thereof will not be repeated.

The clamping unit 550d may include a first clamping unit 551d and a second clamping unit 552d. The first clamping unit 551d and the second clamping unit 552d may be disposed to face each other on a side surface of the first jig 510d or the second jig 520d. However, for convenience of description, it will be assumed that the first clamping unit 551d and the second clamping unit 552d are disposed to face each other on a side surface of the second jig 520d. In addition, the first clamping unit 551d and the second clamping unit 552d are formed in the same or similar manner as those described above, and thus a detailed description thereof will not be repeated.

A method of manufacturing the display device 300d by using the apparatus 500d will now be described. First, the cover window 310d and the panel member 390d may be manufactured and prepared. In this case, a method of manufacturing the cover window 310d is similar to that described above, and thus a detailed description thereof will not be repeated. In addition, the TSP 340d and the display panel 330d may be adhered by using the second adhesive layer 350d.

After the cover window 310d and the panel member 390d are manufactured and prepared as described above, the cover window 310d may be disposed on the first jig 510d. The cover window 310d may be formed to have a curved surface having a set or predetermined curvature radius of R as described above and may be seated on an outer surface of the first jig 510d. The cover window 310d may be adhered and fixed by the first fixing unit 530d.

While the process is performed, the TSP 340d and the display panel 330d adhered by using the second adhesive layer 350d as described above may be disposed on the second jig 520d. The display panel 330d may be disposed to face the second jig 520d, and the TSP 340d may be disposed to face the first jig 510d. The display panel 330d and the TSP 340d may be stacked, and an end of the display panel 330d and an end of the TSP 340d may be fixed by being inserted into the first clamping unit 551d and the second clamping unit 552d.

After the TSP 340d and the display panel 330d are disposed as described above, the first adhesive layer 320d may be coated on the TSP 340d. The first adhesive layer 320d may be formed of the same or similar material as that of the second adhesive layer 350d.

When the cover window 310d, the TSP 340d, and the display panel 330d are completely disposed as described above, the first jig 510d and the second jig 520d may be moved toward each other by driving a first driving unit 515d and a second driving unit 525d. A protruding portion of the cover window 310d may first contact the first adhesive layer 320d, and the first adhesive layer 320d and the cover window 310d may be sequentially laminated from central portions of the display panel 330d toward both end portions.

In particular, when the cover window 310d and the panel member 390d are adhered to each other as described above, a load range applied when the first jig 510d and the second jig 520d compress the cover window 310d and the panel member 390d may be greater than or equal to 0.3 MPa and less than or equal to 0.5 MPa. When the load range is less than 0.3 MPa, an adhesive force between the cover window 310d and the panel member 390d may be reduced, and the cover window 310d and the panel member 390d may be delaminated and separated from each other. In addition, when the load range exceeds 0.5 MPa and the cover window 310d and the panel member 390d are attached to each other, the cover window 310d and the panel member 390d may be damaged, thereby reducing quality and reliability.

In addition, when the first jig 510d and the second jig 520d move as described above, the TSP 340d and the display panel 330d may be fixed while the first clamping unit 551d and the second clamping unit 552d do not move.

While the process is performed, the first cushion unit 593d and the second cushion unit 591d may uniformly distribute a force applied to the cover window 310d, the TSP 340d, and the display panel 330d.

When the process is completed, the first driving unit 515d and the second driving unit 525d may operate to separate the first jig 510d and the second jig 520d. The operator may complete an operation by removing the completed display device 300d from the first jig 510d or the second jig 520d.

The operation may be performed in a vacuum state. In further detail, the apparatus 500d may include a chamber (see, for example, chamber C in FIG. 4C) in which the first jig 510d, the second jig 520d, the fixing unit, and the driving unit M are disposed. In addition, the apparatus 500d may include a pressure adjustment unit that adjusts a pressure in the chamber. The pressure adjustment unit may maintain a pressure in the chamber in a vacuum state when the cover window 310d and the panel member 390d are laminated. In addition, the pressure adjustment unit may restore and maintain a pressure in the chamber in an atmospheric pressure state after the process is completed.

Accordingly, the apparatus 500d may manufacture any type of display device 300d. In addition, the apparatus 500d may reduce or minimize a product defect rate by effectively removing vapors or preventing vapors from being generated between the cover window 310d and the panel member 390d when the cover window 310d and the panel member 390d are laminated.

Figure 32:
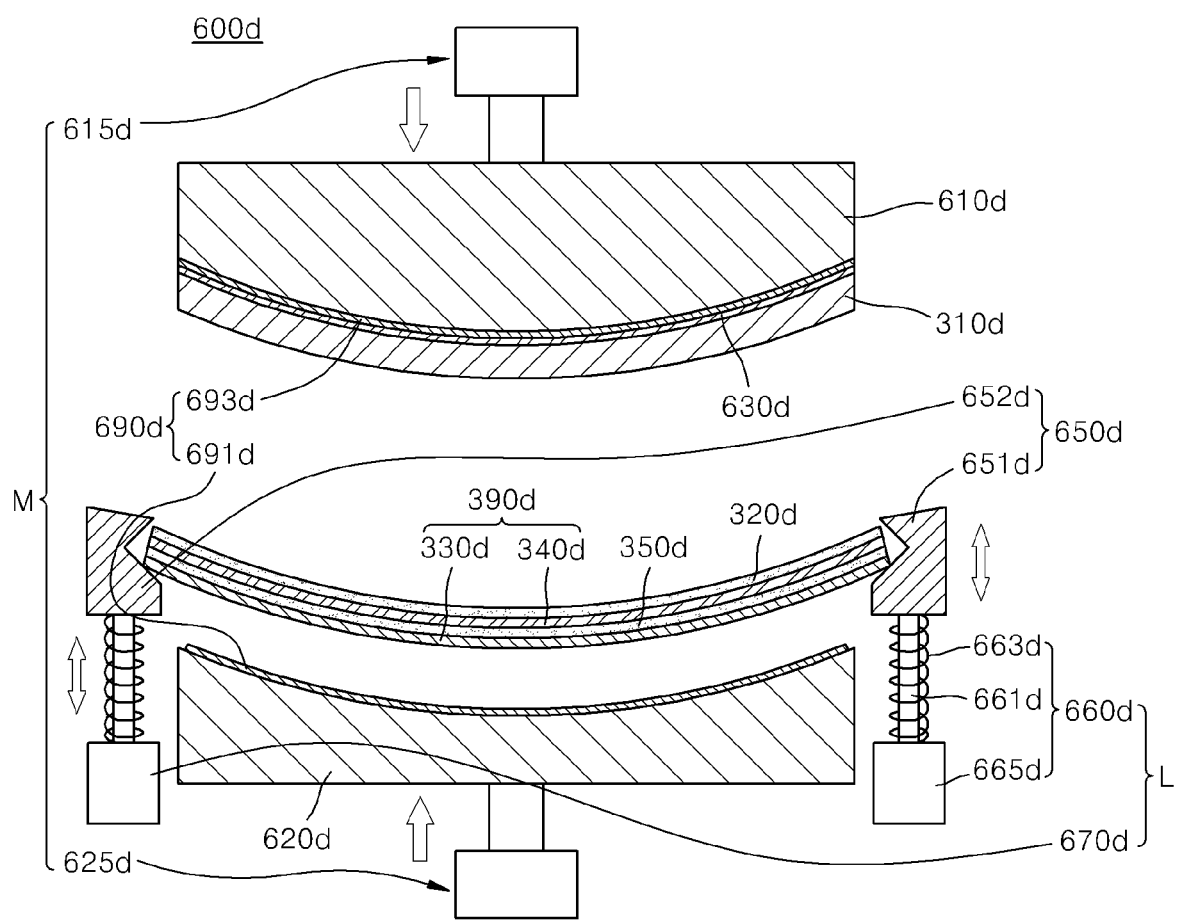
FIG. 32 is a cross-sectional view illustrating an apparatus for manufacturing the display device of FIG. 29, according to yet another embodiment of the present invention.

FIG. 32 is a cross-sectional view illustrating an apparatus 600d for manufacturing the display device 300d of FIG. 29, according to yet another embodiment of the present invention.

Referring to FIG. 32, the apparatus 600d may include a first jig 610d, a second jig 620d, a driving unit M, a fixing unit (for example, first fixing unit 630d), a cushion unit 690d, a clamping unit 650d, and a linear driving unit L. In this case, the first jig 610d, the second jig 620d, the driving unit M, the fixing unit, the cushion unit 690d, and the clamping unit 650d are the same as or similar to those described above, and thus a detailed description thereof will not be repeated.

The linear driving unit L may include a first linear driving unit 660d that is provided on a first clamping unit 651d and linearly moves the first clamping unit 651d, and a second linear driving unit 670d that is provided on a second clamping unit 652d and linearly moves the second clamping unit 652d. In particular, the first linear driving unit 660d and the second linear driving unit 670d may respectively linearly move the first clamping unit 651d and the second clamping unit 652d in the same direction as a direction in which the second jig 620d moves. The first linear driving unit 660d and the second linear driving unit 670d may be formed in the same or similar manner. For convenience of description, the following description will focus on the first linear driving unit 660d.

The first linear driving unit 660d may include a first shaft 661d that is connected to the first clamping unit 651d and linearly moves the first clamping unit 651d. In addition, the first linear driving unit 660d may include a first driving module 665d that drives the first shaft 661d. The first driving module 665d may be formed to include a cylinder or a motor. However, for convenience of description, it will be assumed that the first driving module 665d includes a motor.

In addition, it will be assumed that the first shaft 661*d* includes a ball screw that is raised and lowered as the first driving module 665*d* rotates.

The first linear driving unit 660*d* may include a first elastic unit 663*d* that surrounds the first shaft 661*d*. The first elastic unit 663*d* may include a compression spring, or may be formed of an elastic material such as rubber. However, for convenience of description, it will be assumed that the first elastic unit 663*d* includes a compression spring.

The first elastic unit 663*d* may be disposed to surround an outer surface of the first shaft 661*d* as described above, and thus may provide a restoring force to the first clamping unit 651*d* when the first clamping unit 651*d* moves.

A method of manufacturing the display device 300*d* by using the apparatus 600*d* will now be described. First, the cover window 310*d* and the panel member 390*d* may be manufactured and prepared. In this case, a method of manufacturing the cover window 310*d* is similar to that described above, and thus a detailed description thereof will not be repeated. In addition, the TSP 340*d* and the display panel 330*d* may be adhered to each other by using the second adhesive layer 350*d*.

After the cover window 310*d* and the panel member 390*d* are manufactured and prepared as described above, the cover window 310*d* may be disposed on the first jig 610*d*. The cover window 310*d* may be formed to have a curved surface having a set or predetermined curvature radius of R as described above, and may be seated on an outer surface of the first jig 610*d*. The cover window 310*d* may be adhered and fixed by the first fixing unit 630*d*.

While the process is performed, the TSP 340*d* and the display panel 330*d* adhered by using the second adhesive layer 350*d* as described above may be disposed on the second jig 620*d*. The display panel 330*d* may be disposed to face the second jig 620*d*, and the TSP 340*d* may be disposed to face the first jig 610*d*. In particular, the display panel 330*d* and the TSP 340*d* may be stacked, and an end of the display panel 330*d* and an end of the TSP 340*d* may be fixed by being inserted into a first clamping unit 651*d* and a second clamping unit 652*d*.

The display panel 330*d* and the TSP 340*d* may be disposed such that at least one portion protrudes more than other portions toward the cover window 310*d* or toward the second jig 620*d*. However, for convenience of description, it will be assumed that at least one portion of the display panel 330*d* and the TSP 340*d* protrudes more than other portions toward the second jig 620*d*.

After the TSP 340*d* and the display panel 330*d* are disposed as described above, the first adhesive layer 320*d* may be coated on the TSP 340*d*. The first adhesive layer 320*d* may be formed of the same or similar material as that of the second adhesive layer 350*d*.

When the cover window 310*d*, the TSP 340*d*, and the display panel 330*d* are completely disposed as described above, the first jig 610*d* and the second jig 620*d* may be moved toward each other by driving a first driving unit 615*d* and a second driving unit 625*d*. A protruding portion of the cover window 310*d* may first contact the first adhesive layer 320*d*, and the first adhesive layer 320*d* and the cover window 310*d* may be sequentially laminated from central portions of the display panel 330*d* toward both end portions.

In particular, when the cover window 310*d* and the panel member 390*d* contact each other, a load range applied when the first jig 610*d* and the second jig 620*d* compress the cover window 310*d* and the panel member 390*d* may be greater than or equal to 0.3 MPa and less than or equal to 0.5 MPa. When the load range is less than 0.3 MPa, an adhesive force between the cover window 310*d* and the panel member 390*d* may be reduced, and the cover window 310*d* and the panel member 390*d* may be delaminated and separated from each other. In addition, when the load range exceeds 0.5 MPa and the cover window 310*d* and the panel member 390*d* are attached to each other, the cover window 310*d* and the panel member 390*d* may be damaged, thereby reducing quality and reliability.

In addition, when the first jig 610*d* and the second jig 620*d* move as described above, the first clamping unit 651*d* and the second clamping unit 652*d* may fix the TSP 340*d* and the display panel 330*d* while linearly moving as the first jig 610*d* and the second jig 620*d* move. The first linear driving unit 660*d* and the second linear driving unit 670*d* may be controlled based on a linear movement of at least one of the first jig 610*d* or the second jig 620*d*.

While the process is performed, a first cushion unit 693*d* and a second cushion unit 691*d* may uniformly distribute a force applied to the cover window 310*d*, the TSP 340*d*, and the display panel 330*d*.

When the process is completed, the first driving unit 615*d* and the second driving unit 625*d* may operate to separate the first jig 610*d* and the second jig 620*d*. The operator may complete an operation by removing the completed display device 300*d* from the first jig 610*d* or the second jig 620*d*.

The operation may be performed in a vacuum state. In further detail, the apparatus 600*d* may include a chamber (see, for example, chamber C in FIG. 4C) in which the first jig 610*d*, the second jig 620*d*, the fixing unit, and the driving unit M are disposed. In addition, the apparatus 600*d* may include a pressure adjustment unit that adjusts a pressure in the chamber. The pressure adjustment unit may maintain a pressure in the chamber in a vacuum state when the cover window 310*d* and the panel member 390*d* are laminated. In addition, the pressure adjustment unit may restore and maintain a pressure in the chamber in an atmospheric pressure state after a process is completed.

Accordingly, the apparatus 600*d* may manufacture any type of display device 300*d*. In addition, the apparatus 600*d* may reduce or minimize a product defect rate by effectively removing vapors or preventing vapors from being generated between the cover window 310*d* and the panel member 390*d* when the cover window 310*d* and the panel member 390*d* are laminated.

Figure 33:
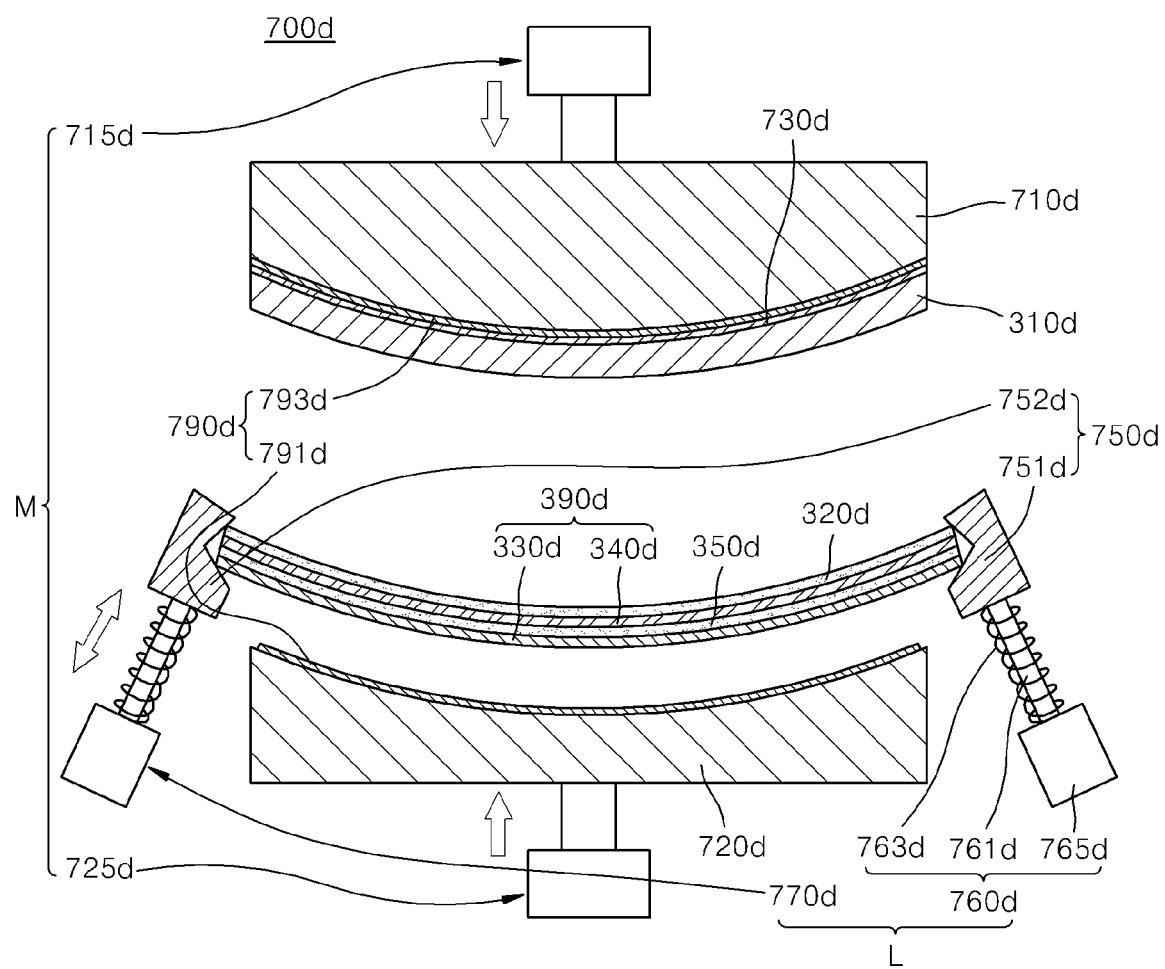
FIG. 33 is a cross-sectional view illustrating an apparatus for manufacturing the display device of FIG. 29, according to still yet another embodiment of the present invention.

FIG. 33 is a cross-sectional view illustrating an apparatus 700*d* for manufacturing the display device 300*d* of FIG. 29, according to still yet another embodiment of the present invention.

Referring to FIG. 33, the apparatus 700*d* may include a first jig 710*d*, a second jig 720*d*, a driving unit M, a fixing unit (for example, first fixing unit 730*d*), a cushion unit 790*d*, a clamping unit 750*d*, and a linear driving unit L. In this case, the first jig 710*d*, the second jig 720*d*, the driving unit M, the fixing unit, the cushion unit 790*d*, the clamping unit 750*d*, and the linear driving unit L are the same as or similar to those described above, and thus a detailed description thereof will not be repeated.

The linear driving unit L may include a first linear driving unit 760*d* that is provided on the first clamping unit 751*d* and linearly moves the first clamping unit 751*d*, and a second linear driving unit 770*d* that is provided on the second clamping unit 752*d* and linearly moves the second clamping unit 752*d*. The first linear driving unit 760*d* and the second linear driving unit 770*d* may respectively linearly move the first clamping unit 751*d* and the second clamping unit 752*d* in a diagonal direction. In particular, the first linear driving unit 760*d* and the second linear driving unit 770*d* may linearly move the first clamping unit 751d and the second clamping unit 752d such that movement directions of the first clamping unit 751d and the second clamping unit 752d form angles with respect to a movement direction of the second jig 720d.

A method of manufacturing the display device 300d by using the apparatus 700d will now be described. First, the cover window 310d and the panel member 390d may be manufactured and prepared. In this case, a method of manufacturing the cover window 310d is similar to that described above, and thus a detailed description thereof will not be repeated. In addition, the TSP 340d and the display panel 330d may be adhered to each other by using the second adhesive layer 350d.

After the cover window 310d and the panel member 390d are manufactured and prepared as described above, the cover window 310d may be disposed on the first jig 710d. The cover window 310d may be formed to have a curved surface having a set or predetermined curvature radius of R as described above, and may be seated on an outer surface of the first jig 710d. The cover window 310d may be adhered and fixed by the first fixing unit 730d.

While the process is performed, the TSP 340d and the display panel 330d adhered by using the second adhesive layer 350d as described above may be disposed on the second jig 720d. The display panel 330d may be disposed to face the second jig 720d, and the TSP 340d may be disposed to face the first jig 710d. In particular, the display panel 330d and the TSP 340d may be stacked, and an end of the display panel 330d and an end of the TSP 340d may be fixed by being inserted into the first clamping unit 751d and the second clamping unit 752d.

The display panel 330d and the TSP 340d may be disposed such that central portions are lower in position than other portions due to the first clamping unit 751d and the second clamping unit 752d. In other embodiments, the display panel 330d and the TSP 340d may be disposed such that central portions are higher in position than other portions. However, for convenience of description, it will be assumed that central portions of the display panel 330d and the TSP 340d are lower in position than other portions.

After the TSP 340d and the display panel 330d are disposed as described above, the first adhesive layer 320d may be coated on the TSP 340d. The first adhesive layer 320d may be formed of the same or similar material as that of the second adhesive layer 350d.

When the cover window 310d, the TSP 340d, and the display panel 330d are completely disposed as described above, the first jig 710d and the second jig 720d may be moved toward each other by driving a first driving unit 715d and a second driving unit 725d. A protruding portion of the cover window 310d may first contact the first adhesive layer 320d, and the first adhesive layer 320d and the cover window 310d may be sequentially laminated from central portions of the display panel 330d toward both end portions.

In particular, when the cover window 310d and the panel member 390d contact each other, a load range applied when the first jig 710d and the second jig 720d compress the cover window 310d and the panel member 390d may be greater than or equal to 0.3 MPa and less than or equal to 0.5 MPa. When the load range is less than 0.3 MPa, an adhesive force between the cover window 310d and the panel member 390d may be reduced, and the cover window 310d and the panel member 390d may be delaminated and separated from each other. In addition, when the load range exceeds 0.5 MPa and the cover window 310d and the panel member 390d are attached to each other, the cover window 310d and the panel member 390d may be damaged, thereby reducing quality and reliability.

In addition, when the first jig 710d and the second jig 720d move as described above, the first clamping unit 751d and the second clamping unit 752d may fix the TSP 340d and the display panel 330d while linearly moving as the first jig 710d and the second jig 720d move. The first linear driving unit 760d and the second linear driving unit 770d may be controlled based on a linear movement of at least one of the first jig 710d or the second jig 720d.

While the process is performed, a first cushion unit 793d and a second cushion unit 791d may uniformly distribute a force applied to the cover window 310d, the TSP 340d, and the display panel 330d.

When the process is completed, the first driving unit 715d and the second driving unit 725d may operate to separate the first jig 710d and the second jig 720d. The operator may complete an operation by removing the completed display device 300d from the first jig 710d or the second jig 720d.

The operation may be performed in a vacuum state. In further detail, the apparatus 700d may include a chamber (see, for example, chamber C in FIG. 4C) in which the first jig 710d, the second jig 720d, the fixing unit, and the driving unit M are disposed. In addition, the apparatus 700d may include a pressure adjustment unit that adjusts a pressure in the chamber. The pressure adjustment unit may maintain a pressure in the chamber in a vacuum state when the cover window 310d and the panel member 390d are laminated. In addition, the pressure adjustment unit may restore and maintain a pressure in the chamber in an atmospheric pressure state after a process is completed.

Accordingly, the apparatus 700d may manufacture any type of display device 300d. In addition, the apparatus 700d may reduce or minimize a product defect rate by effectively removing vapors or preventing vapors from being generated between the cover window 310d and the panel member 390d when the cover window 310d and the panel member 390d are laminated.

Figure 34:
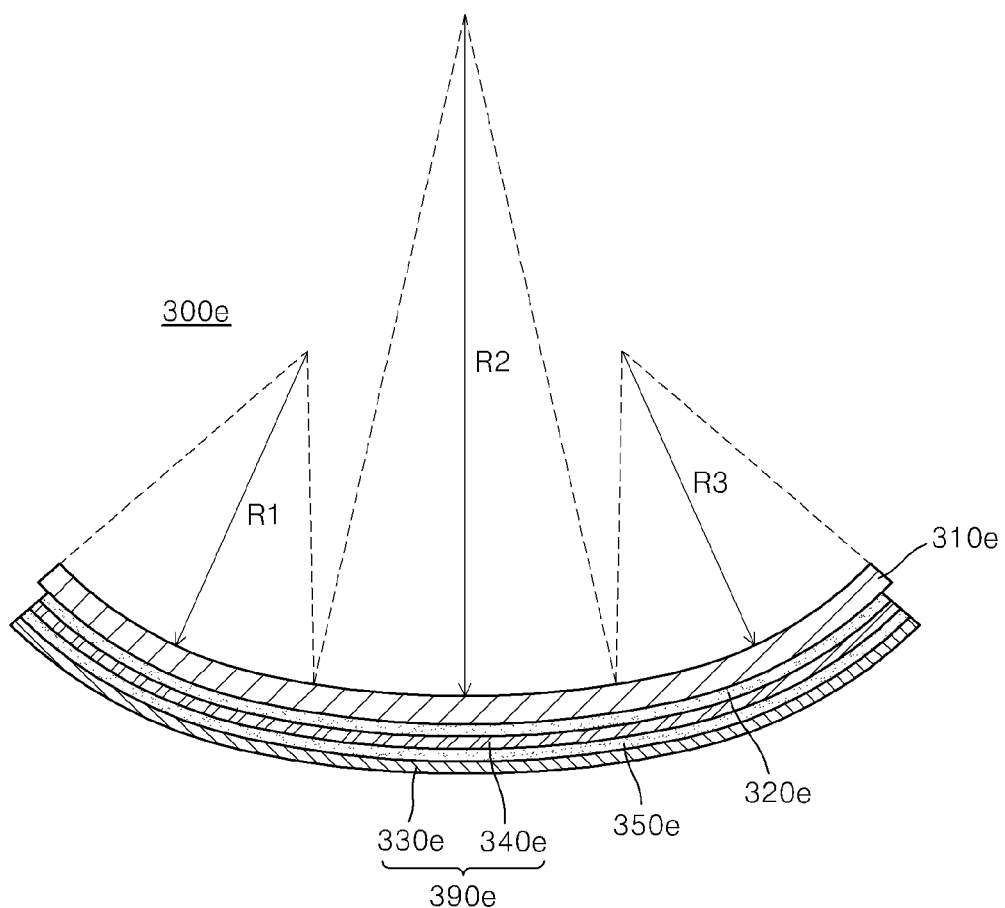
FIG. 34 is a cross-sectional view illustrating a display device according to a seventh embodiment of the present invention.

FIG. 34 is a cross-sectional view illustrating a display device 300e according to a seventh embodiment of the present invention.

Referring to FIG. 34, the display device 300e may include a cover window 310e and a panel member 390e as described above. In addition, the display device 300e may include a first adhesive layer 320e that is disposed between the panel member 390e and the cover window 310e. The panel member 390e may include a display panel 330e and a TSP 340e as described above. In particular, a second adhesive layer 350e may be provided between the display panel 330e and the TSP 340e to attach the display panel 330e and the TSP 340e.

At least a portion of the cover window 310e may be curved. The cover window 310e may be formed such that a surface to which the panel member 390e is attached and on which an image or text is displayed is concave.

The cover window 310e may be formed to have at least one curved surface having a curvature radius. In some embodiments, the cover window 310e may be formed to have a first curved surface having a curvature radius of R1, a second curved surface having a curvature radius of R2, and may further include a third curved surface having a curvature radius of R3 in a longitudinal direction or a width direction. In other embodiments, the cover window 310e may further include curved surfaces having curvature radii of R4, R5, . . . , and RN (N is a natural number) in addition to the curved surfaces having the curvature radii of R1, R2, and R3. However, for convenience of description, it will be assumed that the cover window 310e is formed to have the first, second, and third curved surfaces having the curvature radii of R1, R2, and R3 in a width direction.

In particular, the cover window 310e may be formed to protrude toward the first adhesive layer 320e. The TSP 340e, the second adhesive layer 350e, and the display panel 330e may be sequentially stacked and fixed to a protruding outer surface of the cover window 310e on the first adhesive layer 320e. Accordingly, since the display device 300e is formed to have a set or predetermined curvature radii, the display device 300e may be applied to various members.

Figure 35:
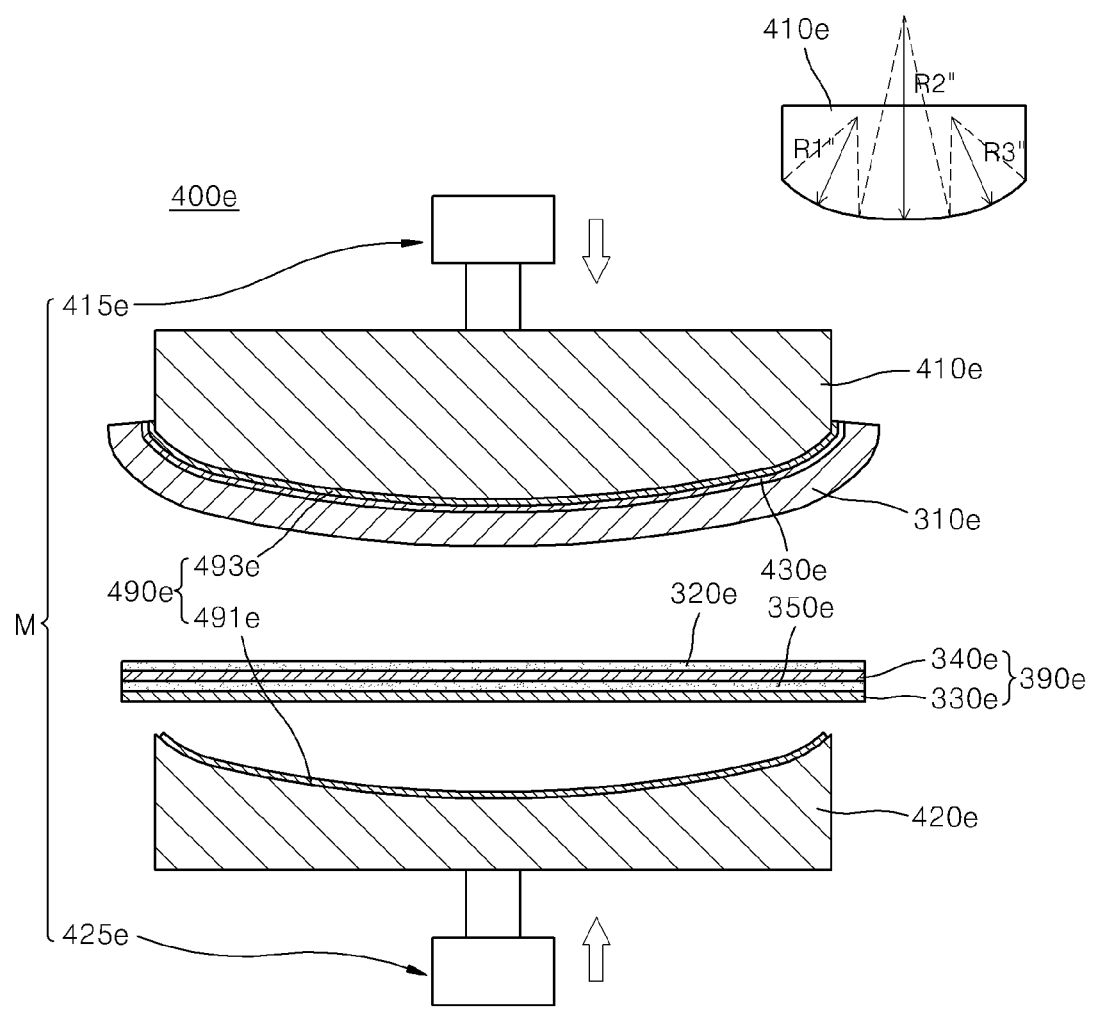
FIG. 35 is a cross-sectional view illustrating an apparatus for manufacturing the display device of FIG. 34, according to an embodiment of the present invention.

FIG. 35 is a cross-sectional view illustrating an apparatus 400e for manufacturing the display device 300e of FIG. 34, according to an embodiment of the present invention.

Referring to FIG. 35, the apparatus 400e may include a first jig 410e, a second jig 420e, a driving unit M, a fixing unit (for example, first fixing unit 430e), and a cushion unit 490e. An outer surface of the first jig 410e on which the cover window 310e is seated may be formed equally or similarly to an outer surface of the cover window 310e contacting the outer surface of the first jig 410e. In further detail, the first jig 410e may have at least two curved surfaces having curvature radii of R1', R2', R3', . . . , like the cover window 310e. In particular, the first jig 410e may be formed to protrude toward the second jig 420e.

An outer surface of the second jig 420e may be recessed away from the first jig 410e to correspond to or engage with a protruding portion of the first jig 410e. The outer surface of the second jig 420e may include at least two curved surfaces having set or predetermined curvature radii.

The driving unit M may include a first driving unit 415e and a second driving unit 425e. The first driving unit 415e may linearly move the first jig 410e toward the second jig 420e, and the second driving unit 425e may linearly move the second jig 420e toward the first jig 410e. The first driving unit 415e and the second driving unit 425e may be formed in the same manner as or a similar manner to those described above.

In addition, the fixing unit may include a first fixing unit 430e provided on the first jig 410e and a second fixing unit provided on the second jig 420e. For convenience of description, it will be assumed that the fixing unit includes the first fixing unit 430e. In addition, the first fixing unit 430e and the second fixing unit may be formed in the same manner or a similar manner, and thus a detailed description of the second fixing unit will not be given.

The first fixing unit 430e may be formed in various ways. For example, the first fixing unit 430e may include an adhesive member, an adhesive chuck, or an electrostatic chuck. In addition, the first fixing unit 430e may include a first absorption unit, and a first absorption pump that is connected to the first absorption unit. In particular, the first fixing unit 430e is not limited thereto, and may include a clamp, or a protrusion that is provided on the first jig 410e and mechanically restricts the cover window 310e. However, for convenience of description, it will be assumed that the first fixing unit 430e includes an adhesive member.

The cushion unit 490e may be provided on at least one of the first jig 410e or the second jig 420e. In this case, the cushion unit is the same as or similar to that described above, and thus a detailed description thereof will not be repeated. In addition, for convenience of description, it will be assumed that the cushion unit is provided on each of the first jig 410e and the second jig 420e.

A method of manufacturing the display device 300e by using the apparatus 400e will now be described. First, the cover window 310e and the panel member 390e may be manufactured and prepared. In this case, a method of manufacturing the cover window 310e is similar to that described above, and thus a detailed description thereof will not be repeated. In addition, the TSP 340e and the display panel 330e may be adhered by using the second adhesive layer 350e.

After the cover window 310e and the panel member 390e are manufactured and prepared as described above, the cover window 310e may be disposed on the first jig 410e. The cover window 310e may be formed to have at least two curved surfaces having curvature radii as described above and may be seated on an outer surface of the first jig 410e. The cover window 310e may be adhered and fixed by the first fixing unit 430e.

While the process is performed, the TSP 340e and the display panel 330e adhered by using the second adhesive layer 350e may be disposed on the second jig 420e. The display panel 330e may be disposed to face the second jig 420e, and the TSP 340e may be disposed to face the first jig 410e.

After the TSP 340e and the display panel 330e are disposed as described above, the first adhesive layer 320e may be coated on the TSP 340e. The first adhesive layer 320e may be formed of the same material as or a similar material to that of the second adhesive layer 350e.

When the cover window 310e, the TSP 340e, and the display panel 330e are completely disposed as described above, the first jig 410e and the second jig 420e may be moved toward each other by driving the first driving unit 415e and the second driving unit 425e. A protruding portion of the cover window 310e may first contact the first adhesive layer 320e, and the first adhesive layer 320e and the cover window 310e may be sequentially laminated from central portions of the display panel 330e to both end portions.

In particular, when the cover window 310e and the panel member 390e contact each other, a load range applied when the first jig 410e and the second jig 420e compress the cover window 310e and the panel member 390e may be greater than or equal to 0.3 MPa and less than or equal to 0.5 MPa. When the load range is less than 0.3 MPa, an adhesive force between the cover window 310e and the panel member 390e may be reduced, and the cover window 310e and the panel member 390e may be delaminated and separated from each other. In addition, when the load range exceeds 0.5 MPa and the cover window 310e and the panel member 390e are attached to each other, the cover window 310e and the panel member 390e may be damaged, thereby reducing quality and reliability.

While the process is performed, a first cushion unit 493e and a second cushion unit 491e may uniformly distribute a force applied to the panel member 390e and the cover window 310e.

When the process is completed, the first driving unit 415e and the second driving unit 425e may operate to separate the first jig 410e and the second jig 420e. The operator may complete an operation by removing the completed display device 300e from the first jig 410e or the second jig 420e.

The operation may be performed in a vacuum state. In further detail, the apparatus 400e may include a chamber (see, for example, chamber C in FIG. 4C) in which the first jig 410e, the second jig 420e, the fixing unit, and the driving unit M are disposed. In addition, the apparatus 400e may include a pressure adjustment unit that adjusts a pressure in the chamber. The pressure adjustment unit may maintain a pressure in the chamber in a vacuum state when the cover window 310e and the panel member 390e are laminated. In addition, the pressure adjustment unit may restore and maintain a pressure in the chamber in an atmospheric pressure state after the process is completed.

Accordingly, the apparatus 400e may manufacture any type of display device 300e. In addition, the apparatus 400e may reduce or minimize a product defect rate by effectively removing vapors or preventing vapors from being generated between the cover window 310e and the panel member 390e when the cover window 310e and the panel member 390e are laminated.

Figure 36:
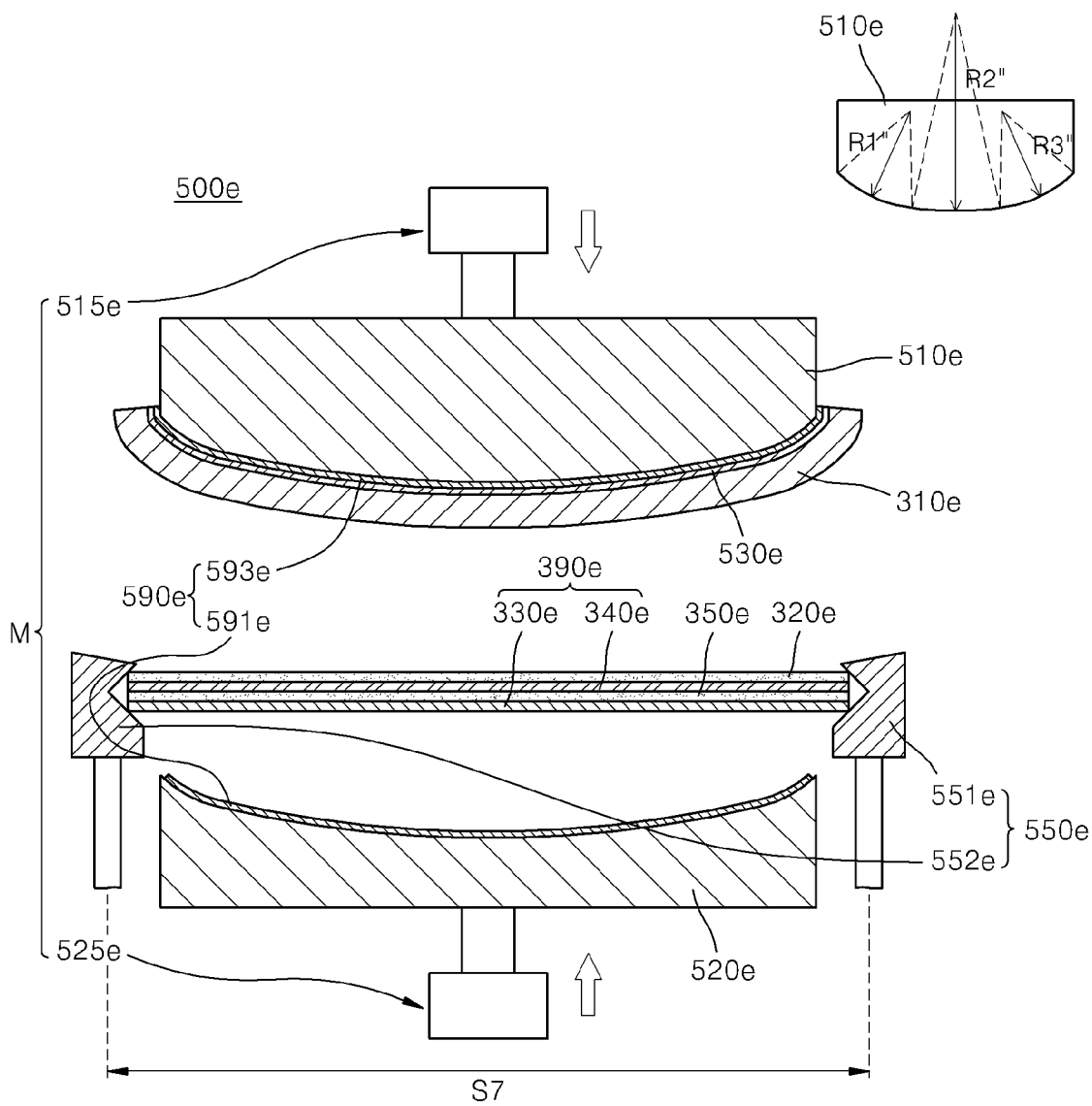
FIG. 36 is a cross-sectional view illustrating an apparatus for manufacturing the display device of FIG. 34, according to another embodiment of the present invention.

FIG. 36 is a cross-sectional view illustrating an apparatus 500e for manufacturing the display device 300e of FIG. 34, according to another embodiment of the present invention.

Referring to FIG. 36, the apparatus 500e includes a first jig 510e, a second jig 520e, a driving unit M, a fixing unit (for example, first fixing unit 530e), and a cushion unit 590e. In this case, the first jig 510e, the second jig 520e, the driving unit M, the fixing unit, and the cushion unit 590e are substantially the same as those described above, and thus a detailed description thereof will not be repeated.

The driving unit M may include a first driving unit 515e and a second driving unit 525e, and the fixing unit may include a first fixing unit 530e. In this case, the first driving unit 515e, the second driving unit 525e, and the first fixing unit 530e are substantially the same as those described above, and thus a detailed description thereof will not be repeated.

The apparatus 500e includes a clamping unit 550e that is spaced apart by a set or predetermined interval from at least one of the first jig 510e or the second jig 520e, and supports the panel member 390e. For convenience of description, however, it will be assumed that the clamping unit 550e is disposed adjacent to the second jig 520e.

The clamping unit 550e may support the panel member 390e when one end of the panel member 390e is inserted into the clamping unit 550e. A plurality of the clamping units 550e may be provided, where a distance S7 between the clamping units 550e is less than a length or a width of the panel member 390e. The panel member 390e may include at least one of the display panel 330e or the TSP 340e as described above. For convenience of description, it will be assumed that the distance S7 between the plurality of clamping units 550e is less than a width of the panel member 390e and the panel member 390e includes the display panel 330e and the TSP 340e.

In particular, the plurality of clamping units 550e face respective side surfaces of the second jig 520e, and fix both ends of the display panel 330e, the second adhesive layer 350e, the TSP 340e, and the first adhesive layer 320e. The plurality of clamping units 550 include a first clamping unit 551e and a second clamping unit 552e that are spaced apart by a set or predetermined interval from each other.

Accordingly, the apparatus 500e may rapidly and easily manufacture the display device 300e having a curved surface and a simple structure. In addition, since the apparatus 500e may accurately attach the cover window 310e having a curved surface to the panel member 390e, a product defect rate may be reduced or minimized.

In particular, since the apparatus 500e includes the clamping unit 550e to accurately align the panel member 390e and the cover window 310e, working efficiency may be improved.

A method of manufacturing the display device 300e by using the apparatus 500e will now be described.

The cover window 310e may be formed as described above, the display panel 330e may be formed, and then the TSP 340e and the display panel 330e may be adhered by using the second adhesive layer 350e. The cover window 310e may be mounted on the first jig 510e as described above.

When the process is completed, the first adhesive layer 320e may be formed on the TSP 340e, which may then be fixed to the first clamping unit 551e and the second clamping unit 552e. A method of fixing the TSP 340e may include inserting and fixing both ends of the TSP 340e into insertion grooves formed in the first clamping unit 551e and the second clamping unit 552e as described above.

Once the display panel 330e, the second adhesive layer 350e, the TSP 340e, and the first adhesive layer 320e are fixed in this manner, portions of the display panel 330e, the second adhesive layer 350e, the TSP 340e, and the first adhesive layer 320e may protrude toward the first jig 510e or the second jig 520e. In further detail, since the distance S7 between the first clamping unit 551e and the second clamping unit 552e is less than a width or a length of at least one of the display panel 330e or the TSP 340e, the portions may protrude toward the second jig 520e or protrude toward the first jig 510e. However, for convenience of description, it will be assumed that one portion of the panel member 390e protrudes toward the second jig 520e.

When the display panel 330e, the second adhesive layer 350e, the TSP 340e, and the first adhesive layer 320e are fixed, the first adhesive layer 320e and the cover window 310e may be compressed against each other by moving at least one of the first jig 510e or the second jig 520e. For convenience of description, it will be assumed that the first adhesive layer 320e and the cover window 310e are compressed by moving both the first jig 510e and the second jig 520e.

When the first jig 510e and the second jig 520e move, the first driving unit 515e and the second driving unit 525e may operate to move the first jig 510e and the second jig 520e closer to each other.

A protruding portion of the cover window 310e first contacts the first adhesive layer 320e. When the first jig 510e and the second jig 520e continuously move, the cover window 310e and the first adhesive layer 320e may be laminated beginning from a contact portion between the cover window 310e and the first adhesive layer 320e toward both end portions.

In particular, when the cover window 310e and the panel member 390e contact each other, a load range applied when the first jig 510e and the second jig 520e compress the cover window 310e and the panel member 390e may be greater than or equal to 0.3 MPa and less than or equal to 0.5 MPa. When the load range is less than 0.3 MPa, an adhesive force between the cover window 310e and the panel member 390e may be reduced, and the cover window 310e and the panel member 390e may be delaminated and separated from each other. In addition, when the load range exceeds 0.5 MPa and the cover window 310e and the panel member 390e are attached to each other, the cover window 310e and the panel member 390e may be damaged, thereby reducing quality and reliability.

A first cushion unit 593e and a second cushion unit 591e may uniformly distribute a force applied to the panel member 390e and the cover window 310e when the panel member 390e and the cover window 310e are compressed and laminated.

Accordingly, the apparatus 500e may rapidly and accurately manufacture the display device 300e having a curved surface. In particular, the apparatus 500e may reduce or minimize a product defect rate by accurately attaching the panel member 390e and the cover window 310e having a curved surface.

In addition, the apparatus 500e may improve product quality by removing air bubbles that may be generated (or preventing air bubbles from being generated) when the panel member 390e and the cover window 310e are compressed.

Figure 37:
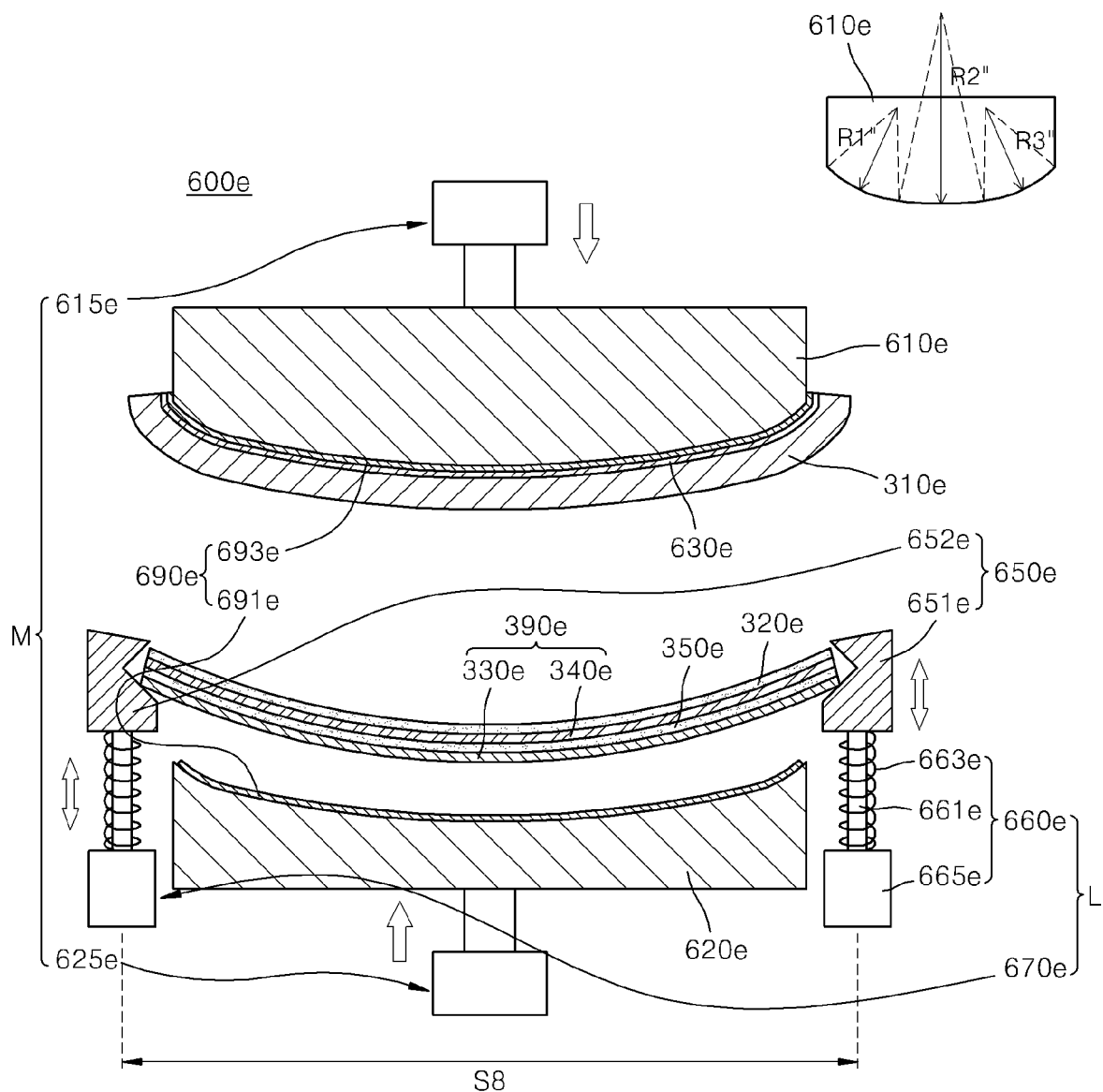
FIG. 37 is a cross-sectional view illustrating an apparatus for manufacturing the display device of FIG. 34, according to yet another embodiment of the present invention.

FIG. 37 is a cross-sectional view illustrating an apparatus 600e for manufacturing the display device 300e of FIG. 34, according to yet another embodiment of the present invention.

Referring to FIG. 37, the apparatus 600e includes a first jig 610e, a second jig 620e, a driving unit M, a clamping unit 650e, a fixing unit (for example, first fixing unit 630e), a cushion unit 690e, and a linear moving unit L. The first jig 610e, the second jig 620e, the driving unit, the clamping unit 650e, the fixing unit, and the cushion unit 690e may be substantially the same as those described above, and thus a detailed description thereof will not be repeated.

The driving unit M may include a first driving unit 615e and a second driving unit 625e, and the fixing unit may include a first fixing unit 630e. The first driving unit 615e, the second driving unit 625e, and the first fixing unit 630e may be substantially the same as those described above, and thus a detailed description thereof will not be repeated.

The clamping unit 650e may include a first clamping unit 651e and a second clamping unit 652e. The first clamping unit 651e and the second clamping unit 652e may be substantially the same as those described above, and thus a detailed description thereof will not be repeated.

The linear moving unit L may include a first linear driving unit 660e and a second linear driving unit 670e that respectively vertically move the first clamping unit 651e and the second clamping unit 652e. In this case, the first linear driving unit 660e and the second linear driving unit 670e are formed similarly, and thus the following description will focus on the first linear driving unit 660e.

The first linear driving unit 660e may include a first shaft 661e that is connected to the first clamping unit 651e and linearly moves the first clamping unit 651e. In addition, the first linear driving unit 660e may include a first driving module 665e that drives the first shaft 661e. The first driving module 665e may be formed to include a cylinder or a motor. However, for convenience of description, it will be assumed that the first driving module 665e includes a motor. In addition, it will be assumed that the first shaft 661e includes a ball screw that is raised and lowered as the first driving module 665e rotates.

The first linear driving unit 660e may include a first elastic unit 663e that surrounds the first shaft 661e. The first elastic unit 663e may include a compression spring, or may be formed of an elastic material such as rubber. However, for convenience of description, it will be assumed that the first elastic unit 663e includes a compression spring.

The first elastic unit 663e may be disposed to surround an outer surface of the first shaft 661e as described above, and thus may provide a restoring force to the first clamping unit 651e when the first clamping unit 651e moves.

A method of manufacturing the display device 300e by using the apparatus 600e will now be described. First, the cover window 310e and the panel member 390e may be manufactured and prepared. The panel member 390e may include at least one of the display panel 330e or the TSP 340e. However, for convenience of description, it will be assumed that the panel member 390e includes the display panel 330e and the TSP 340e.

The display panel 330e and the TSP 340e prepared as described above may be attached by using the second adhesive layer 350e, and then the first adhesive layer 320e may be formed on the TSP 340e. In this case, both ends of the display panel 330e and the TSP 340e on which the first adhesive layer 320e is formed may be fixed to the first clamping unit 651e and the second clamping unit 652e.

When the panel member 390e is fixed to the first clamping unit 651e and the second clamping unit 652e as described above, a portion of the panel member 390e may protrude toward the second jig 620e or may protrude toward the first jig 610e. In further detail, since a distance S8 between the first clamping unit 651e and the second clamping unit 652e is less than a width or a length of the panel member 390e, a portion of the panel member 390e may protrude toward the second jig 620e or protrude toward the first jig 610e. In this case, for convenience of description, it will be assumed that the distance S8 between the first clamping unit 651e and the second clamping unit 652e is less than a width of the panel member 390e and a portion of the panel member 390e protrudes toward the second jig 620e.

When the panel member 390e is disposed as described above, the panel member 390e and the cover window 310e may be compressed against each other by moving at least one of the first jig 610e or the second jig 620e. However, for convenience of description, it will be assumed that the panel member 390e and the cover window 310e are compressed against each other by moving both the first jig 610e and the second jig 620e.

When the first jig 610e and the second jig 620e move as described above, the first linear driving unit 660e and the second linear driving unit 670e may operate to vertically move the first clamping unit 651e and the second clamping unit 652e. In particular, the first clamping unit 651e and the second clamping unit 652e may move at a speed similar to a speed at which the second jig 620e moves.

When the first clamping unit 651e and the second clamping unit 652e are raised as described above, the panel member 390e may be raised while maintaining its curved state. When a distance between the first jig 610e and the second jig 620e reaches a set or predetermined distance, the first clamping unit 651e and the second clamping unit 652e may release the panel member 390e.

In particular, after the first clamping unit 651e and the second clamping unit 652e operate as described above, the first linear driving unit 660e and the second linear driving unit 670e may operate to lower the first clamping unit 651e and the second clamping unit 652e.

After that, the first driving unit 615e and the second driving unit 625e may continuously operate to make the first jig 610e and the second jig 620e get closer to each other. In particular, as the first jig 610e and the second jig 620e get closer to each other, the panel member 390e and the cover window 310e may be compressed. In this case, a method of compressing the panel member 390e and the cover window 310e is performed in the same manner as that described above, and thus a detailed description thereof will not be repeated.

In particular, when the cover window 310e and the panel member 390e contact each other, a load range applied when the first jig 610e and the second jig 620e compress the cover window 310e and the panel member 390e may be greater than or equal to 0.3 MPa and less than or equal to 0.5 MPa. When the load range is less than 0.3 MPa, an adhesive force between the cover window 310e and the panel member 390e may be reduced, and the cover window 310e and the panel member 390e may be delaminated and separated from each other. In addition, when the load range exceeds 0.5 MPa and the cover window 310e and the panel member 390e are attached to each other, the cover window 310e and the panel member 390e may be damaged, thereby reducing quality and reliability.

A first cushion unit 693e and a second cushion unit 691e may uniformly distribute a force applied to the cover window 310e and the panel member 390e when the cover window 310e and the panel member 390e are compressed and laminated.

Accordingly, the apparatus 600e may rapidly and accurately manufacture the display device 300e having a curved surface. In particular, the apparatus 600e may reduce or minimize a product defect rate by accurately attaching the panel member 390e and the cover window 310e having a curved surface.

In addition, the apparatus 600e may improve product quality by removing air bubbles that may be generated (or preventing air bubbles from being generated) when the panel member 390e and the cover window 310e are compressed.

Figure 38:
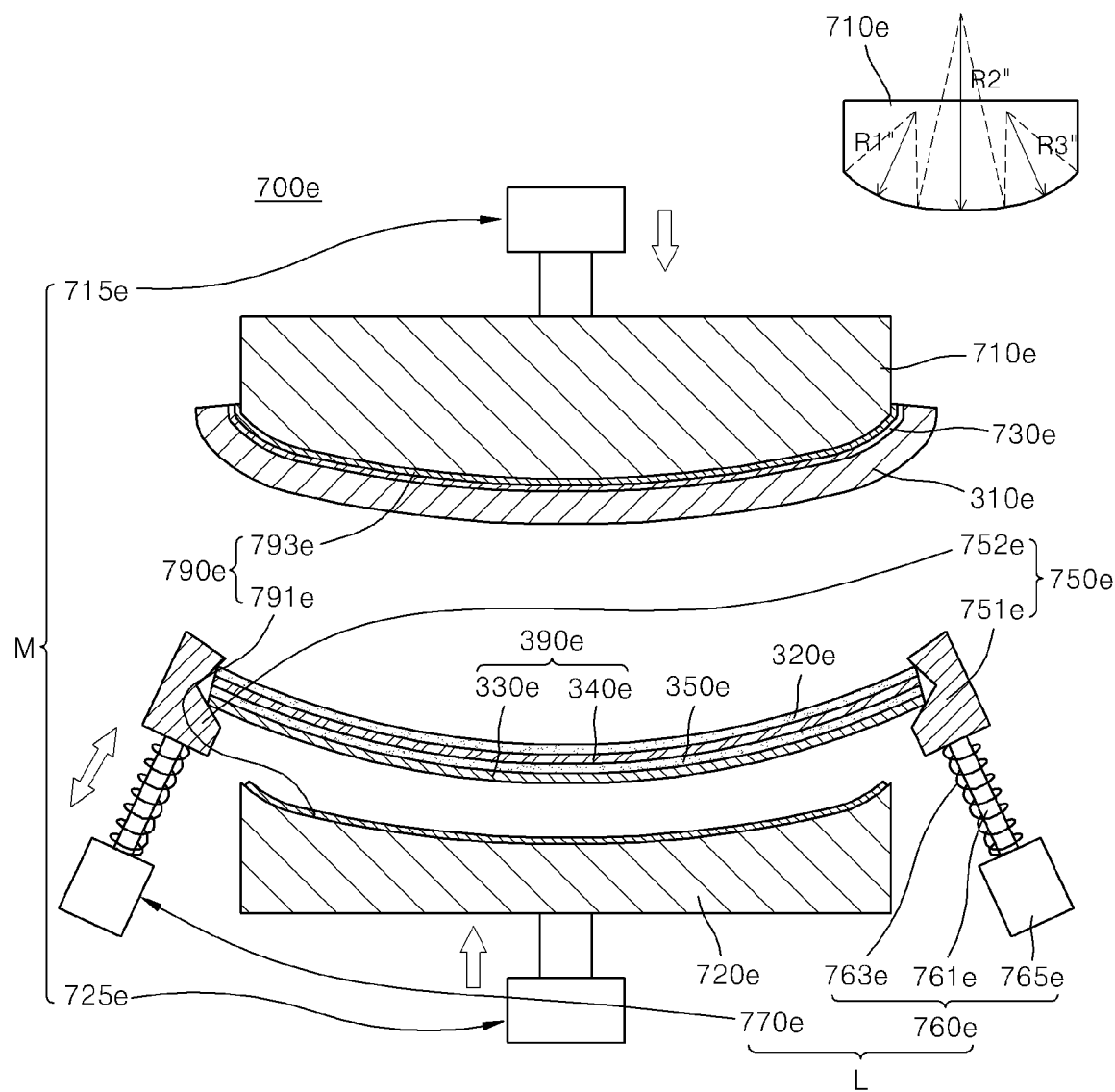
FIG. 38 is a cross-sectional view illustrating an apparatus for manufacturing the display device of FIG. 34, according to still yet another embodiment of the present invention.

FIG. 38 is a cross-sectional view illustrating an apparatus 700e for manufacturing the display device 300e of FIG. 34, according to still yet another embodiment of the present invention.

Referring to FIG. 38, the apparatus 700e may include a first jig 710e, a second jig 720e, a driving unit M, a clamping unit 750e, a fixing unit (for example, first fixing unit 730e), a linear driving unit L, and a cushion unit 790e (including a first cushion unit 793e and a second cushion unit 791e). The first jig 710e and the second jig 720e may be substantially the same as those described above, and thus a detailed description thereof will not be repeated.

The driving unit M may include a first driving unit 715e and a second driving unit 725e, and the fixing unit may include a first fixing unit 730e. The first driving unit 715e, the second driving unit 725e, and the first fixing unit 730e may be substantially the same as those described above, and thus a detailed description thereof will not be repeated.

In addition, the clamping unit 750e may include a first clamping unit 751e and a second clamping unit 752e. The first clamping unit 751e and the second clamping unit 752e may be substantially the same as those described above, and thus a detailed description thereof will not be repeated.

The linear driving unit L may include a first linear driving unit 760e and a second linear driving unit 770e, and the first linear driving unit 760e and the second linear driving unit 770e may linearly move the first clamping unit 751e and the second clamping unit 752e, respectively. In particular, the first linear driving unit 760e and the second linear driving unit 770e may linearly move the first clamping unit 751e and the second clamping unit 752e in a diagonal direction. Since the second linear driving unit 770e may be formed similarly to the first linear driving unit 760e, the following description will focus on the first linear driving unit 760e.

In further detail, the first linear driving unit 760e may include a first shaft 761e, a first driving module 765e, and a first elastic unit 763e. The first shaft 761e, the first driving module 765e, and the first elastic unit 763e may be formed in a similar manner to those described above except that the first shaft 761e is disposed in a diagonal direction to diagonally move the first clamping unit 751e.

In particular, when the first linear driving unit 760e operates, the first driving module 765e may vary a length of the first shaft 761e. Since the first driving module 765e and the first shaft 761e are diagonally disposed with respect to the second jig 720e as described above, the first clamping unit 751e may be diagonally moved by varying the movement of the first shaft 761e.

For example, when the first driving module 765e operates to diagonally move the first shaft 761e downward with respect to the second jig 720e, the first clamping unit 751e may diagonally move downward with respect to the second jig 720e as the first shaft 761e moves.

When the first driving module 765e operates in an opposite direction to diagonally move the first shaft 761e upward with respect to the second jig 720e, the first clamping unit 751e may diagonally move upward with respect to the second jig 720e as the first shaft 761e moves.

The first shaft 761e may include a ball screw as described above and thus may rotate as the first driving module 765e operates. In particular, the first shaft 761e may diagonally move downward or upward with respect to the second jig 720e as the first driving module 765e rotates.

A method of manufacturing the display device 300e may be similar to that described above. In further detail, the panel member 390e and the cover window 310e may be manufactured and prepared. The panel member 390e may include the display panel 330e and the TSP 340e as described above. However, for convenience of description, it will be assumed that the panel member 390e includes both the display panel 330e and the TSP 340e.

When the display panel 330e and the TSP 340e are completely manufactured as described above, the display panel 330e and the TSP 340e may be adhered by using the second adhesive layer 350e, and the first adhesive layer 320e may be coated on the TSP 340e.

The panel member 390e manufactured as described above may be fixed by the first clamping unit 751e and the second clamping unit 752e. When the fixing is completed, the panel member 390e and the cover window 310e may be compressed against each other by moving at least one of the first jig 710e or the second jig 720e. A method of compressing the panel member 390e and the cover window 310e may be similar to that described above, and thus a detailed description thereof will not be repeated.

When the first jig 710e and the second jig 720e move in this manner, the first clamping unit 751e and the second clamping unit 752e may also move. In particular, the first clamping unit 751e and the second clamping unit 752e may be diagonally moved by the first linear driving unit 760e and the second linear driving unit 770e, respectively. The first clamping unit 751e and the second clamping unit 752e may be raised diagonally.

When the first clamping unit 751e and the second clamping unit 752e are raised and then an interval between the first jig 710e and the second jig 720e reaches a preset interval, both ends of the panel member 390e may be released.

After the releasing of the first clamping unit 751e and the second clamping unit 752e as described above, the first linear driving unit 760e and the second linear driving unit 770e may operate to lower the first clamping unit 751e and the second clamping unit 752e. The first clamping unit 751e and the second clamping unit 752e may be lowered diagonally.

While the first clamping unit 751e and the second clamping unit 752e are lowered, the first jig 710e and the second jig 720e may get closer to each other to compress the panel member 390e and the cover window 310e. In this case, a method of adhering the panel member 390e and the cover window 310e through compression may be similar to that described above.

When the panel member 390e and the cover window 310e are compressed by moving the first jig 710e and the second jig 720e as described above, the first cushion unit 793e and the second cushion unit 791e may distribute a force applied to the panel member 390e and the cover window 310e. In addition, the first cushion unit 793e and the second cushion unit 791e may help prevent the panel member 390e or the cover window 310e from being damaged by absorbing part of a force applied to the panel member 390e and the cover window 310e.

In particular, when the cover window 310e and the panel member 390e contact each other, a load range applied when the first jig 710e and the second jig 720e compress the cover window 310e and the panel member 390e may be greater than or equal to 0.3 MPa and less than or equal to 0.5 MPa. When the load range is less than 0.3 MPa, an adhesive force between the cover window 310e and the panel member 390e may be reduced, and the cover window 310e and the panel member 390e may be delaminated and separated from each other. In addition, when the load range exceeds 0.5 MPa and the cover window 310e and the panel member 390e are attached to each other, the cover window 310e and the panel member 390e may be damaged, thereby reducing quality and reliability.

Accordingly, the apparatus 700e may rapidly and accurately manufacture the display device 300e having a curved surface. In particular, the apparatus 700e may reduce or minimize a product defect rate by accurately attaching the panel member 390e and the cover window 310e having a curved surface.

In addition, the apparatus 700e may improve quality by removing air bubbles or preventing air bubbles from being generated when the display panel 330e and the panel member 390e are compressed. This application relates in general to a display device and more particularly, to a display device and a corresponding method and apparatus for manufacturing the display device that may rapidly, accurately, and cleanly manufacture the display device having a curved shape. Small electronic devices having curved display devices have presented challenges in accurately forming and aligning their corresponding cover windows (for example, transparent protective covers) and display panels (such as OLED display panels or flexible OLED display panels), and adhering the cover windows to the display panels via transparent adhesive without quality defects such as air bubbles between the cover windows and the display panels.

Embodiments of the present invention address these problems by providing a display device having a curved cover window, a display panel and/or touch screen panel (TSP) that fits in the cover window, and an adhesive layer between the display device and the cover window, together with an apparatus and method for manufacturing the display device. The cover window is fabricated with a curved shape (such as rounded edges, inward or outward) and mounted on a first jig having a mount surface that conforms to the cover window. For example, the cover window may sit in the first jig (through gravity) or attach to the first jig via a fixing unit, such as a vacuum suction device. Meanwhile, the display panel (to which the adhesive layer is attached), is attached to a second jig by similar means. The distance between the jigs is then closed (by moving one or both jigs towards the other using, for example, driving units), allowing the display panel to press up to the cover window and adhere via the adhesive layer, and without forming air bubbles between the cover window and the display panel.

In another embodiment, the display panel may be attached to a clamp unit, such as a pair of clamps, and bent through a clamping force to mate cleanly with the cover window when the jigs are moved towards each other. The clamps may be moved via dedicated driving units (for example, which drive ball screws through rotational movement to move the clamps) independently of the jigs, and may move, for example vertically or diagonally with respect to the jigs (and with respect to a gravity direction).

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing a display device, the method comprising:
mounting a cover window comprising a curved portion on a first jig comprising a curved portion;
mounting a panel member comprising a display panel on a second jig that conforms to a surface of the first jig;
laminating the cover window to the panel member by moving a first one of the first jig or the second jig to a first other one of the first jig or the second jig, and
compressing the cover window and the panel member together with a load of greater than or equal to 0.3 MPa and less than or equal to 0.5 MPa,
wherein outer surfaces of the cover window and the first jig are curved surfaces each having a curvature radius or a curvature radius of a portion of the cover window is different from a curvature radius of another portion of the cover window, and a curvature radius of a portion of an outer surface of the first jig is different from a curvature radius of another portion of the outer surface of the first jig.

2. The method of claim 1, wherein at least a portion of the panel member contacts a surface of the second jig.

3. The method of claim 1, wherein the panel member is bent along an outer surface of the second jig during the mounting of the panel member on the second jig.

4. The method of claim 1, wherein the panel member is smaller in at least one of a length or a width than the cover window.

5. The method of claim 1, wherein
the panel member is flat during the mounting of the panel member on the second jig, and
the laminating of the cover window to the panel member comprises partially curving the panel member by the moving of the first one of the first jig or the second jig.

6. The method of claim 1, wherein the first one of the first jig or the second jig is above the first other one of the first jig or the second jig, or the first other one of the first jig or the second jig is above the first one of the first jig or the second jig.

7. The method of claim 1, wherein a second one of the first jig or the second jig is formed by protruding toward or recessing away from a second other one of the first jig or the second jig.

8. The method of claim 7, wherein the second other one of the first jig or the second jig is formed by recessing away from or protruding toward the second one of the first jig or the second jig.

9. The method of claim 1, wherein the mounting of the panel member comprises fixing the panel member to the second jig.

10. The method of claim 1, wherein the panel member is flexible.

11. The method of claim 1, wherein the panel member is attached to a recessed outer surface of the cover window or a protruding outer surface of the cover window.

12. The method of claim 1, wherein the panel member further comprises a touch screen panel (TSP).

13. The method of claim 1, wherein the cover window comprises a flat portion and the curved portion extended from the flat portion.

14. The method of claim 1, wherein at least one of the first jig or the second jig comprises at least one of a cushion unit.

15. A method of manufacturing a display device, the method comprising:
- mounting a cover window comprising a curved portion on a first jig comprising a curved portion;
- mounting a display panel on a second jig that conforms to a surface of the first jig; and
- laminating the cover window to the display panel by moving a first one of the first jig or the second jig to a first other one of the first jig or the second jig,
- wherein outer surfaces of the cover window and the first jig are curved surfaces each having a curvature radius or a curvature radius of a portion of the cover window is different from a curvature radius of another portion of the cover window, and a curvature radius of a portion of an outer surface of the first jig is different from a curvature radius of another portion of the outer surface of the first jig.

* * * * *